(12) United States Patent
Kanike et al.

(10) Patent No.: US 8,236,634 B1
(45) Date of Patent: Aug. 7, 2012

(54) INTEGRATION OF FIN-BASED DEVICES AND ETSOI DEVICES

(75) Inventors: Narasimhulu Kanike, Wayne, NJ (US); Kangguo Cheng, Guilderland, NY (US); Ramachandra Divakaruni, Ossining, NY (US); Carl J. Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/050,023

(22) Filed: Mar. 17, 2011

(51) Int. Cl.
*H01L 27/088* (2006.01)

(52) U.S. Cl. . 438/155; 438/164; 438/275; 257/E21.619; 257/E21.431

(58) Field of Classification Search ............. 438/155, 438/164, 275; 257/E21.619, E21.431
See application file for complete search history.

(56) References Cited

U.S. PATENT DOCUMENTS

| | | | |
|---|---|---|---|
| 7,087,471 B2* | 8/2006 | Beintner | 438/164 |
| 7,393,733 B2* | 7/2008 | Currie | 438/164 |
| 7,396,711 B2* | 7/2008 | Shah et al. | 438/164 |
| 7,575,975 B2* | 8/2009 | Thean et al. | 438/275 |
| 7,737,532 B2* | 6/2010 | Ke et al. | 257/627 |
| 2004/0266076 A1* | 12/2004 | Doris et al. | 438/157 |
| 2007/0241399 A1* | 10/2007 | Irisawa et al. | 257/347 |
| 2010/0148217 A1* | 6/2010 | Simonelli et al. | 257/192 |

* cited by examiner

*Primary Examiner* — George Fourson, III
(74) *Attorney, Agent, or Firm* — Scully, Scott, Murphy & Presser, P.C.; H. Daniel Schnurmann

(57) ABSTRACT

Thin semiconductor regions and thick semiconductor regions are formed oven an insulator layer. Thick semiconductor regions include at least one semiconductor fin. A gate conductor layer is patterned to form disposable planar gate electrodes over ETSOI regions and disposable side gate electrodes on sidewalls of semiconductor fins. End portions of the semiconductor fins are vertically recessed to provide thinned fin portions adjacent to an unthinned fin center portion. After appropriate masking by dielectric layers, selective epitaxy is performed on planar source and drain regions of ETSOI field effect transistors (FETs) to form raised source and drain regions. Further, fin source and drain regions are grown on the thinned fin portions. Source and drain regions, fins, and the disposable gate electrodes are planarized. The disposable gate electrodes are replaced with metal gate electrodes. FinFETs and ETSOI FETs are provided on the same semiconductor substrate.

16 Claims, 44 Drawing Sheets

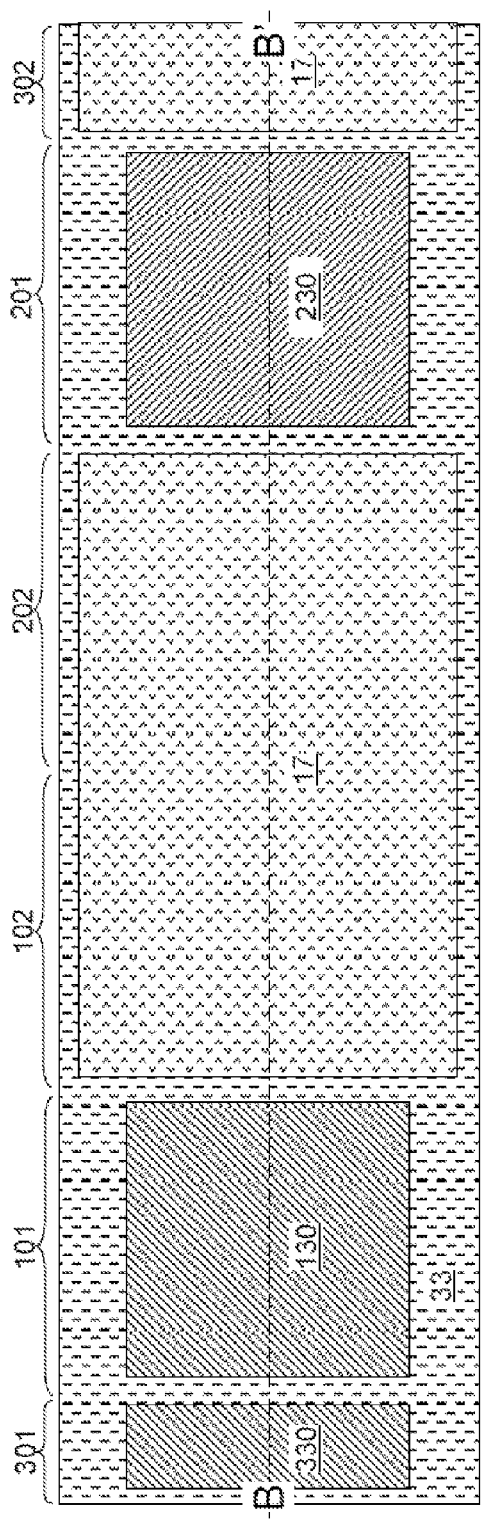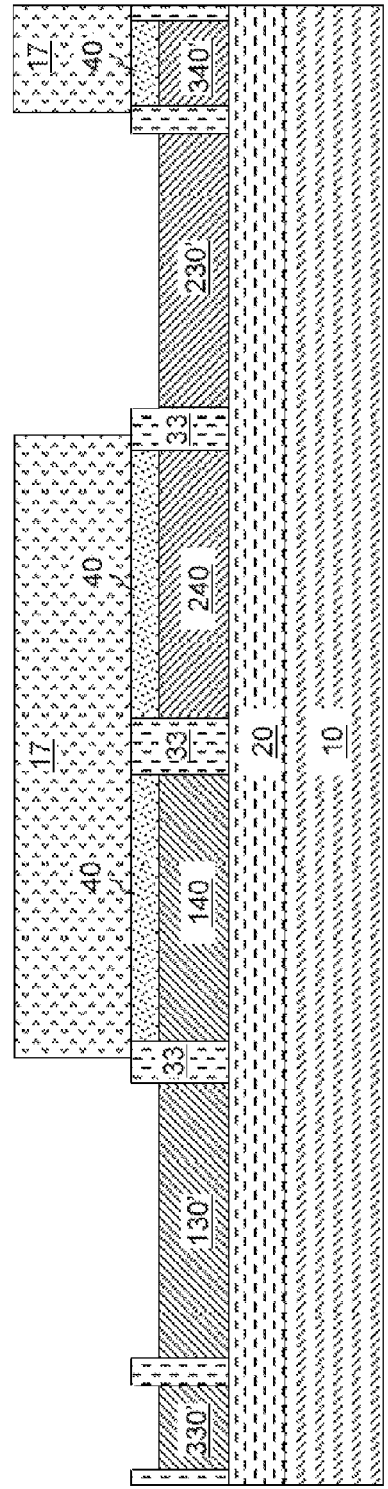
FIG. 3A
FIG. 3B

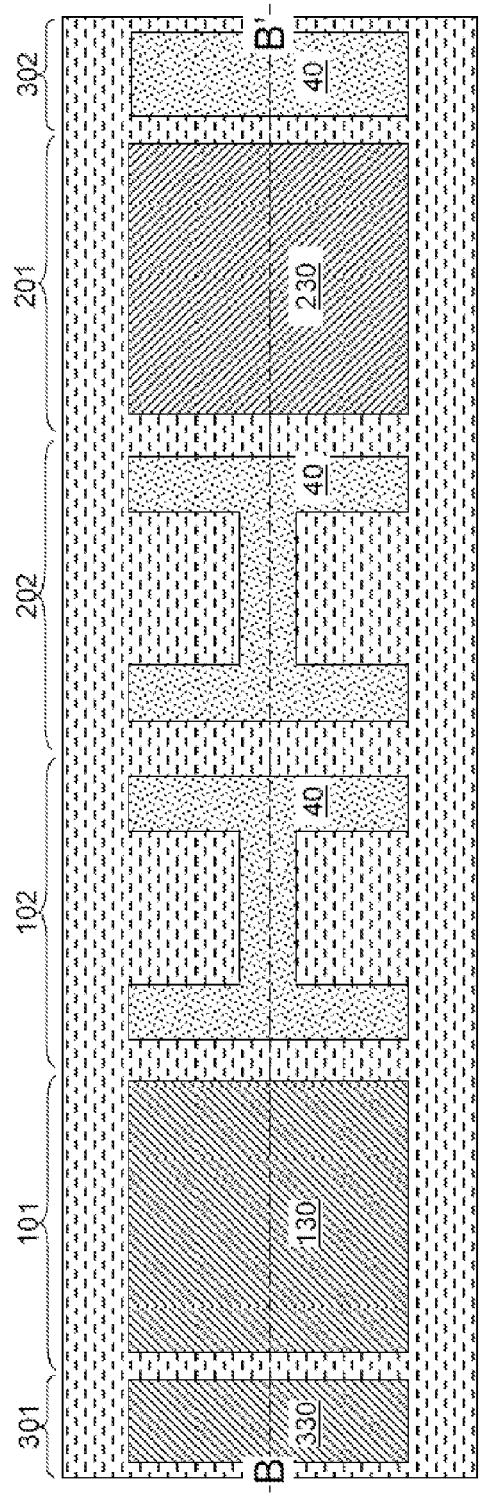
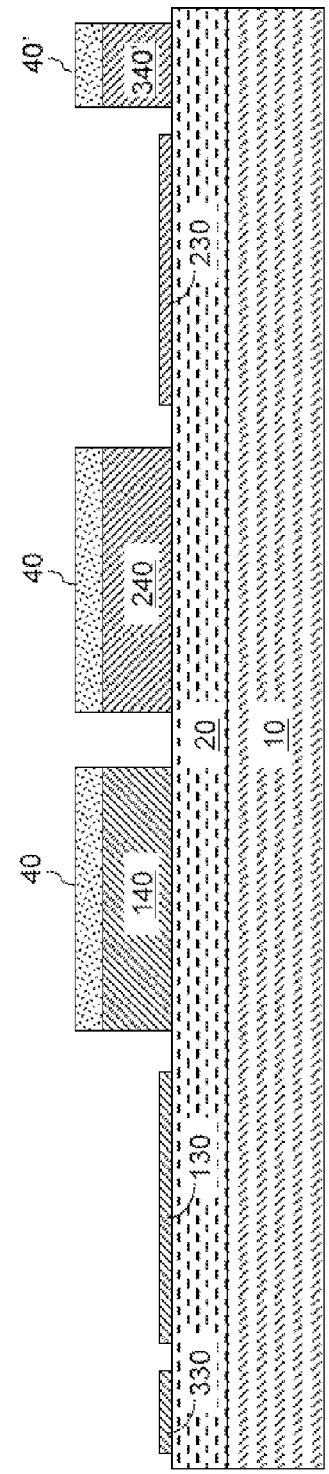
FIG. 5A
FIG. 5B

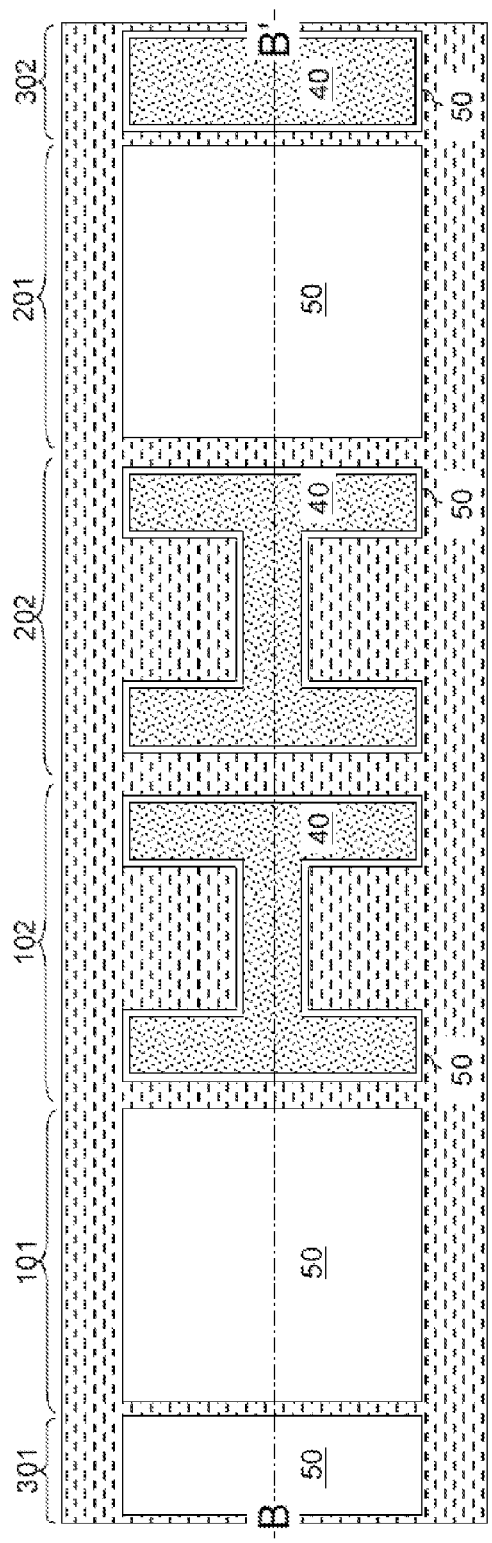
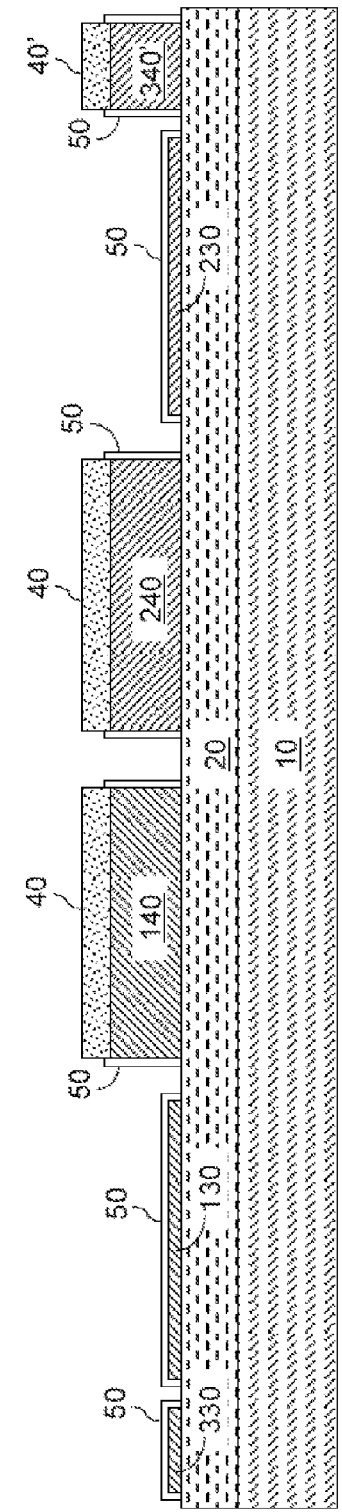
FIG. 6A
FIG. 6B

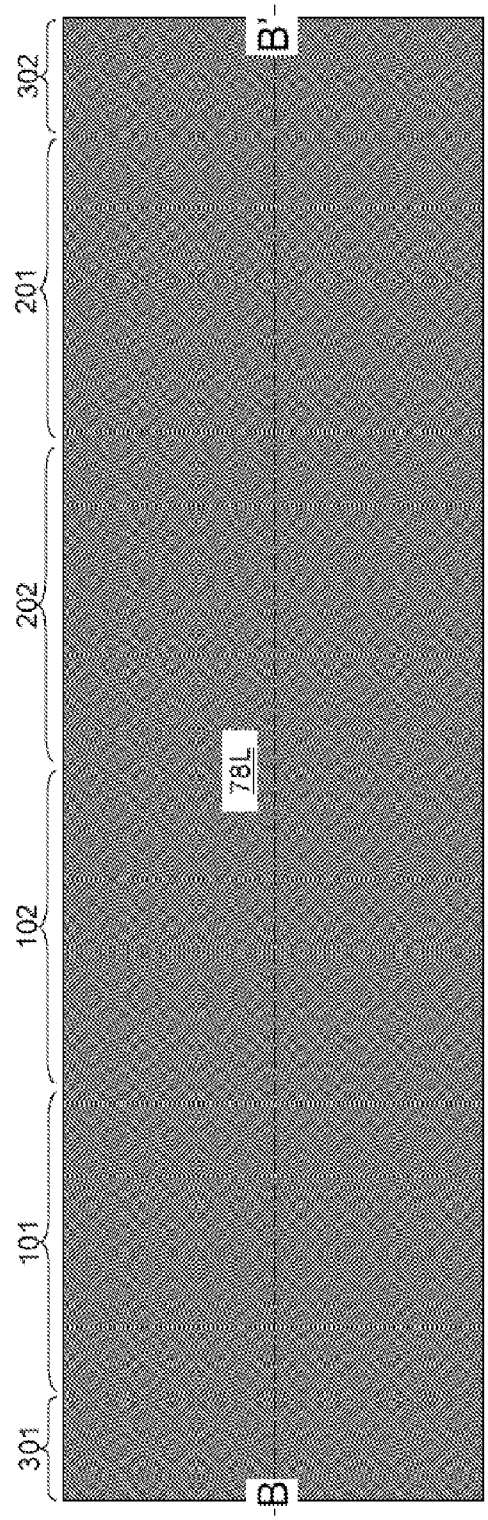
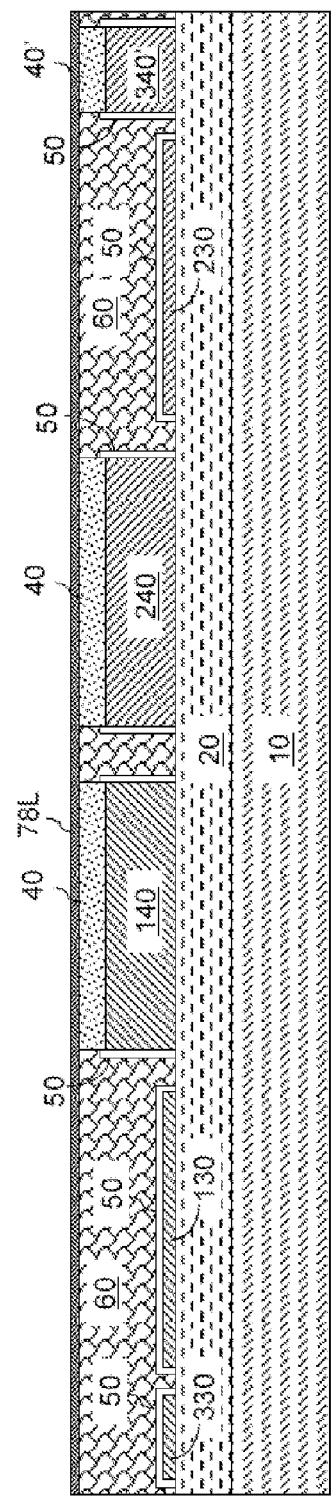
FIG. 8A
FIG. 8B

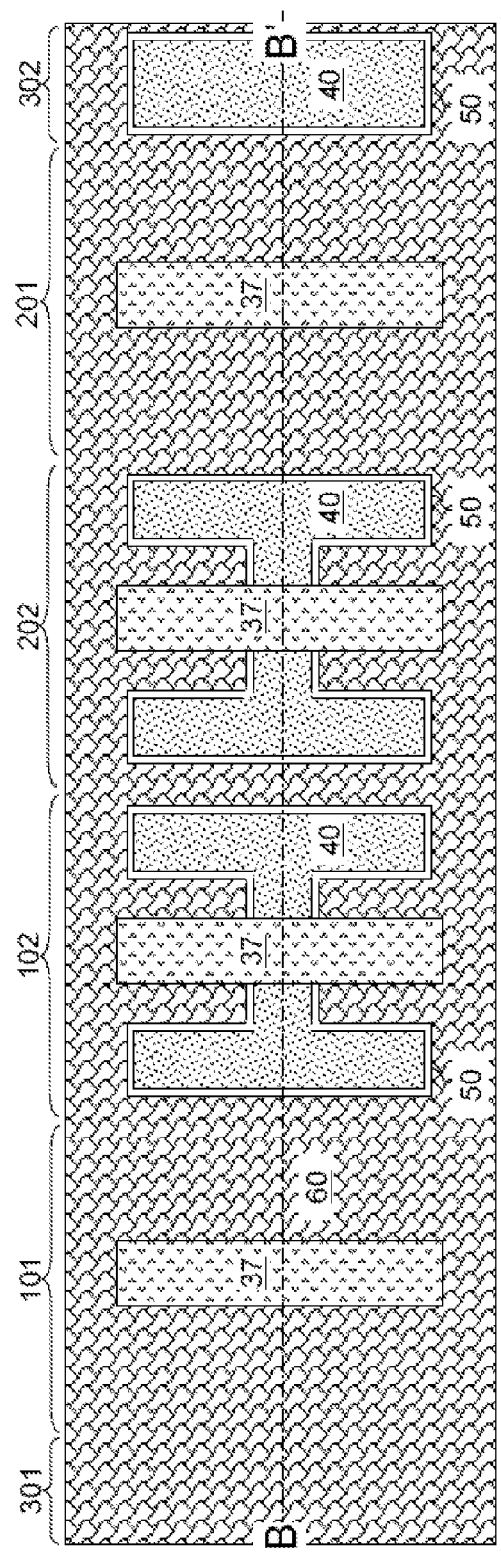
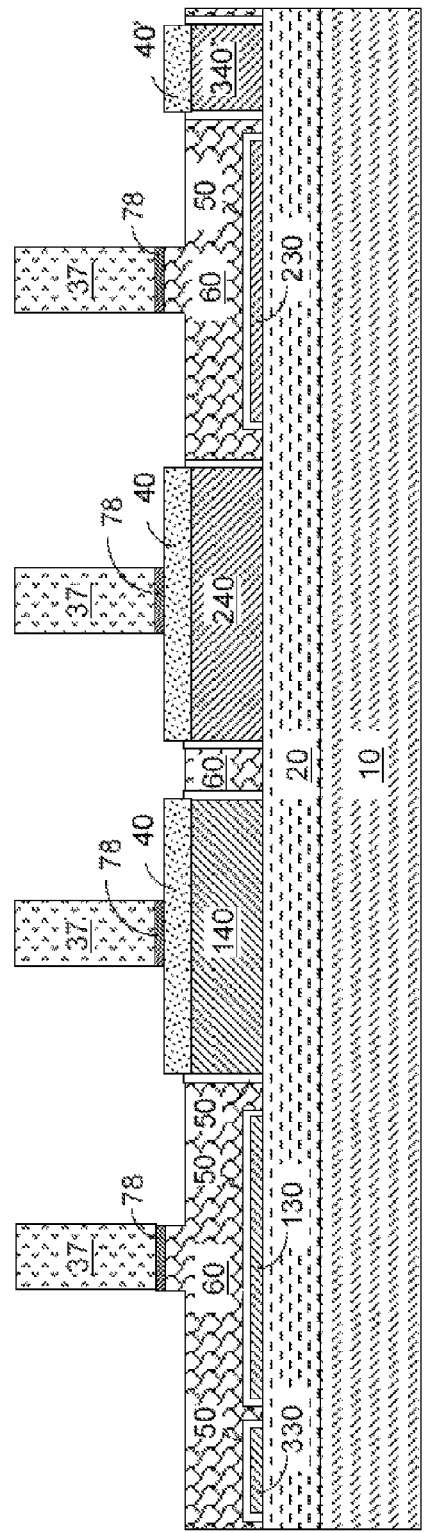
FIG. 9A
FIG. 9B

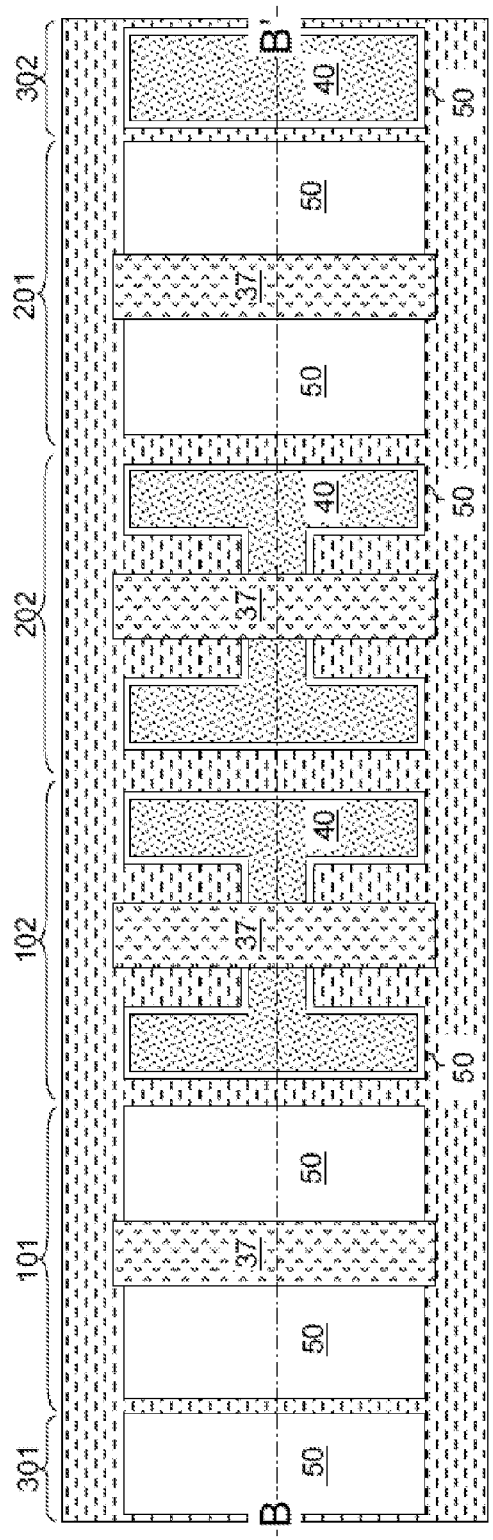
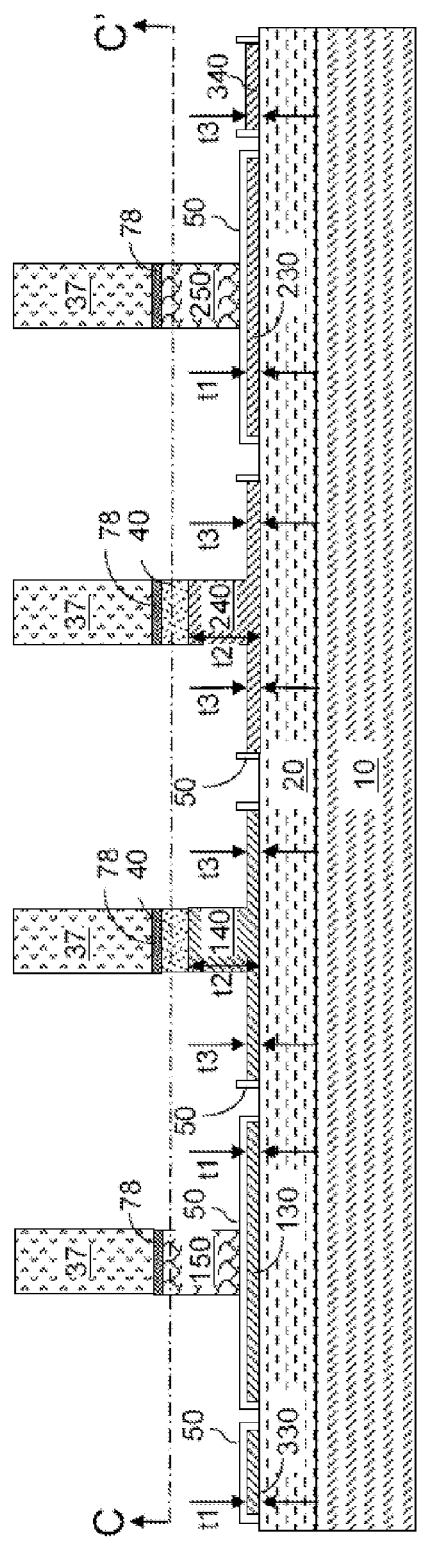
FIG. 10A
FIG. 10B

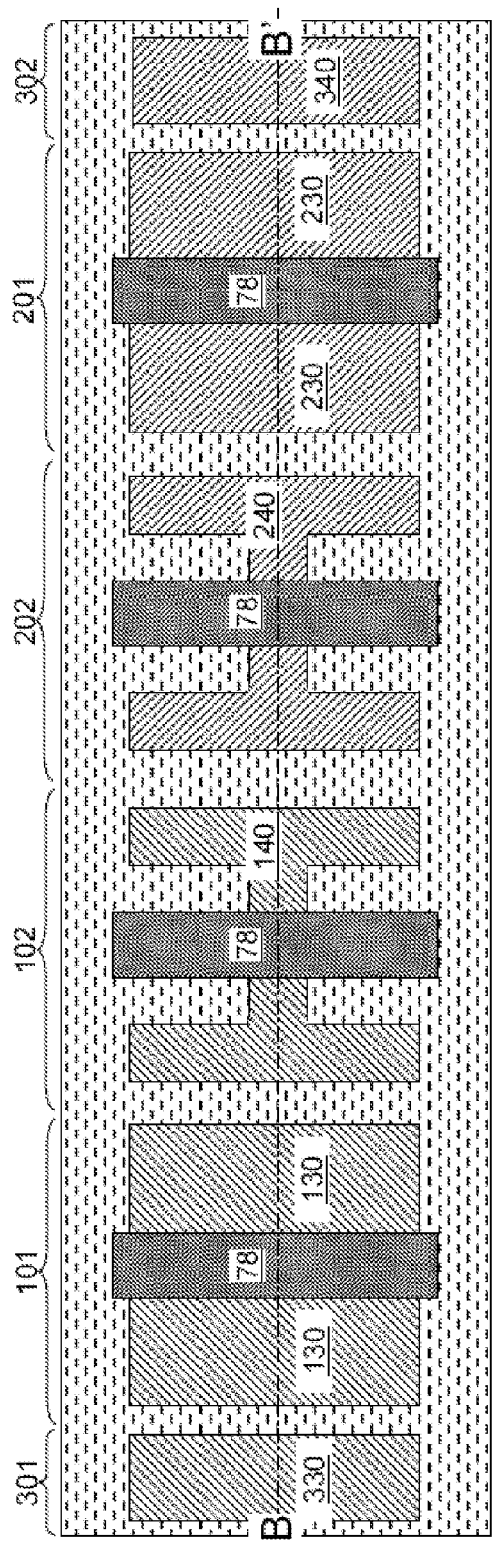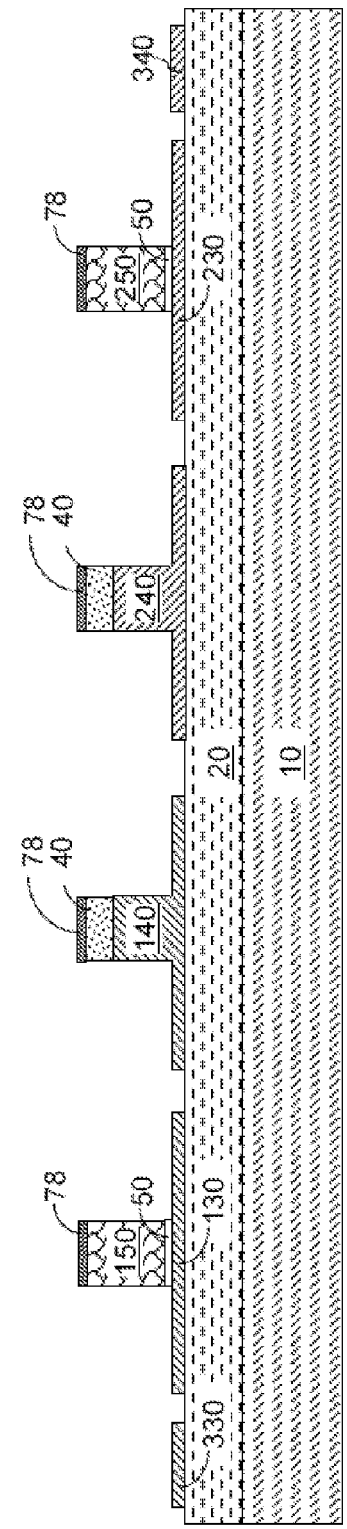
FIG. 11A
FIG. 11B

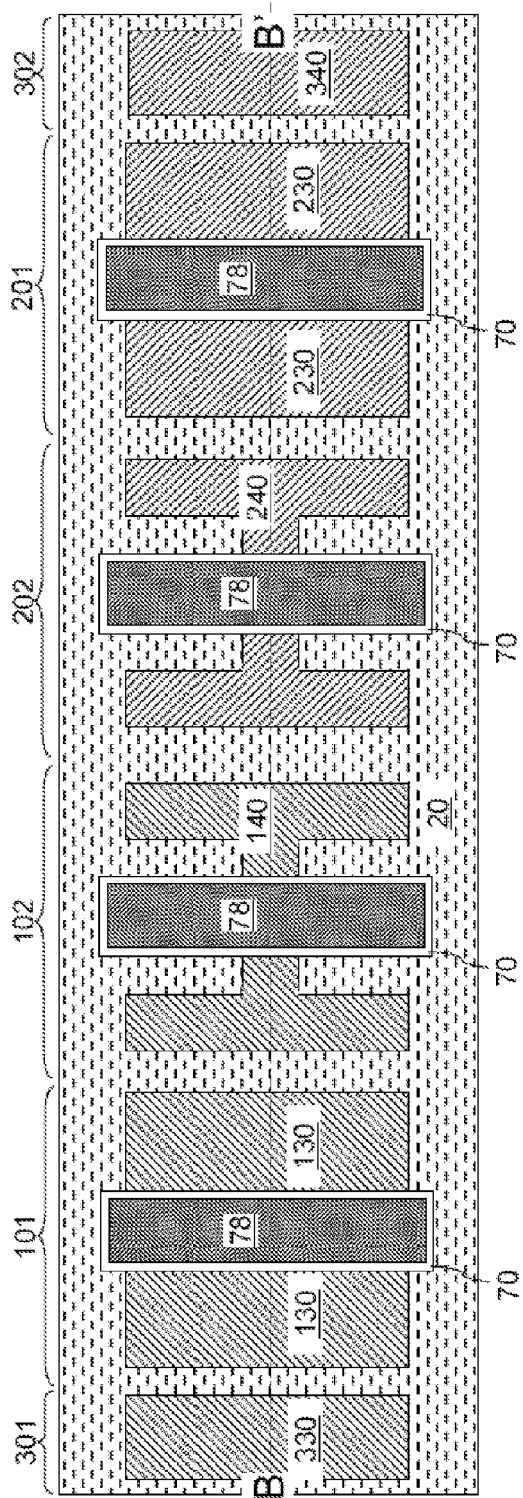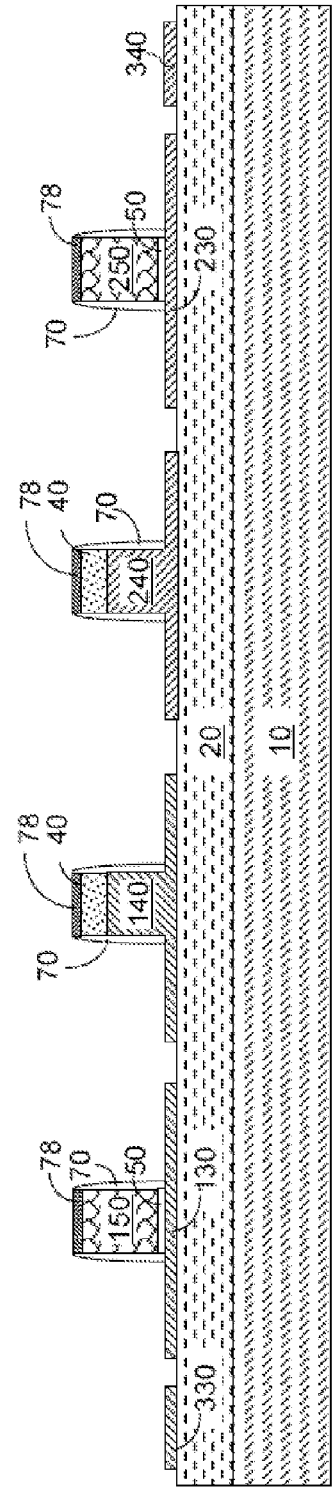
FIG. 12A
FIG. 12B

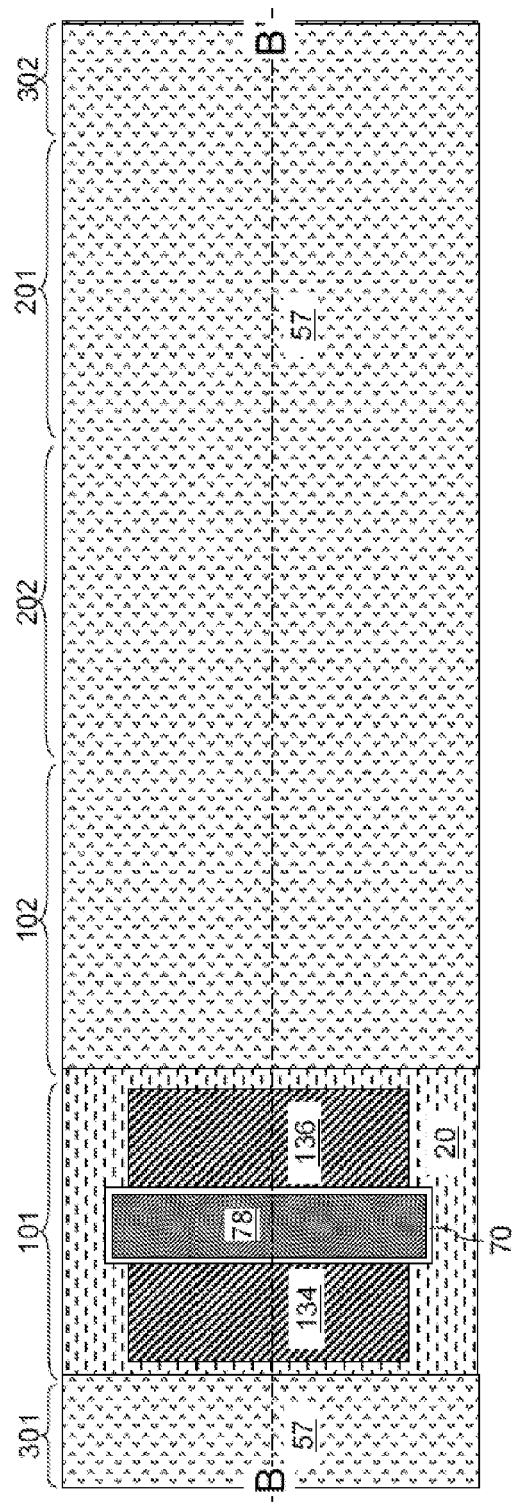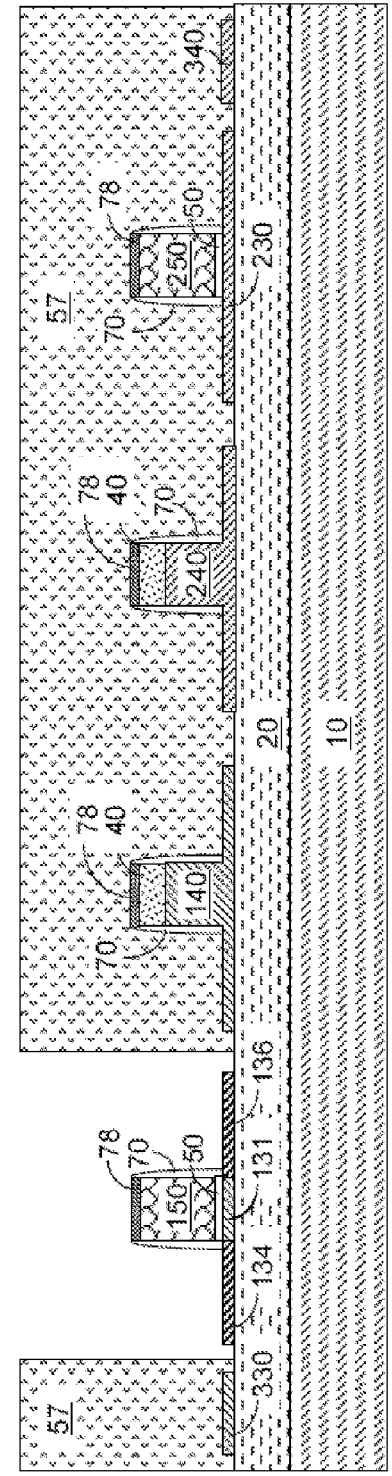
FIG. 13A
FIG. 13B

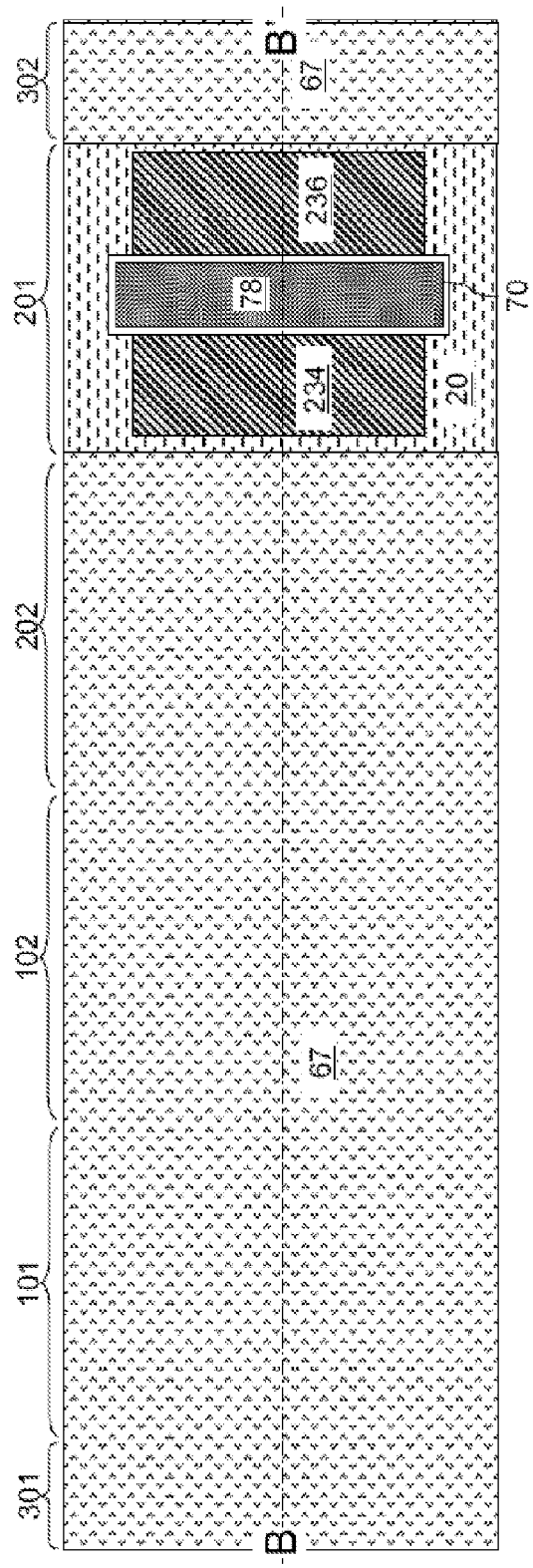
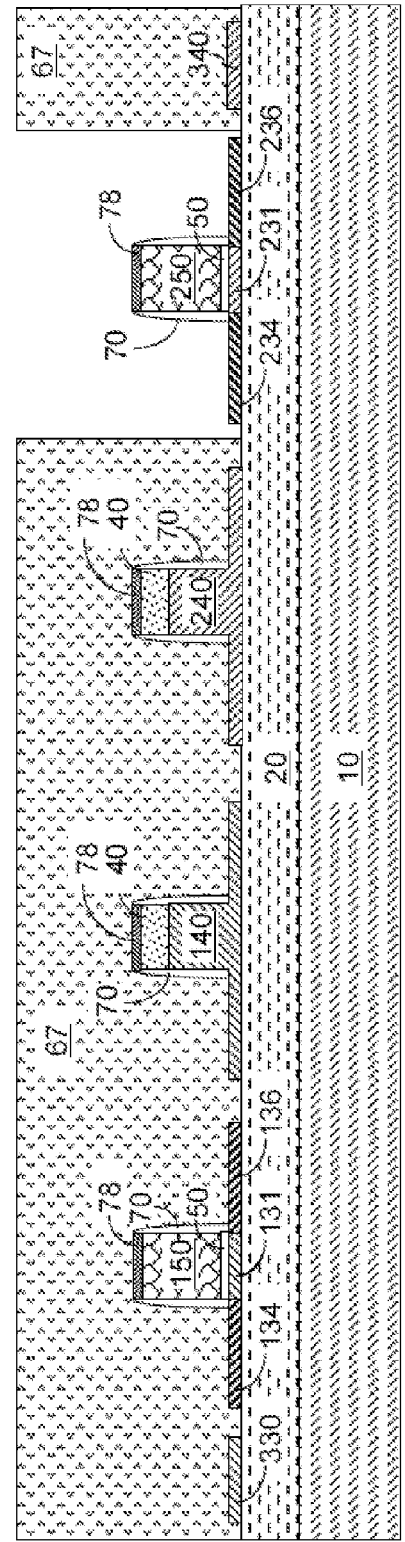
FIG. 14A
FIG. 14B

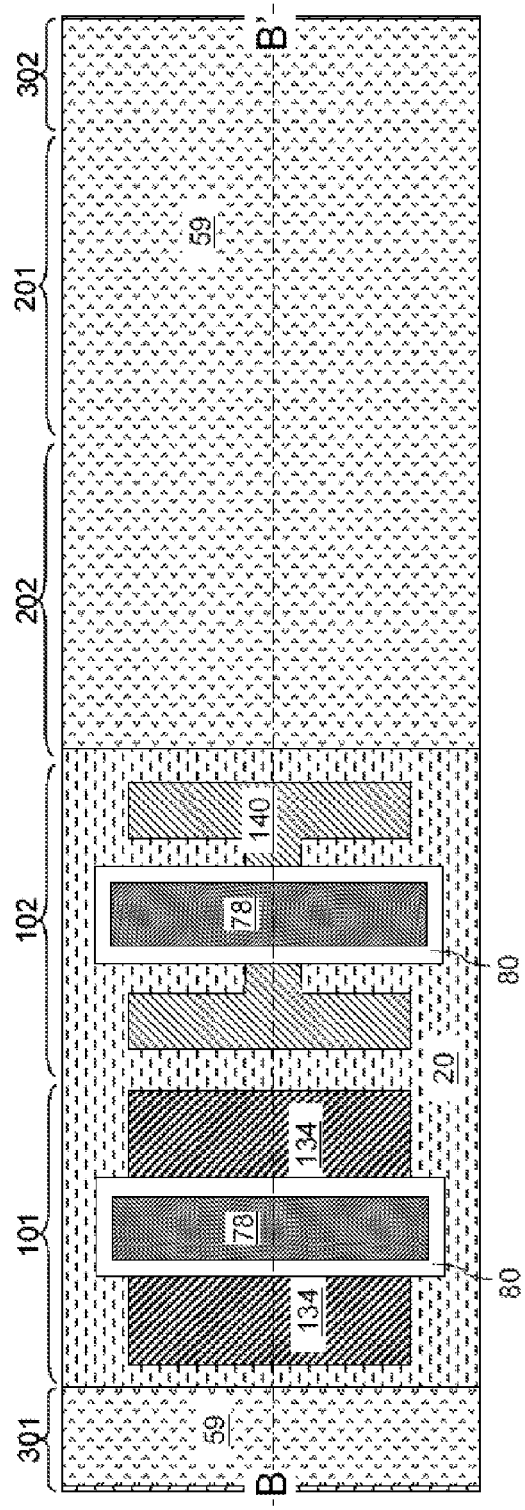
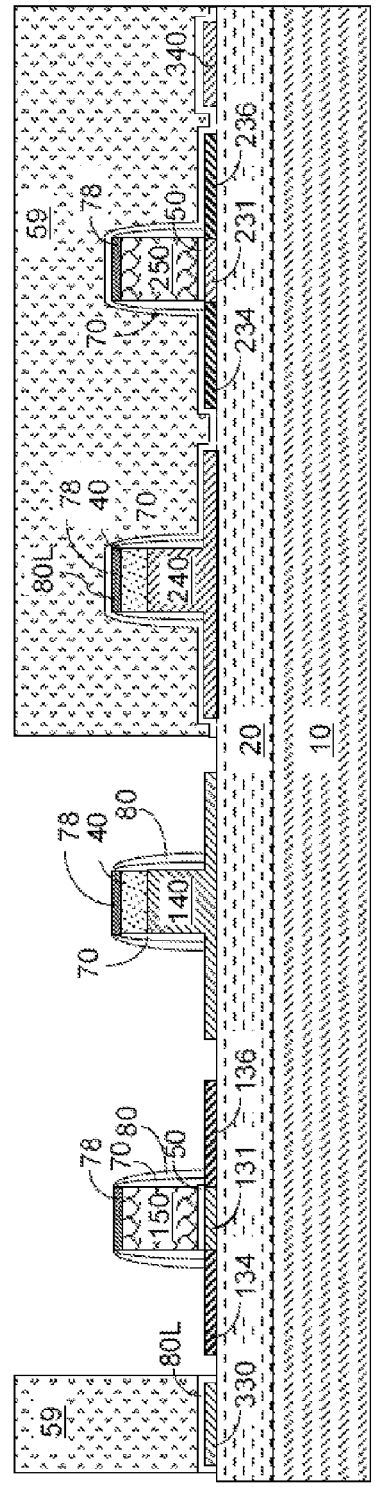
FIG. 15A
FIG. 15B

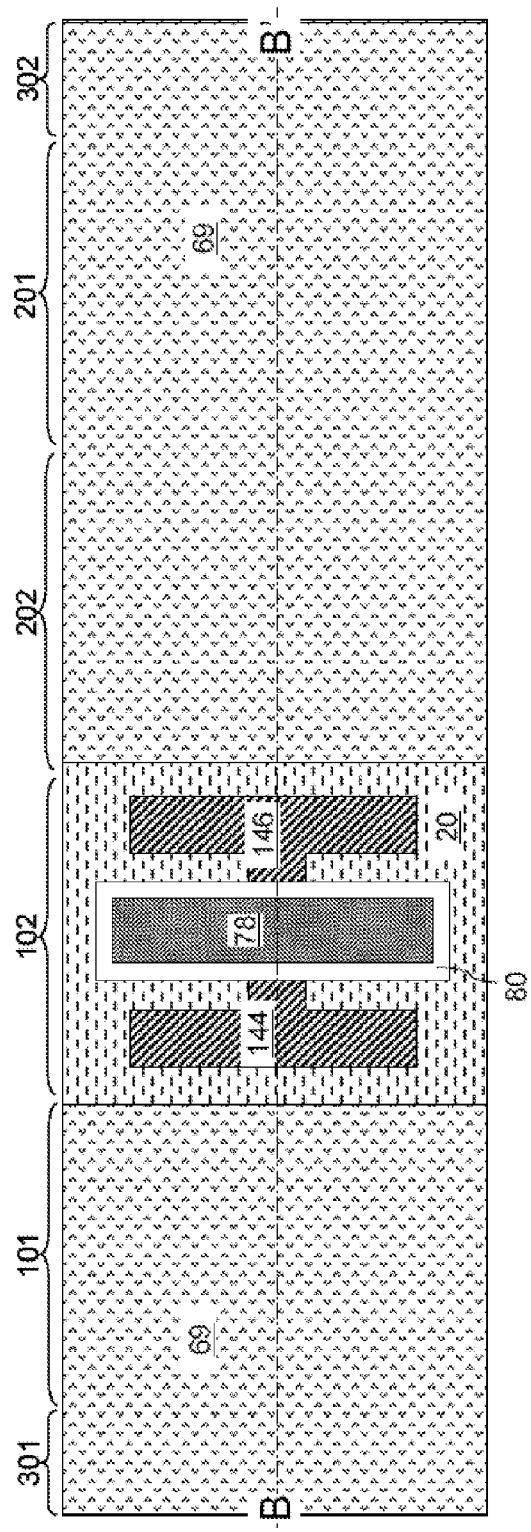
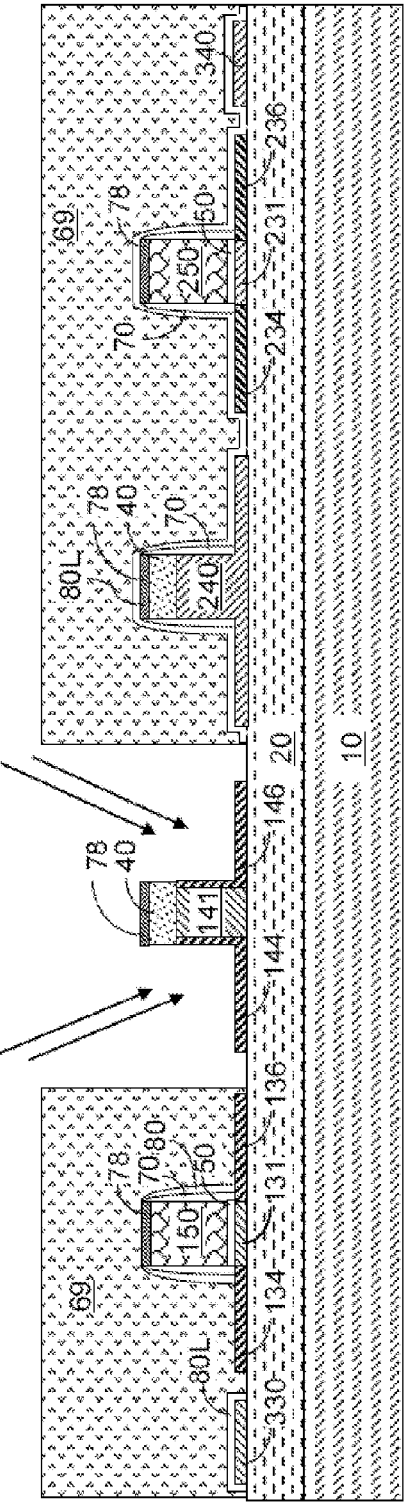
FIG. 16A
FIG. 16B

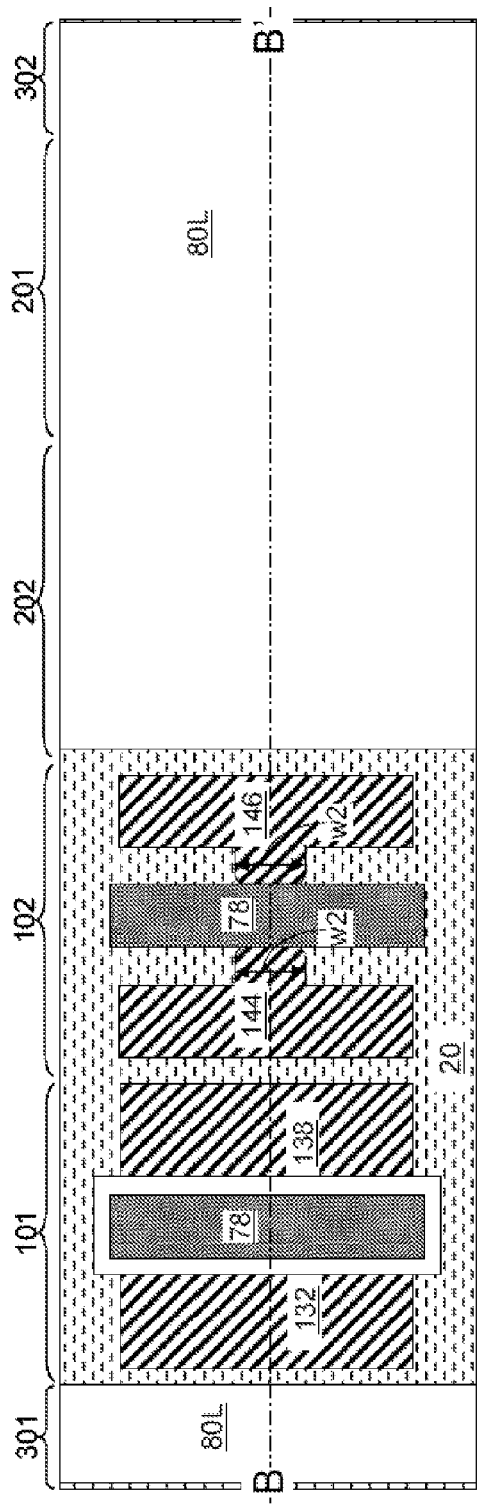
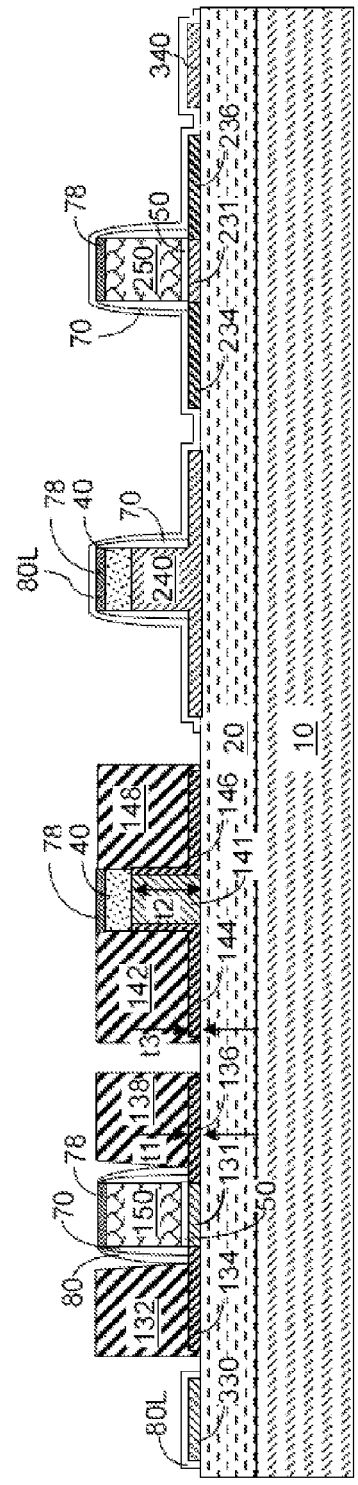
FIG. 17A
FIG. 17B

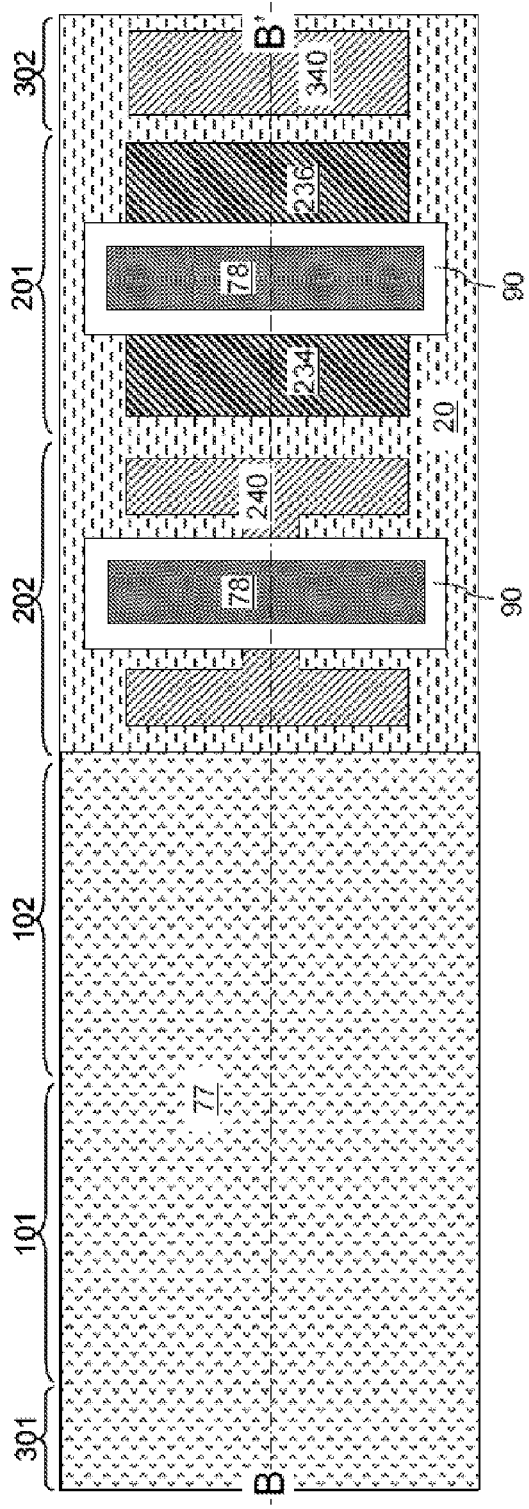
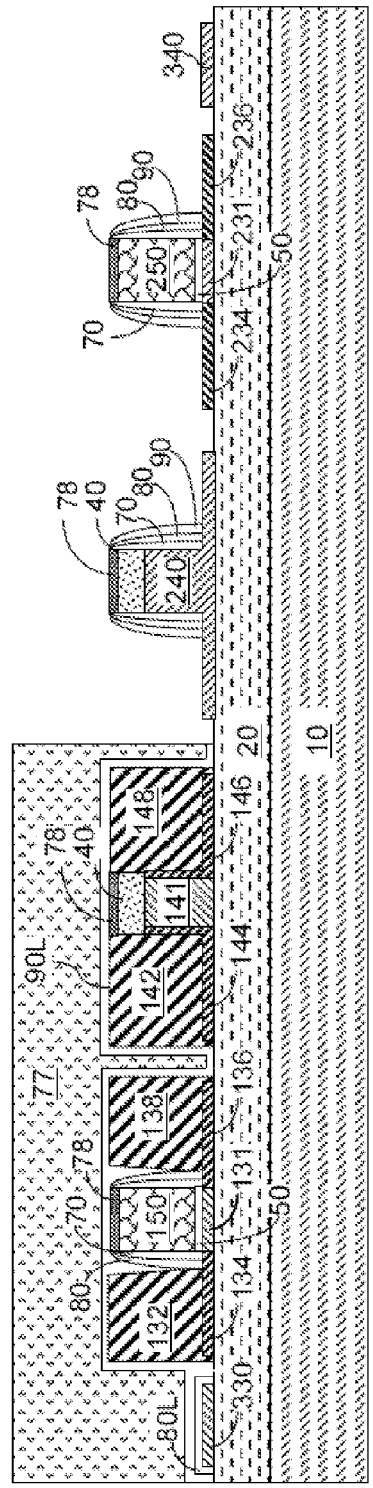
FIG. 18A
FIG. 18B

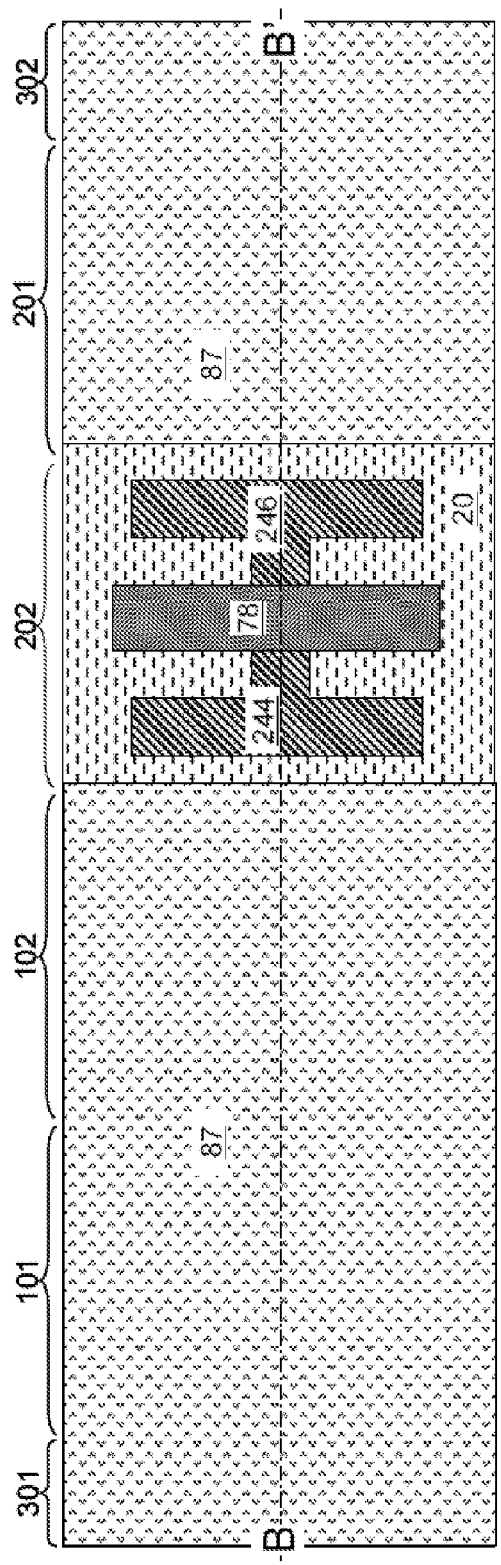
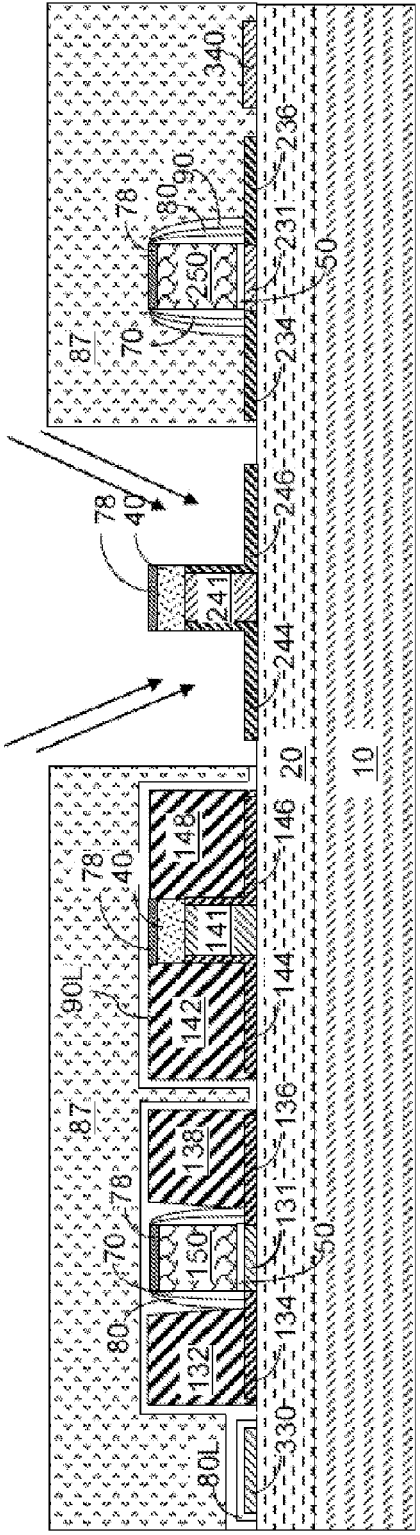
FIG. 19A
FIG. 19B

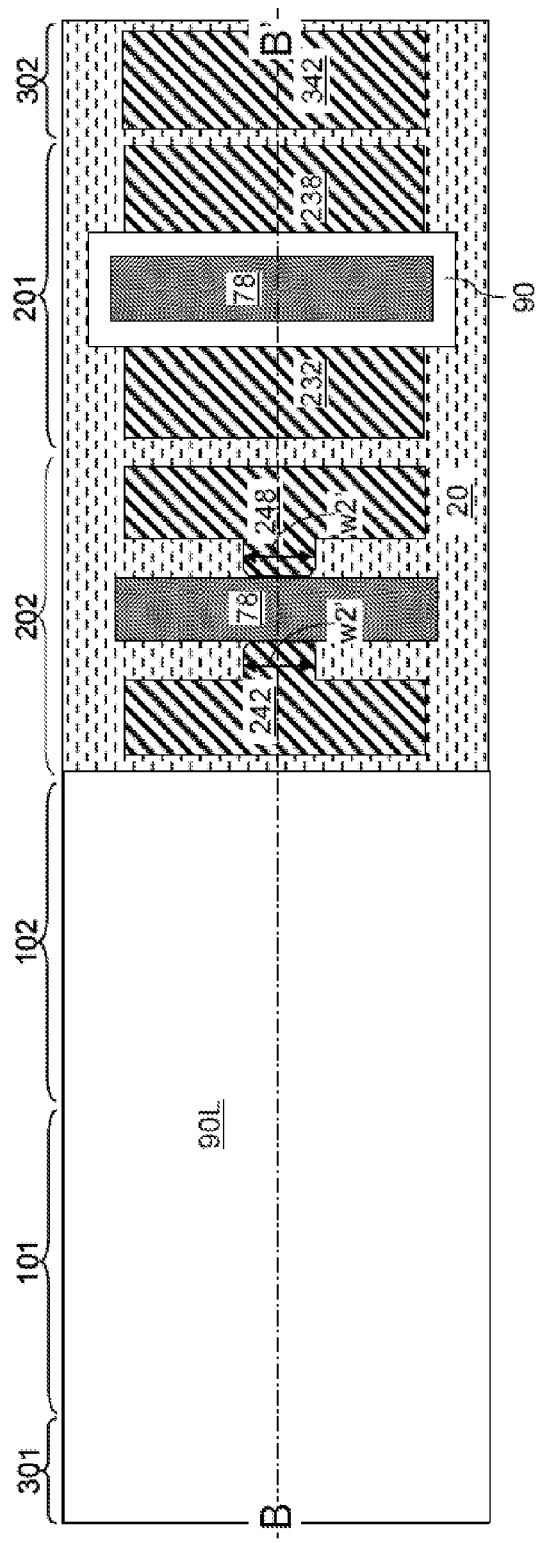
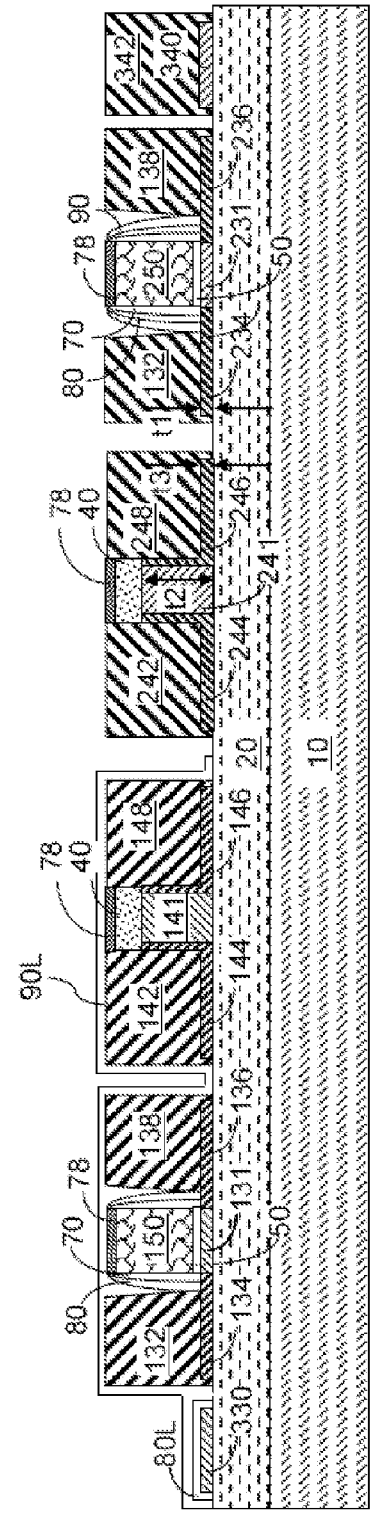
FIG. 20A
FIG. 20B

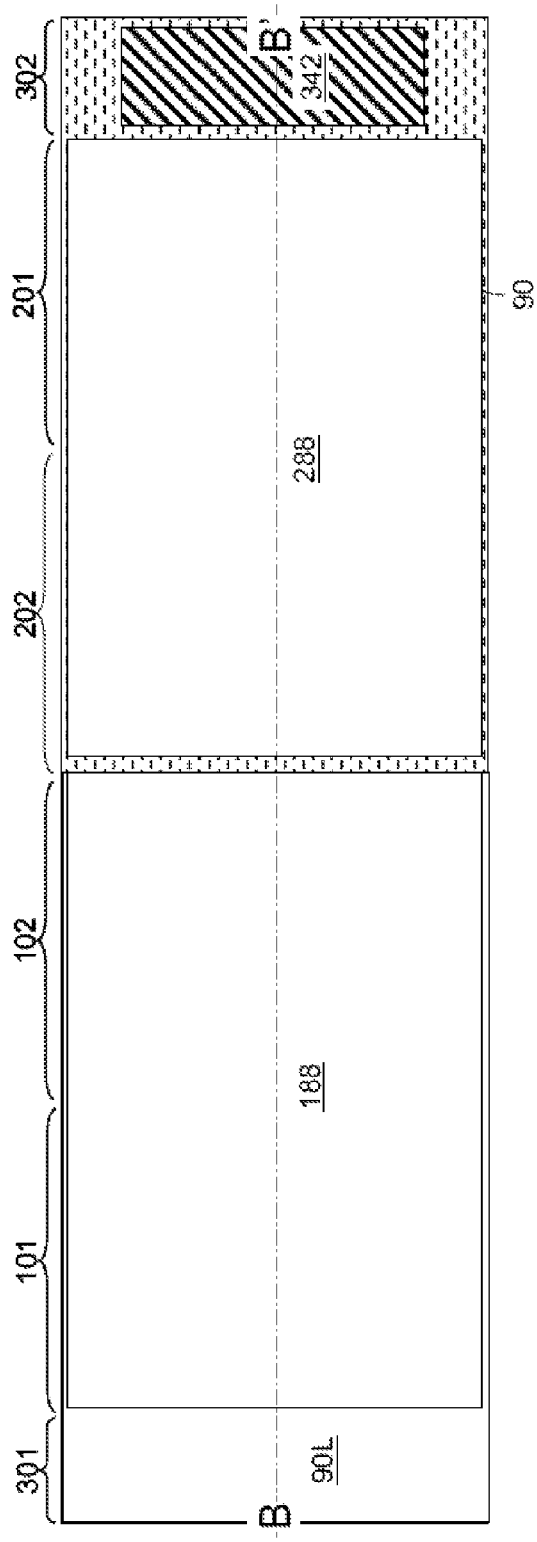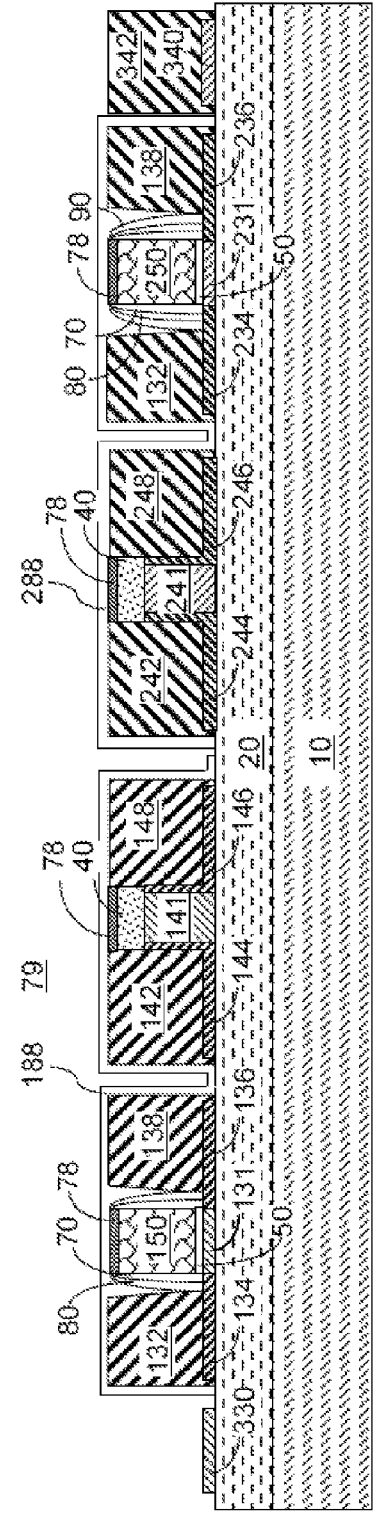
FIG. 21A
FIG. 21B

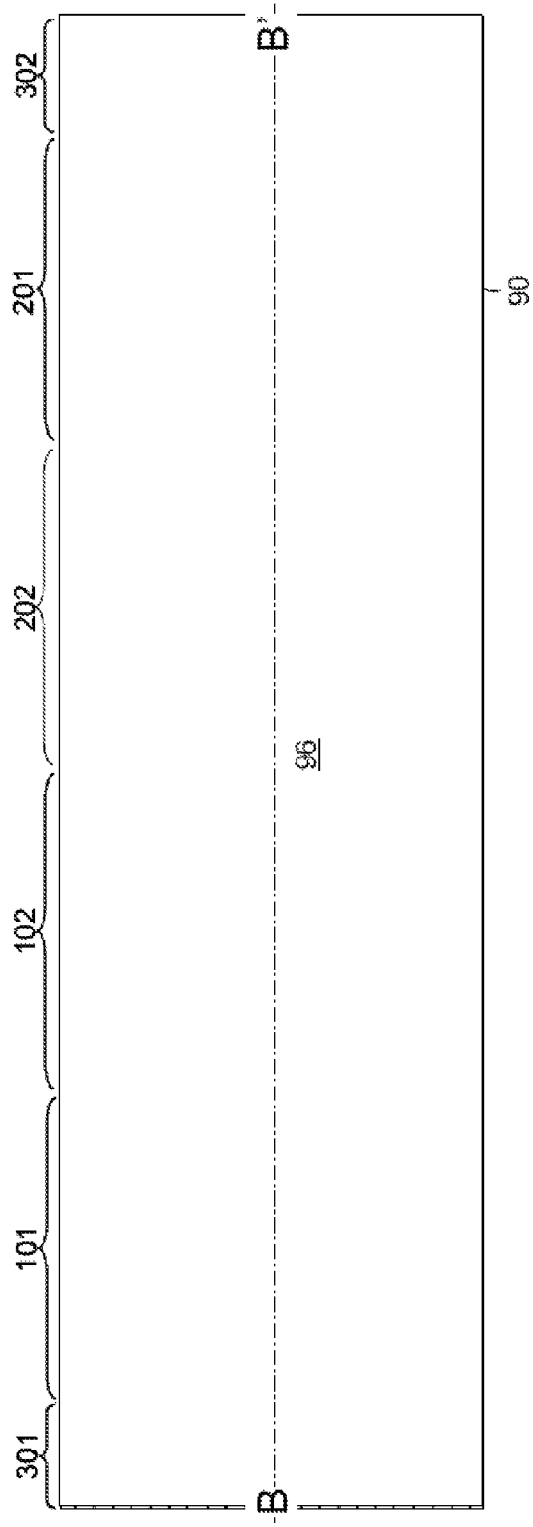
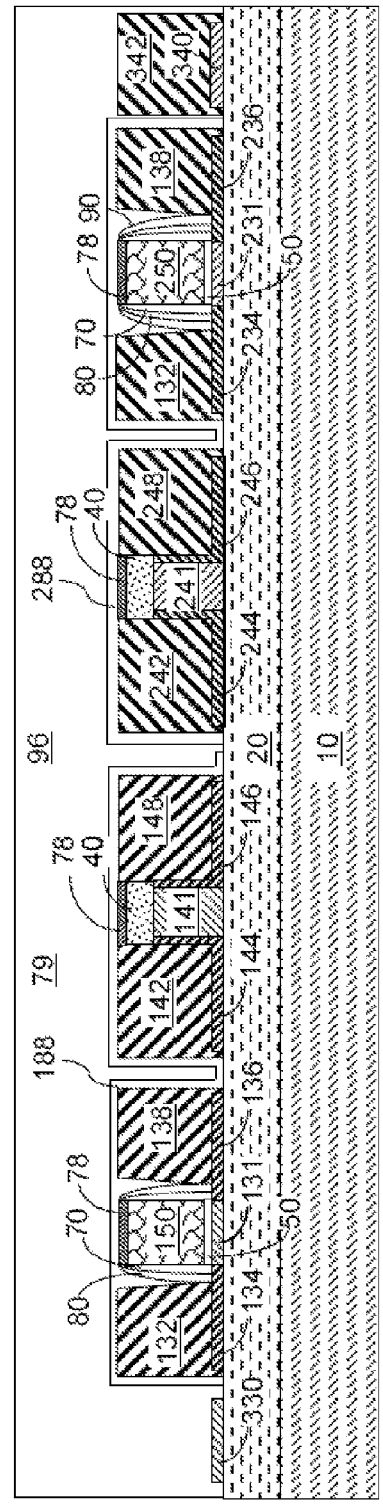
FIG. 22A
FIG. 22B

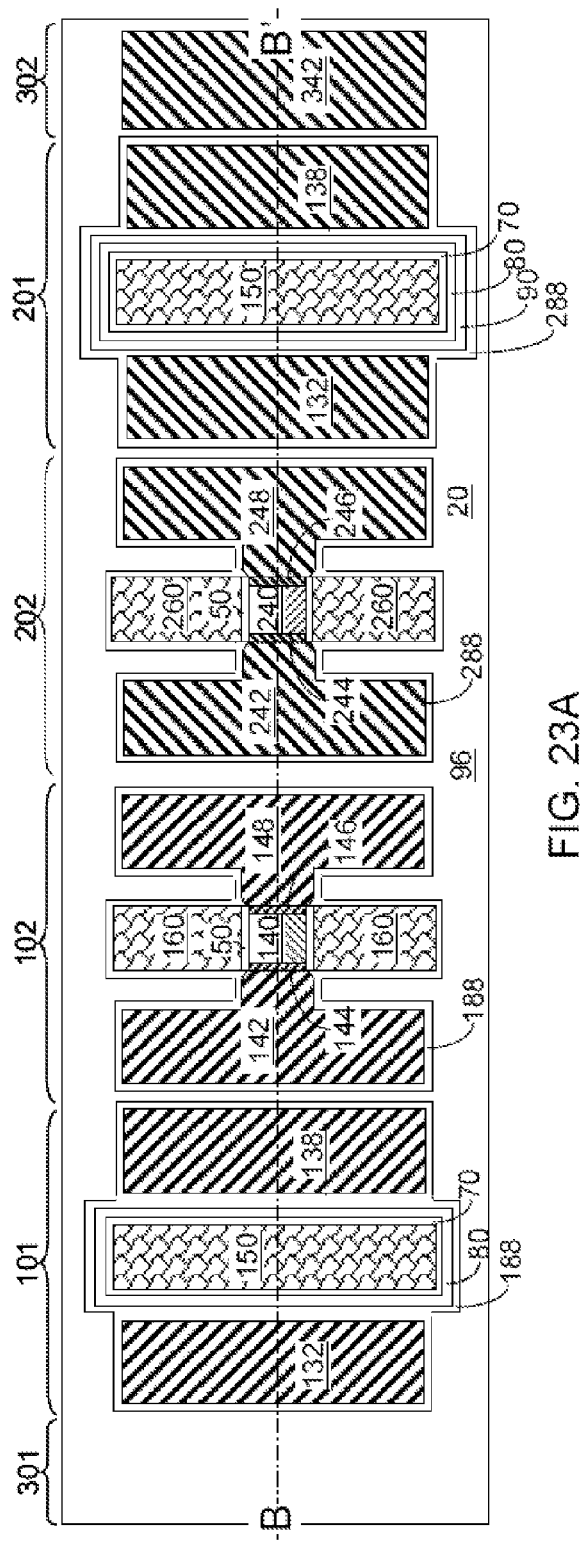
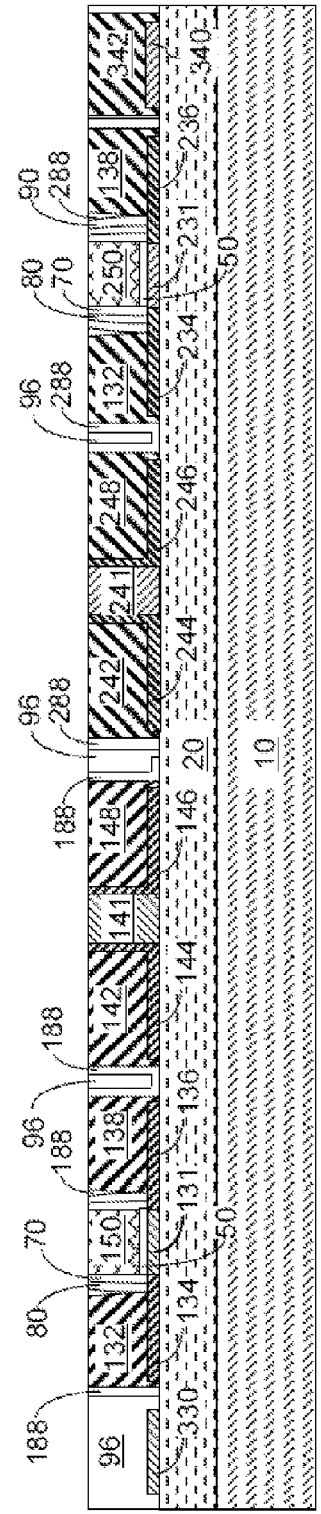
FIG. 23A
FIG. 23B

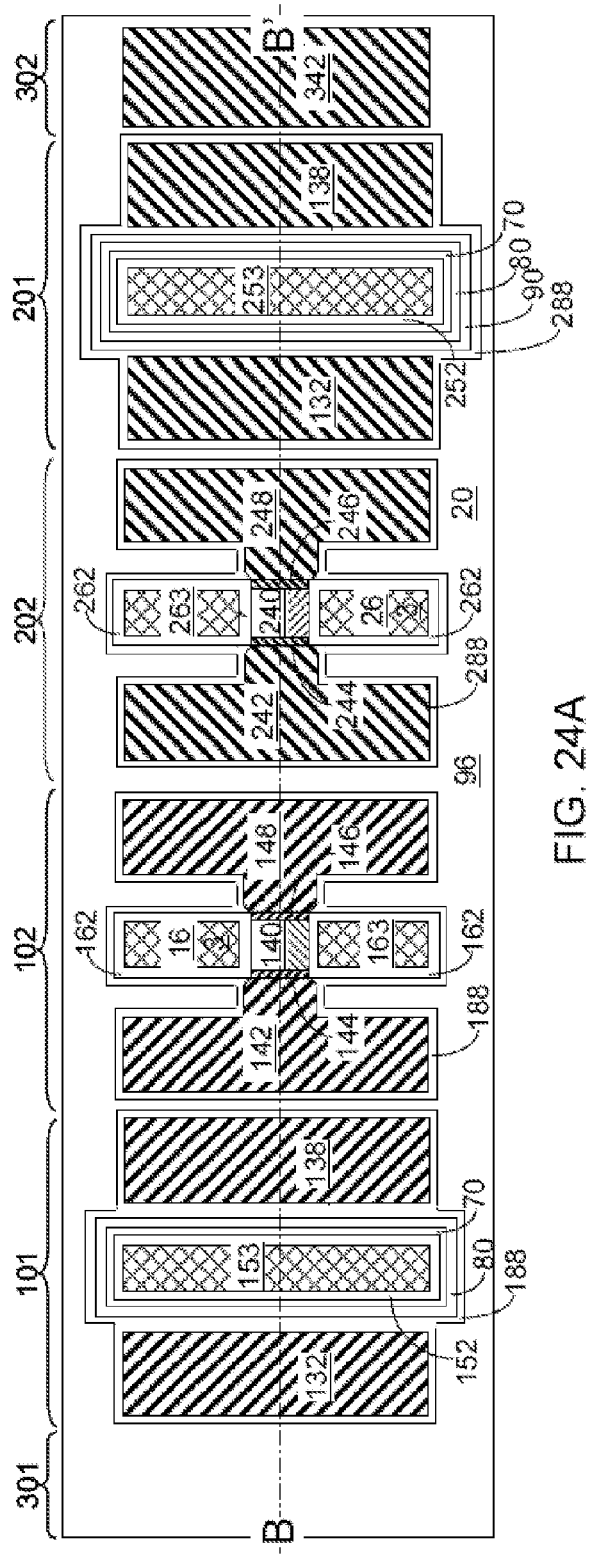
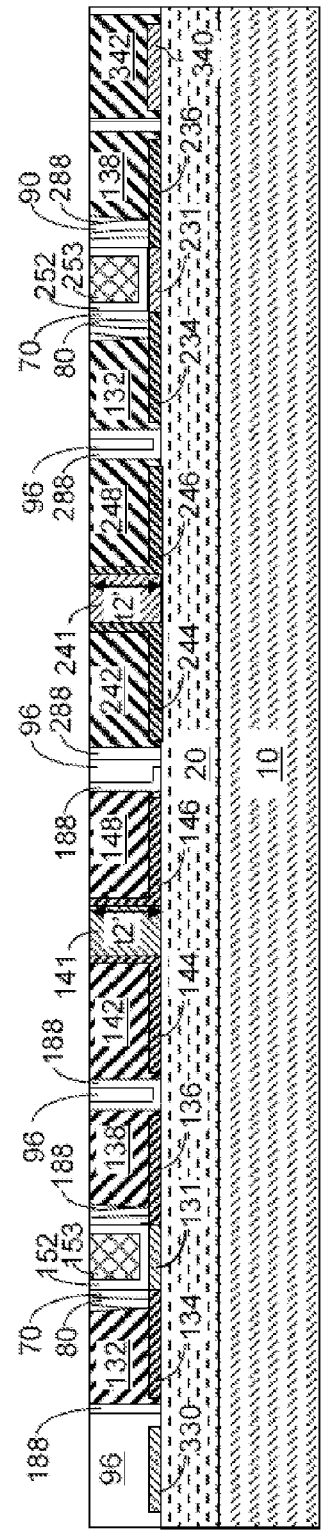
FIG. 24A
FIG. 24B

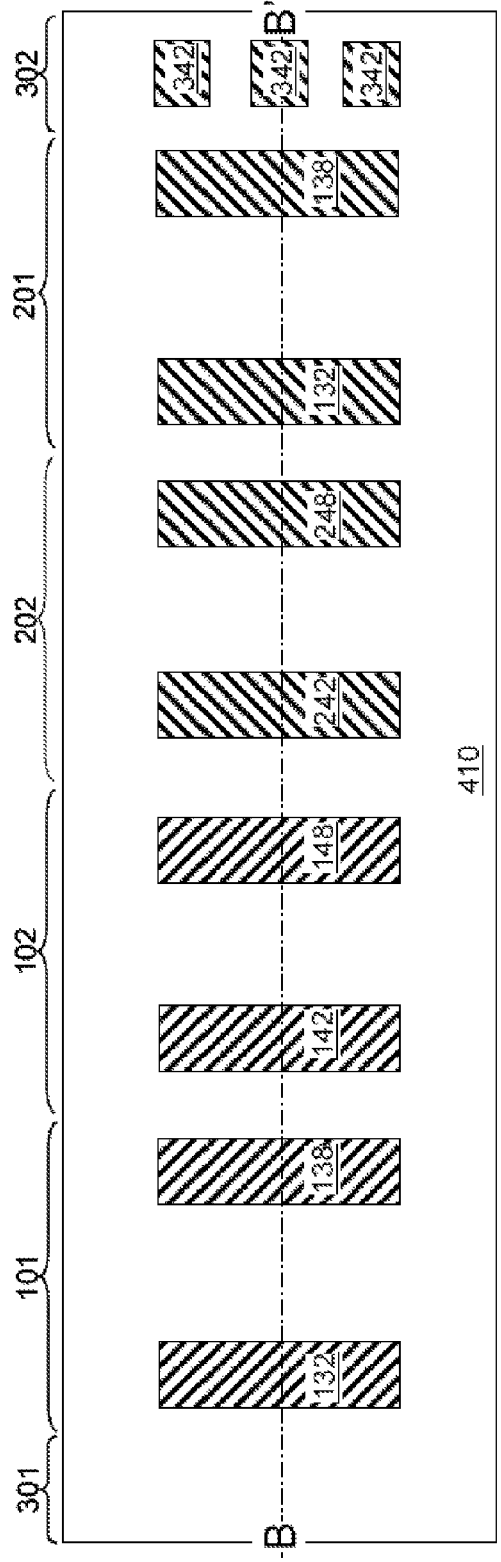
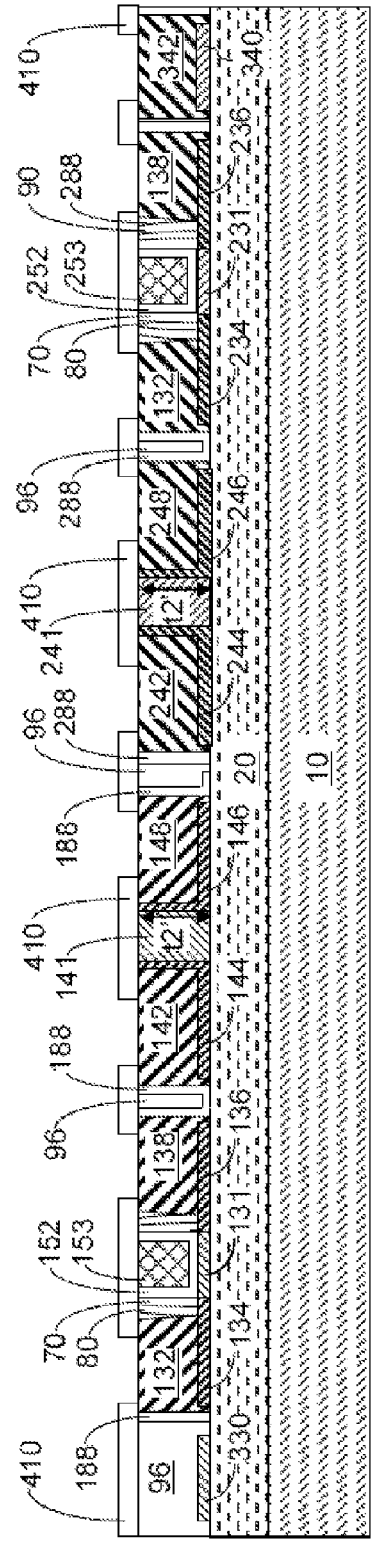
FIG. 25A
FIG. 25B

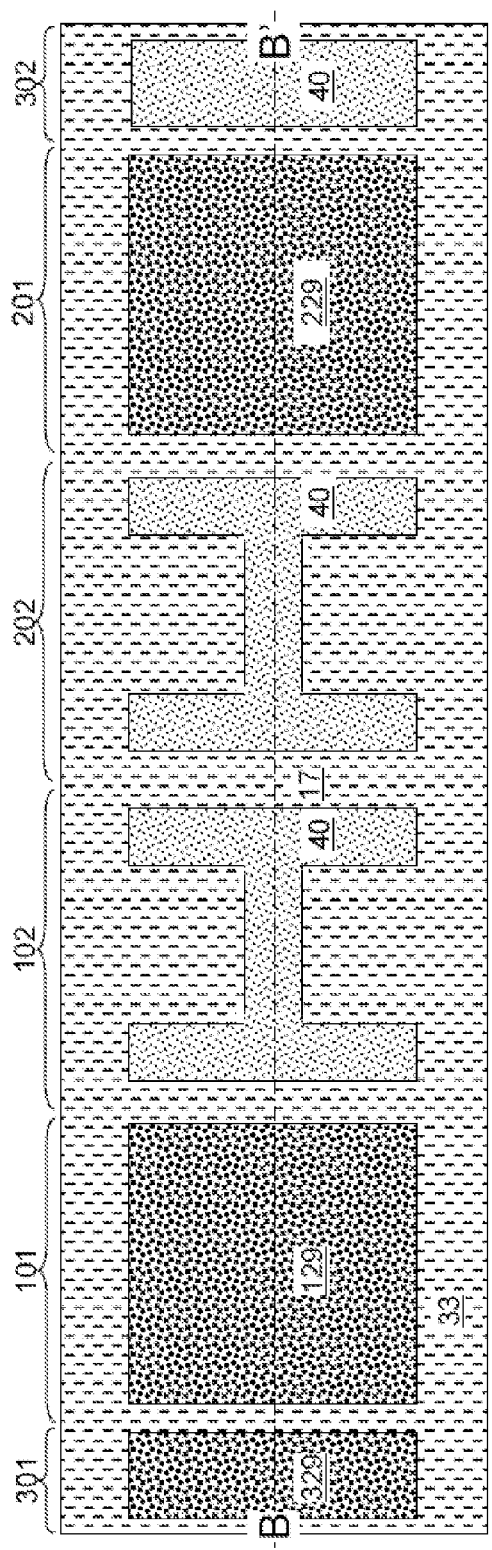
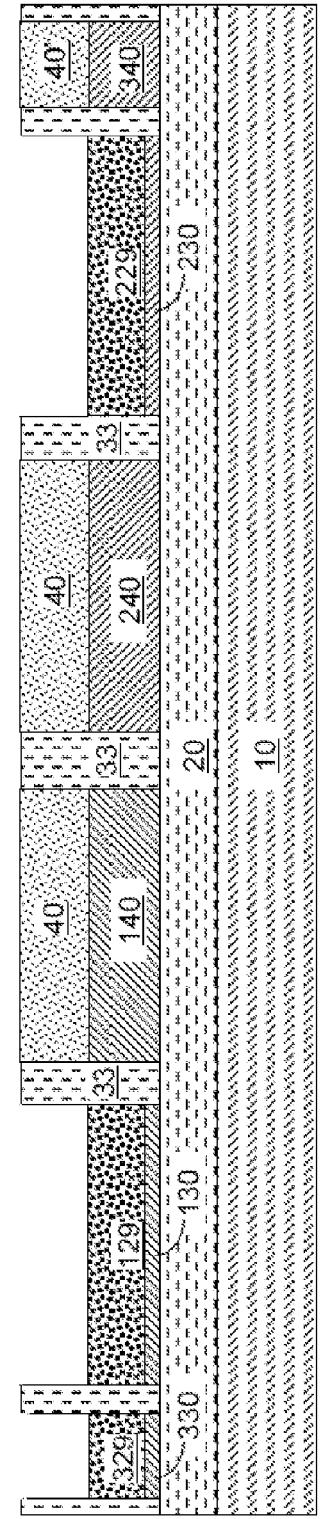
FIG. 30A
FIG. 30B

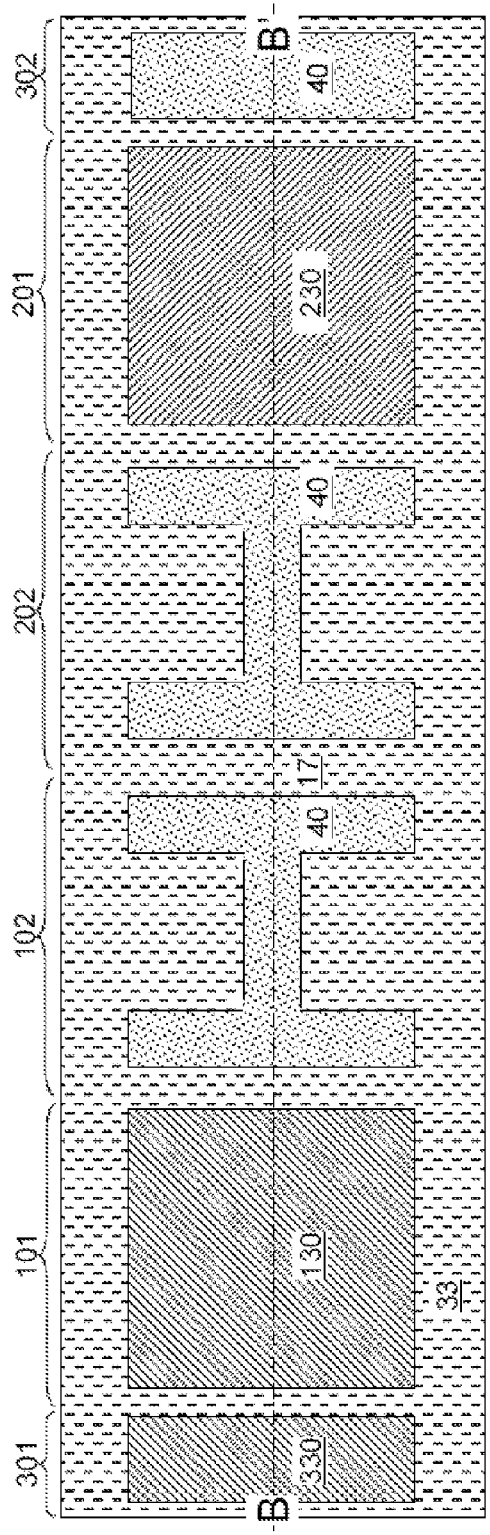
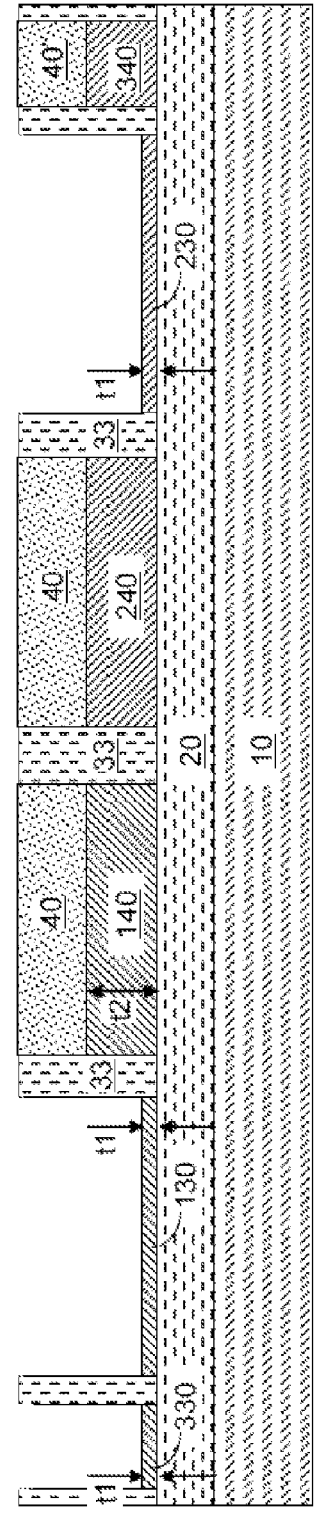
FIG. 31A
FIG. 31B

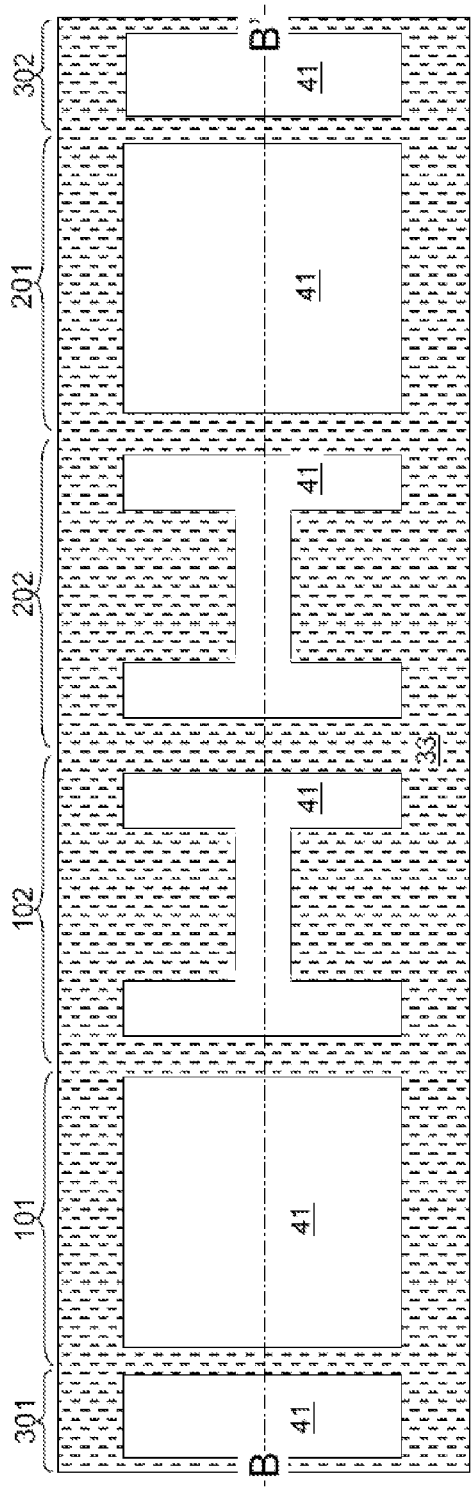
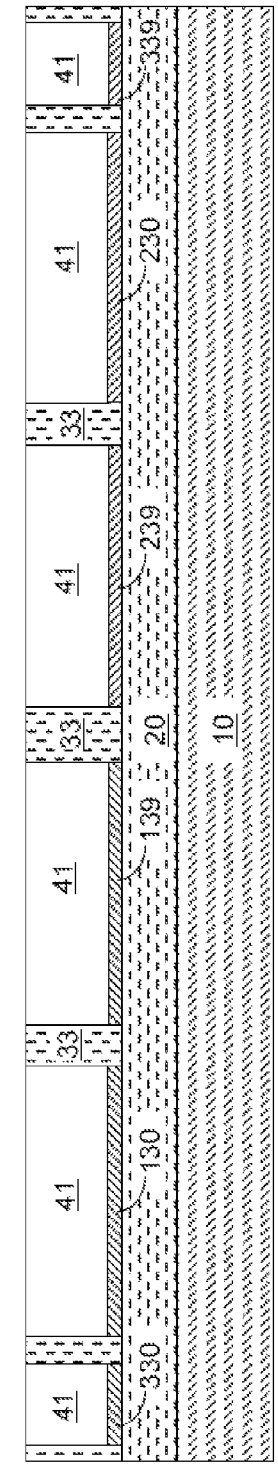
FIG. 34A
FIG. 34B

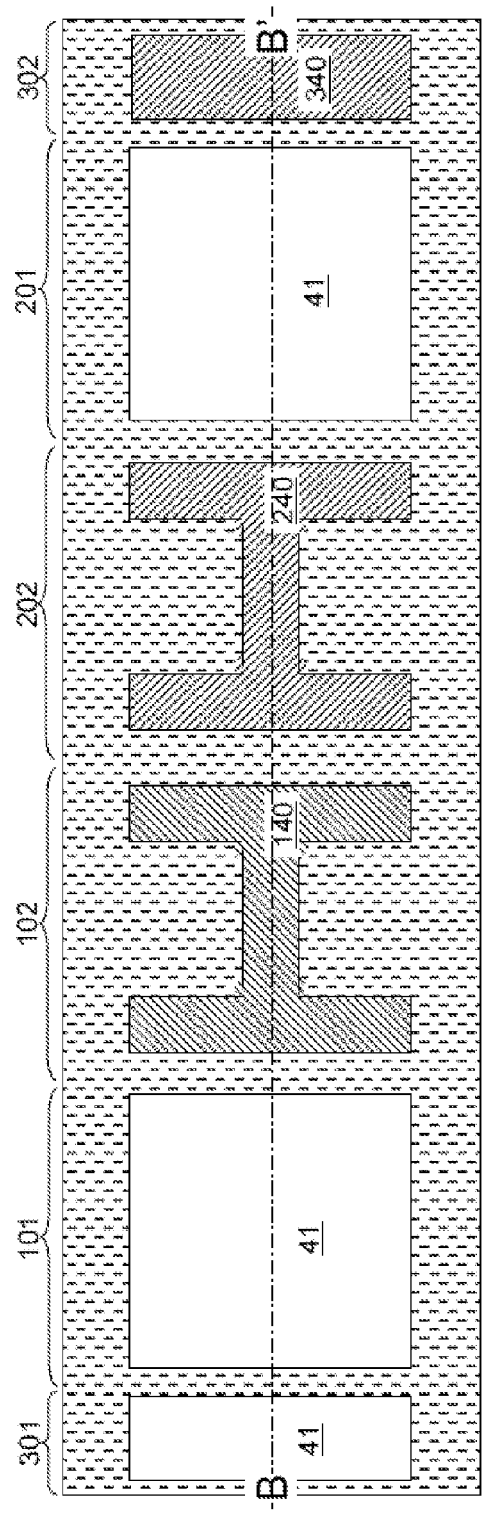
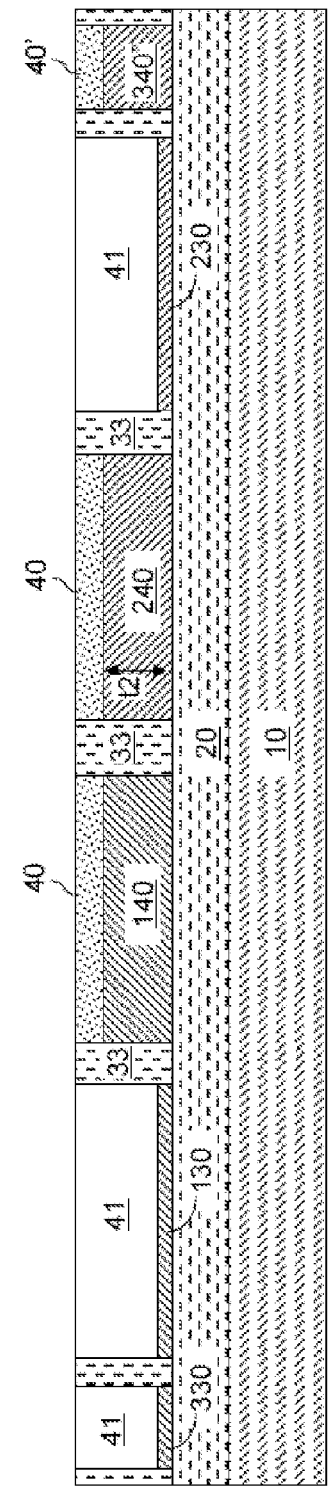
FIG. 37A
FIG. 37B

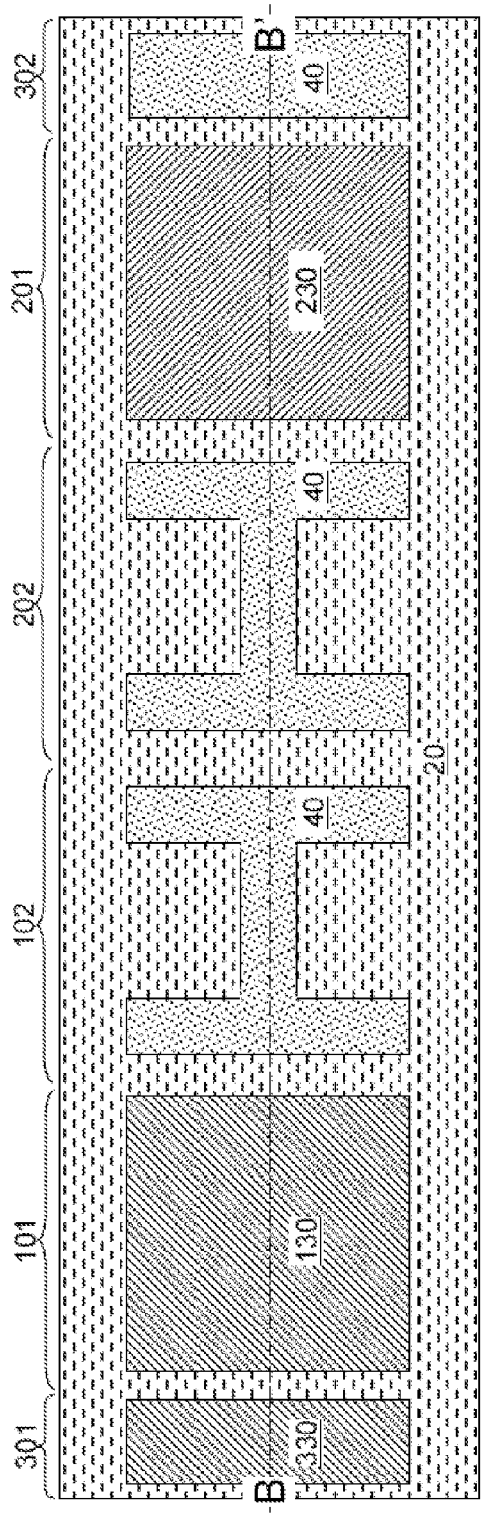
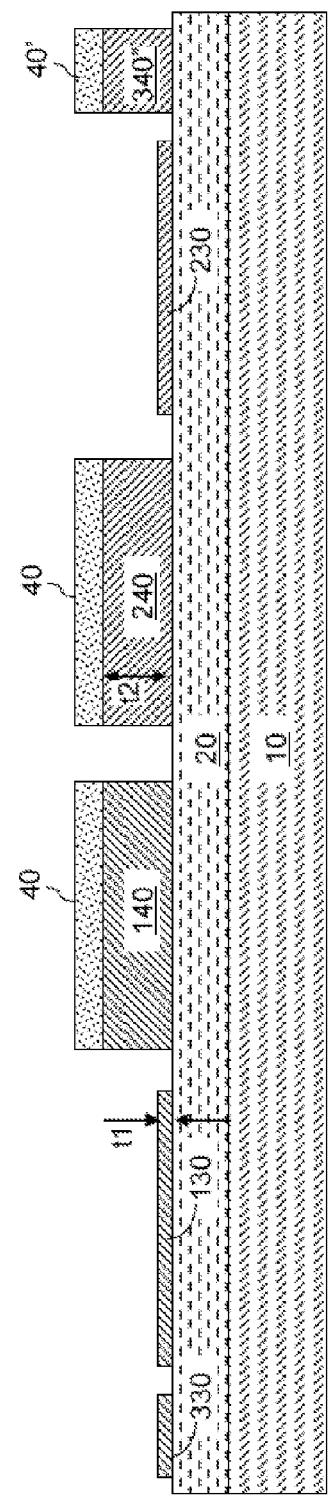
FIG. 38A
FIG. 38B

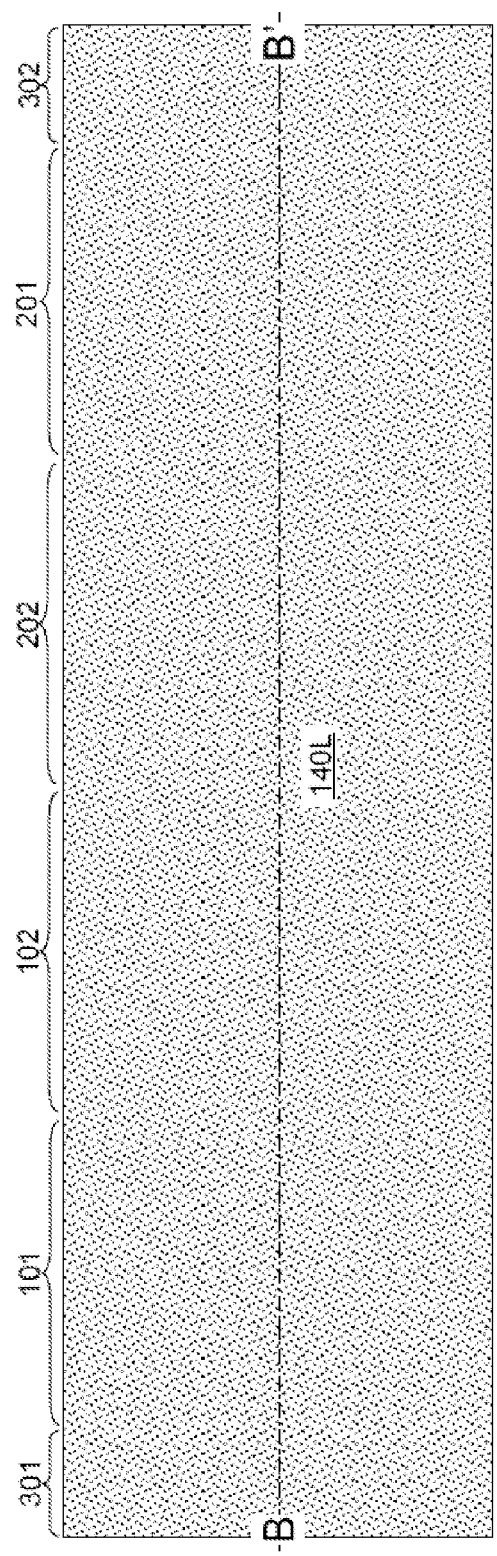
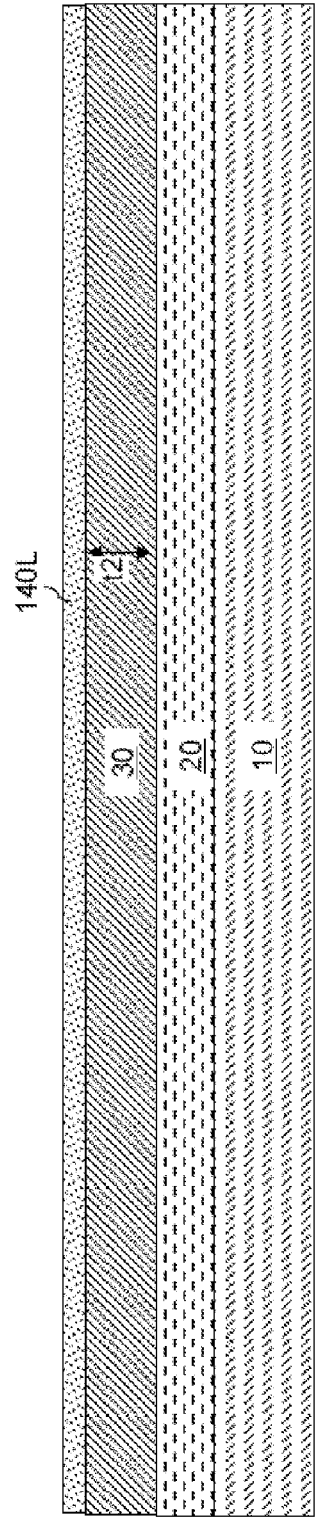
FIG. 39A
FIG. 39B

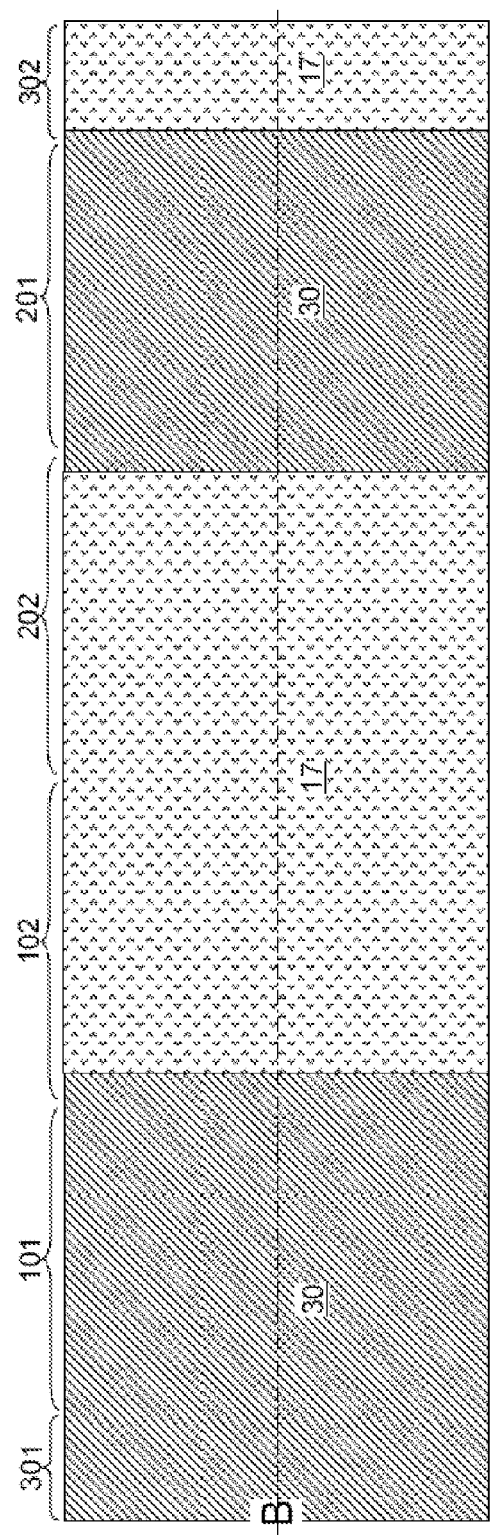
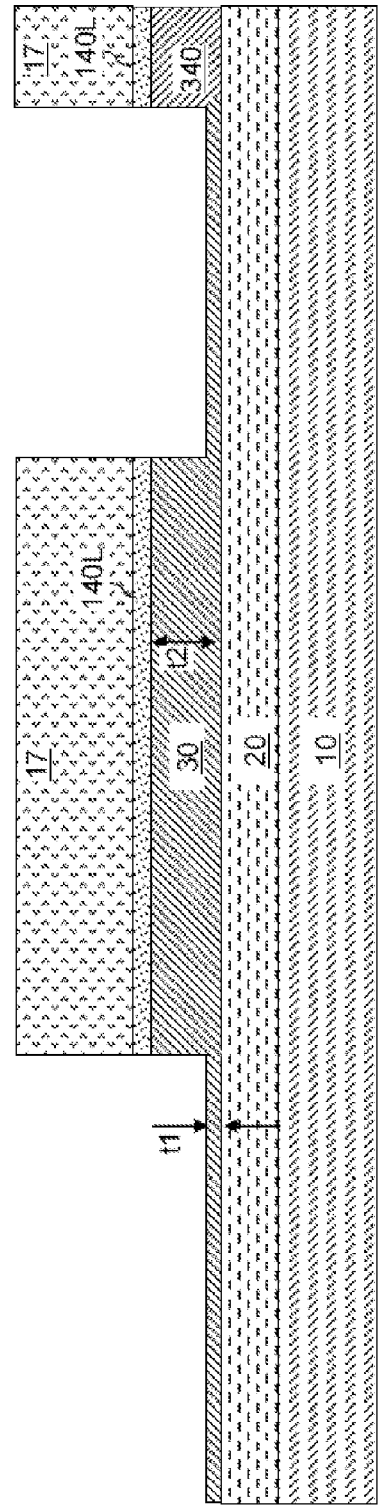
FIG. 40A
FIG. 40B

INTEGRATION OF FIN-BASED DEVICES AND ETSOI DEVICES

BACKGROUND

The present disclosure relates to a structure integrating fin-based devices and extremely thin semiconductor-on-insulator (SOI) devices, and methods of manufacturing the same.

A finFET is field effect transistor including a channel located in a semiconductor fin having a height that is greater than a width. FinFETs employ vertical surfaces of semiconductor fins to effectively increase a device area without increasing the physical layout area of the device. Fin-based devices are compatible with fully depleted mode operation if the lateral width of the fin is thin enough. For these reasons, fin-based devices can be employed in advanced semiconductor chips to provide high performance devices.

Another type of high-performance devices employs an extremely thin semiconductor-on-insulator (ETSOI) layer to form ETSOI devices therein. ETSOI devices typically refer to devices formed in a semiconductor-on-insulator (SOI) layer having a thickness less than 50 nm, and typically less than 30 nm. ETSOI devices are also fully depleted devices due to the small thickness of the ETSOI layer, and as such provide high performance.

FinFETs and ETSOI devices employ different manufacturing sequences. Thus, forming finFETs and ETSOI devices on a same semiconductor substrate have proved to be challenging. However, there exists a need to integrate fin-based devices and ETSOI devices on a same substrate to utilize unique device characteristics provided by both types of devices.

Further, there exists a general need to provide a first type of additional devices built on a thin semiconductor layer having a thickness on par with ETSOI devices and a second type of additional devices built on a thick semiconductor region.

BRIEF SUMMARY

Fin devices and extremely thin semiconductor-on-insulator (ETSOI) devices are formed on the same semiconductor substrate by forming thin semiconductor regions and thick semiconductor regions. Thick semiconductor regions include at least one semiconductor fin. A gate conductor layer is patterned to form disposable planar gate electrodes over ETSOI regions and disposable side gate electrodes on sidewalls of semiconductor fins. End portions of the semiconductor fins are vertically recessed to provide thinned fin portions adjacent to an unthinned fin center portion. After appropriate masking by dielectric layers, selective epitaxy is performed on planar source and drain regions of ETSOI field effect transistors (FETs) to form raised source and drain regions. Further, fin source and drain regions are grown on the thinned fin portions. Source and drain regions, fins, and the disposable gate electrodes are planarized. The disposable gate electrodes are replaced with metal gate electrodes. finFETs and ETSOI FETs are provided on the same semiconductor substrate.

According to an aspect of the present disclosure, a method of forming a semiconductor structure includes: forming a planar semiconductor region having a first thickness and a semiconductor fin having a second thickness greater than the first thickness on an insulator layer of a substrate; recessing end portions of the semiconductor fin relative to a top surface of the semiconductor fin to form two thinned fin portions having a third thickness and laterally spaced by an unthinned fin portion of the semiconductor fin having the second thickness; and selectively growing semiconductor material portions on exposed semiconductor surfaces of the planar semiconductor region, sidewalls of the unthinned fin portion, and the two thinned fin portions.

According to another aspect of the present disclosure, a semiconductor structure including a planar transistor and a finFET located on an insulator layer is provided. The planar transistor includes: a planar semiconductor region including a semiconductor material and having a planar region thickness and including a planar channel region, a planar source extension region, and a rain extension region; and a gate electrode overlying the planar channel region. The finFET includes a semiconductor fin, which contains the semiconductor material and includes a center fin portion and two end fin portions adjoining the center fin portion. The center fin portion has a center portion thickness greater than the planar region thickness and the two end fin portions have an end portion thickness less than the center portion thickness. The semiconductor fin includes: a fin channel region located within the center fin portion; a fin source extension region extending through one of the two end fin portions and one end region of the center fin portion; and a fin drain extension region extending through the other of the two end fin portions and the other end region of the center fin portion.

BRIEF DESCRIPTION OF THE SEVERAL VIEWS OF THE DRAWINGS

In FIGS. 1A-9B, 10A-10C, and 11A-42B, figures with the same numeric prefix correspond to the same processing step. Figures with the suffix "A" are top-down views, and figures with the suffix "B" are vertical cross-sectional views along the vertical plane B-B' in the figure with the same numeric prefix and the suffix "A." FIG. 10C is a horizontal cross-sectional view along the plane C-C' in FIG. 10B.

FIGS. 1A and 1B illustrate a first exemplary semiconductor structure after formation of a pad layer on a semiconductor-on-insulator (SOI) substrate according to a first embodiment of the present disclosure.

FIGS. 3A and 3B illustrate the first exemplary semiconductor structure after removal of the pad layer in thin device areas according to the first embodiment of the present disclosure.

FIGS. 5A and 5B illustrate the first exemplary semiconductor structure after removal of the disposable filler material layer and the dielectric material portions according to the first embodiment of the present disclosure.

FIGS. 6A and 6B illustrate the first exemplary semiconductor structure after formation of surface dielectric material layers according to the first embodiment of the present disclosure.

FIGS. 8A and 8B illustrate the first exemplary semiconductor structure after planarizing the disposable gate material layer and depositing a dielectric cap material layer according to the first embodiment of the present disclosure.

FIGS. 9A and 9B illustrate the first exemplary semiconductor structure after patterning an etch mask layer and etching the material of the disposable gate material layer faster than exposed portions of dielectric fin caps according to the first embodiment of the present disclosure.

FIGS. 10A-10C illustrate the first exemplary semiconductor structure after non-selectively recessing the planarized disposable gate material layer, exposed portions of the semiconductor fin, and the surface dielectric material layers according to the first embodiment of the present disclosure.

FIGS. 11A and 11B illustrate the first exemplary semiconductor structure after etching the planarized disposable gate material layer selective to the surface dielectric material layers according to the first embodiment of the present disclosure.

FIGS. 12A and 12B illustrate the first exemplary semiconductor structure after forming first sidewall spacers according to the first embodiment of the present disclosure.

FIGS. 13A and 13B illustrate the first exemplary semiconductor structure after forming a first planar source extension region and a first planar drain extension region according to the first embodiment of the present disclosure.

FIGS. 14A and 14B illustrate the first exemplary semiconductor structure after forming a second planar source extension region and a second planar drain extension region according to the first embodiment of the present disclosure.

FIGS. 15A and 15B illustrate the first exemplary semiconductor structure after depositing a first dielectric masking layer, applying and patterning a block level mask, and etching exposed horizontal portions of the first dielectric masking layer to form second sidewall spacers according to the first embodiment of the present disclosure.

FIGS. 16A and 16B illustrate the first exemplary semiconductor structure after removal of first and second sidewall spacers from sidewalls of a first semiconductor fin and formation of a first fin source extension region and a first fin drain extension region according to the first embodiment of the present disclosure.

FIGS. 17A and 17B illustrate the first exemplary semiconductor structure after formation of a first raised source region, a first raised drain region, a first fin source region, and a first fin drain region by selective epitaxy according to the first embodiment of the present disclosure.

FIGS. 18A and 18B illustrate the first exemplary semiconductor structure after depositing a second dielectric masking layer, applying and patterning a block level mask, and etching exposed horizontal portions of the second dielectric masking layer and the first dielectric masking layer to form third sidewall spacers according to the first embodiment of the present disclosure.

FIGS. 19A and 19B illustrate the first exemplary semiconductor structure after removal of first, second, and third sidewall spacers from sidewalls of a second semiconductor fin and formation of a second fin source extension region and a second fin drain extension region according to the first embodiment of the present disclosure.

FIGS. 20A and 20B illustrate the first exemplary semiconductor structure after formation of a second raised source region, a second raised drain region, a second fin source region, and a second fin drain region by selective epitaxy according to the first embodiment of the present disclosure.

FIGS. 21A and 21B illustrate the first exemplary semiconductor structure after removal of the second dielectric masking layer and formation of stress-generating dielectric material layers according to the first embodiment of the present disclosure.

FIGS. 22A and 22B illustrate the first exemplary semiconductor structure after formation of a gate-level dielectric material layer according to the first embodiment of the present disclosure.

FIGS. 23A and 23B illustrate the first exemplary semiconductor structure after planarization of the gate-level dielectric material layer, the semiconductor fins, and the selectively grown semiconductor material portions according to the first embodiment of the present disclosure.

FIGS. 24A and 24B illustrate the first exemplary semiconductor substrate after replacement of each disposable gate structures with a U-shaped gate dielectric and a gate electrode according to the first embodiment of the present disclosure.

FIGS. 25A and 25B illustrate the first exemplary semiconductor structure after formation of a metallization mask layer according to the first embodiment of the present disclosure.

FIGS. 30A and 30B illustrate a third exemplary semiconductor structure that is derived from the structure of FIGS. 3A and 3B after structurally damaging exposed portions of the semiconductor material in thin device areas by ion implantation according to a third embodiment of the present disclosure.

FIGS. 31A and 31B illustrate the third exemplary semiconductor structure after removal of damaged semiconductor material portions according to the third embodiment of the present disclosure.

FIGS. 34A and 34B illustrate the fourth exemplary semiconductor structure after patterning the pad dielectric material layer and a top semiconductor layer and forming a disposable filler material layer according to the fourth embodiment of the present disclosure.

FIGS. 37A and 37B illustrate the fourth exemplary semiconductor structure after formation of dielectric fin caps according to the fourth embodiment of the present disclosure.

FIGS. 38A and 38B illustrate the fourth exemplary semiconductor structure after removal of the pad dielectric material layer and the disposable filler material layer according to the fourth embodiment of the present disclosure.

FIGS. 39A and 39B illustrate a fifth exemplary semiconductor structure after formation of a first pad layer on a semiconductor-on-insulator (SOI) substrate according to a fifth embodiment of the present disclosure.

FIGS. 40A and 40B illustrate the fifth exemplary semiconductor structure after patterning the first pad layer and recessing upper portions of a top semiconductor layer in thin device areas according to the fifth embodiment of the present disclosure.

FIGS. 42A and 42B illustrate the fifth exemplary semiconductor structure after patterning various active areas by lithographic patterning and an anisotropic etch of the pad layer and the top semiconductor layer according to the fifth embodiment of the present disclosure.

DETAILED DESCRIPTION

Figure 1A:
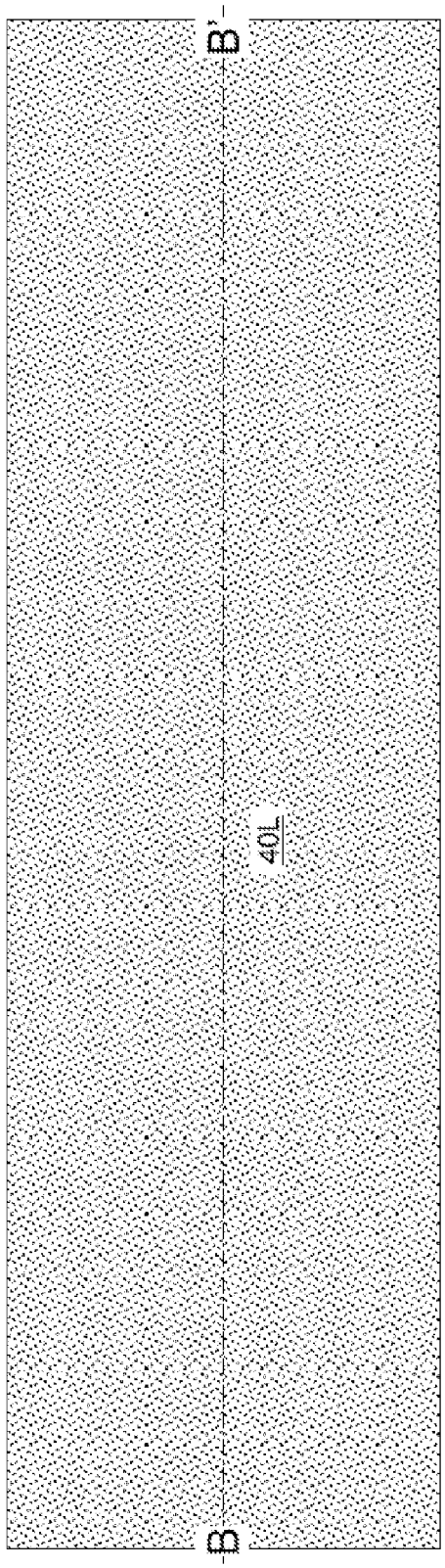

As stated above, the present disclosure relates to a structure integrating fin-based devices and extremely thin semiconductor-on-insulator (SOI) devices, and methods of manufacturing the same, which are now described in detail with accompanying figures. It is noted that like and corresponding elements mentioned herein and illustrated in the drawings are referred to by like reference numerals.

Referring to FIG. 1, a first exemplary semiconductor structure according to a first embodiment of the present disclosure includes a pad layer 40L on a semiconductor-on-insulator (SOI) substrate. The SOI substrate contains a handle substrate 10, a buried insulator layer 20, and a top semiconductor layer 30. The handle substrate 10 can include a semiconductor material, an insulator material, or a conductive material, and provides mechanical support to the buried insulator layer 20 and the top semiconductor layer 30.

The buried insulator layer 20 comprises a dielectric material such as silicon oxide and/or silicon nitride. For example and in one embodiment, the buried insulator layer 20 can comprise thermal silicon oxide. The thickness of the buried insulator layer 20 can be from 5 nm to 1000 nm, and typically from 100 nm to 200 nm. The buried insulator layer 20 may comprises multiple dielectric layers, e.g., silicon oxide and silicon nitride.

The top semiconductor layer 30 comprises a semiconductor material. The thickness of the top semiconductor layer 30 is sufficient to form semiconductor fins therefrom. For example, the top semiconductor layer 30 can have a thickness from 50 nm to 500 nm, and typically from 100 nm to 300 nm, although lesser and greater thicknesses can also be employed. In one embodiment, the top semiconductor layer 30 comprises a single crystalline semiconductor material. The semiconductor material of the top semiconductor layer 30 can be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. The top semiconductor layer 30 can have a built-in biaxial stress in a horizontal plane, i.e., in the plane parallel to the interface between the buried insulator layer 20 and the top semiconductor layer 30.

The pad layer 40L typically includes at least one dielectric material layer. For example, the pad layer 40L can be a vertical stack, from bottom to top, of a thin silicon oxide layer having a thickness from 2 nm to 30 nm and a silicon nitride layer having a thickness from 20 nm to 80 nm, although lesser and greater thicknesses can also be employed.

Figure 2A:
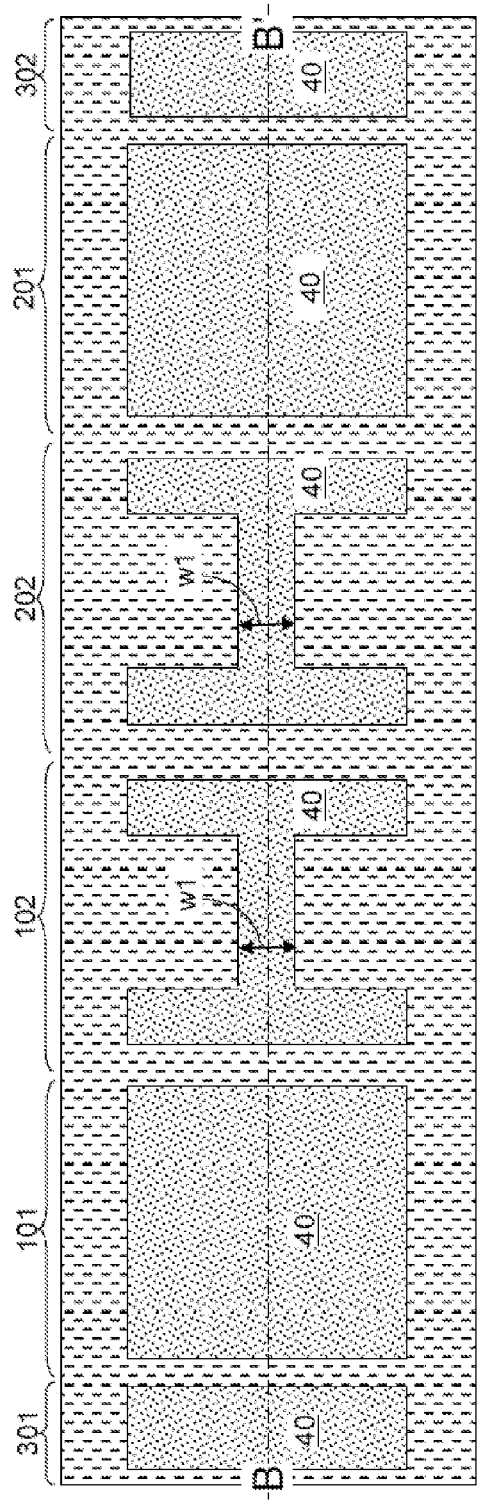
FIGS. 2A and 2B illustrate the first exemplary semiconductor structure after formation of a disposable filler material layer and various active regions according to the first embodiment of the present disclosure.
Figure 2B:
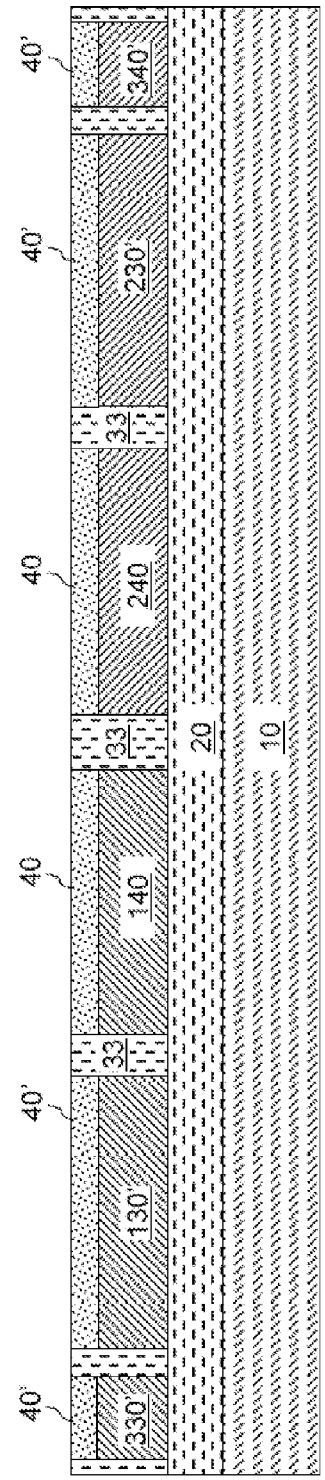

Referring to FIGS. 2A and 2B, the stack of the pad layer 40L and the top semiconductor layer 30 is lithographically patterned, for example, by applying a photoresist (not shown), lithographically patterning the photoresist, and transferring the pattern in the photoresist into the stack of the pad layer 40L and the top semiconductor layer 30 by an anisotropic etch employing the patterned photoresist as an etch mask until the top surface of the buried insulator layer 20 is exposed. The patterned photoresist is removed, for example, by ashing. A disposable filler material layer 33 is formed by filling spaces between patterned remaining portions of the stack of the top semiconductor layer 30 and the pad layer 40L with a filler material. Excess filler material above the top surfaces of the remaining portions of the pad layer 40L is removed by a planarization process, which can be, for example, chemical mechanical planarization employing the remaining portions of the pad layer 40L as a stopping layer.

A plurality of active regions is defined in various device regions by the stacks of the remaining portions of the top semiconductor layer 30 and the pad layer 40L. In an illustrative example, the first exemplary semiconductor structure can include a first extremely-thin semiconductor-on-insulator (ETSOI) device area 101, a second ETSOI device area 201, a first finFET area 102, a second finFET area 202, a thin semiconductor device area 301, and a thick semiconductor device area 302. The first ETSOI area 101 includes a stack of a first unthinned planar semiconductor region 130' and a dielectric pad 40'. The second ETSOI area 201 includes a stack of a second unthinned planar semiconductor region 230' and another dielectric pad 40'. The first finFET area 102 includes a stack of a first semiconductor fin 140 and a dielectric fin cap 40. The second finFET area 202 includes a stack of a second semiconductor fin 240 and another dielectric fin cap 40. The thin semiconductor device area 301 includes a first unthinned semiconductor region 330' and yet another dielectric pad 40'. The thick semiconductor device area 302 includes a second unthinned semiconductor region 340' and still another dielectric pad 40'.

The various device areas can be employed to form different types of devices. For example, the first ETSOI device area 101 can be employed to form a planar field effect transistor (or a "planar transistor") of a first conductivity type, which can be an n-type field effect transistor or a p-type field effect transistor. The second ETSOI device area 201 can be employed to form a field effect transistor of a second conductivity type, which is the opposite conductivity type of the first conductivity type. For example, if the first conductivity type is n-type, the second conductivity type is p-type, and vice versa. The first finFET area 102 can be employed to form a finFET of the first conductivity type. The second finFET area 202 can be employed to form a finFET of the second conductivity type. The thin semiconductor device area 301 can be employed to form any type of semiconductor device that employs a thin semiconductor portion. The thick semiconductor device area 302 can be employed to form any type of semiconductor device that employs a thick semiconductor portion. The various devices areas (101, 201, 102, 202, 301, 302) can be implanted with dopants of suitable conductivity types at appropriate levels, for example, by masked ion implantation of dopant atoms.

The first unthinned semiconductor region 330' and the second unthinned semiconductor region 340' are referred to as "unthinned" semiconductor regions because the thicknesses of the first unthinned semiconductor region 330' and the second unthinned semiconductor region 340' are the same as the thickness of the top semiconductor layer 30 as originally provided. Within each stack of a remaining portion of the top semiconductor layer 30 and an overlying remaining portion of the pad layer 40L, the remaining portion of the top semiconductor layer 30 has the same horizontal cross-sectional area as the overlying remaining portion of the pad layer 40L. Each of the first semiconductor fin 140 and the second semiconductor fin 240 can have parallel sidewalls around a center portion of the semiconductor fin. For example, a pair of sidewalls in each of the first semiconductor fin 140 and the second semiconductor fin 240 can be spaced from each other by a first width w1.

Referring to FIGS. 3A and 3B, a photoresist 17 is applied and patterned to cover the first finFET area 102, the second finFET area 202, and the thick device area 302. The exposed dielectric pads 40' in thin device areas, i.e., in the first and second ETSOI device areas (101, 201) and the thin semiconductor device area 301, are removed, for example, by a wet etch or a dry etch employing the patterned photoresist 17 as an etch mask. The photoresist 17 is subsequently removed, for example, by ashing.

Figure 4A:
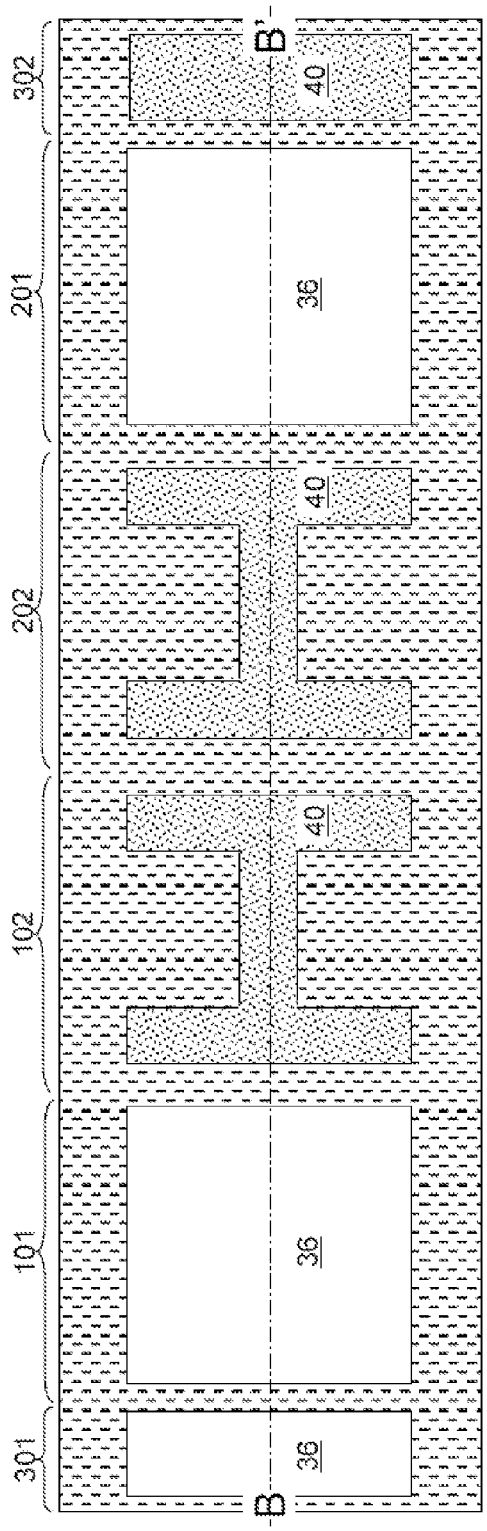
FIGS. 4A and 4B illustrate the first exemplary semiconductor structure after conversion of a semiconductor material in thin device areas into dielectric material portions according to the first embodiment of the present disclosure.
Figure 4B:
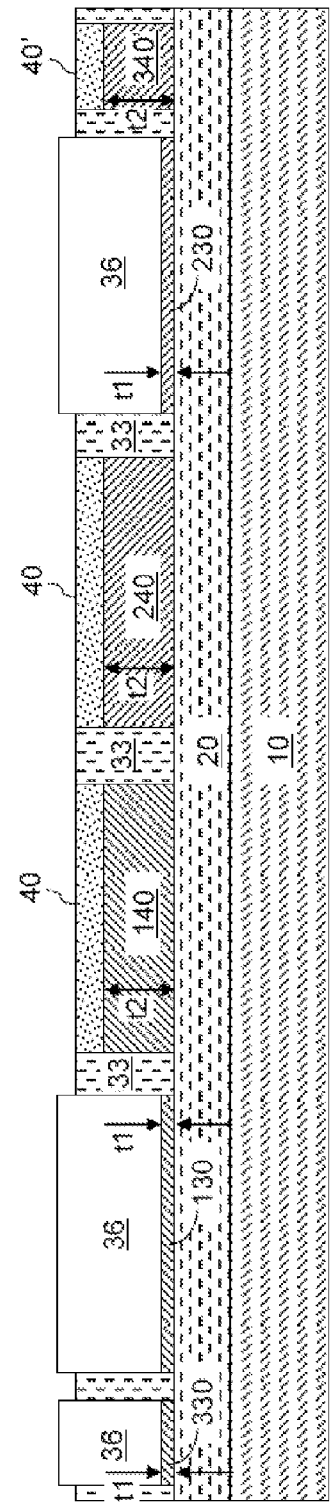

Referring to FIGS. 4A and 4B, the semiconductor material in thin device areas (101, 201, 301) is converted into dielectric material portions 36 by thermal processing or plasma processing. For example, thermal or plasma oxidation or nitridation can be employed to convert upper portions of the first unthinned planar semiconductor region 130', the second unthinned planar semiconductor region 230', and the first unthinned semiconductor region 330'. If the dielectric fin caps 40 and the dielectric pad 40' include silicon nitride and the first unthinned planar semiconductor region 130', the second unthinned planar semiconductor region 230', and the first unthinned semiconductor region 330' include silicon or a silicon germanium alloy, the dielectric material portions 36 can include silicon oxide or silicon germanium oxide that is formed by thermal conversion.

This conversion process thins the first unthinned planar semiconductor region 130', the second unthinned planar semiconductor region 230', and the first unthinned semiconductor region 330' so that the remaining semiconductor material portions form a first planar semiconductor region 130, a second planar semiconductor region 230, and a first thinned semiconductor region 330, respectively. Each of the first planar semiconductor region 130, the second planar semiconductor region 230, and the first thinned semiconductor region 330 has a same thickness throughout, which is less than the thickness of the original top semiconductor layer 30 as provided in FIGS. 1A and 1B. The thickness of the first planar semiconductor region 130, the second planar semiconductor region 230, and the first thinned semiconductor region 330 is herein referred to as a first thickness t1, or a "planar region thickness." The thickness of the first semiconductor fin 140, the second semiconductor fin 240, and the second unthinned semiconductor region 340' is the same as the original thickness of the top semiconductor layer 30 as provided in FIGS. 1A and 1B, and is herein referred to as a second thickness t2.

The first thickness t1 is less than 100 nm, and is typically less than 50 nm, and is preferably between 5 nm and 30 nm.

Referring to FIGS. 5A and 5B, the dielectric material portions 36 and the disposable filler material layer 33 are removed selective to the semiconductor material portions (130, 230, 330, 140, 240, 340') derived from the top semiconductor layer 30 and the dielectric fin caps 40 and the dielectric pad 40'. The entirety of each planar semiconductor regions (130, 140) has the first thickness t1, and the entirety of each semiconductor fin (140, 240) has the second thickness t2 at the end of this processing step.

Referring to FIGS. 6A and 6B, various surface dielectric material layers 50 are formed by conversion of exposed surface portions of the semiconductor material portions (130, 230, 330, 140, 240, 340') by thermal conversion or plasma conversion. If a thermal conversion process is employed, the thermal conversion process can employ thermal oxidation or thermal nitridation. If a plasma conversion process is employed, the thermal conversion process can employ plasma oxidation or plasma nitridation. For example, if the semiconductor material portions (130, 230, 330, 140, 240, 340') include single crystalline silicon, the surface dielectric material layers 50 can be thermal oxide layers, which can have a thickness from 1 nm to 30 nm, and typically from 2 nm to 10 nm, although lesser and greater thicknesses can also be employed.

Figure 7A:
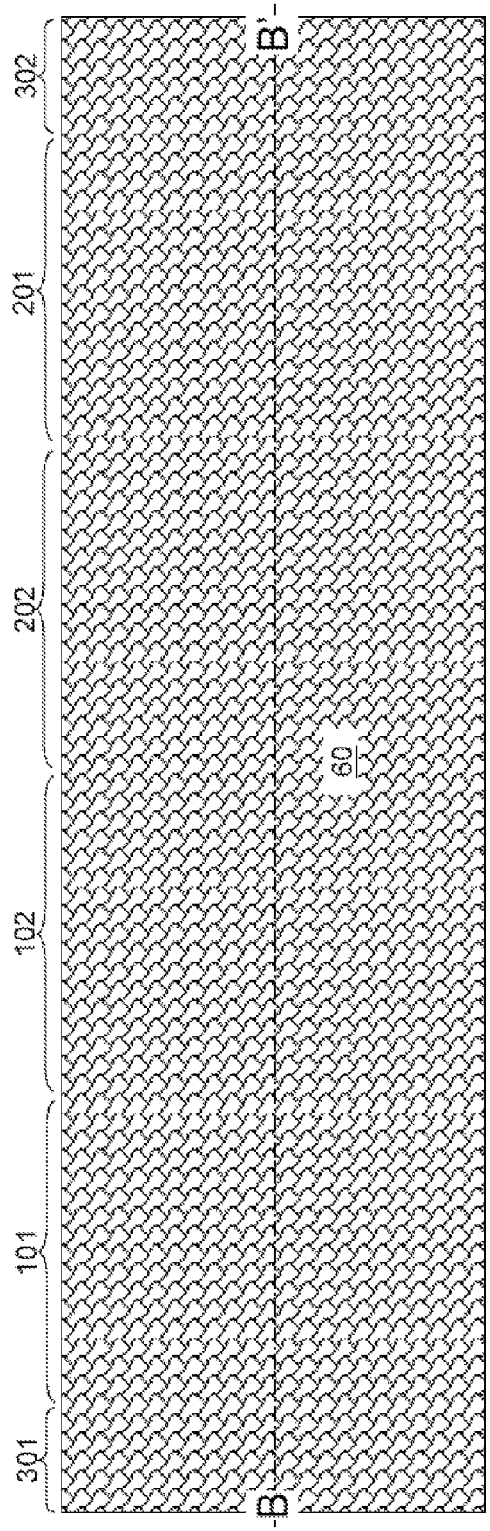
FIGS. 7A and 7B illustrate the first exemplary semiconductor structure after deposition of a disposable gate material layer according to the first embodiment of the present disclosure.
Figure 7B:
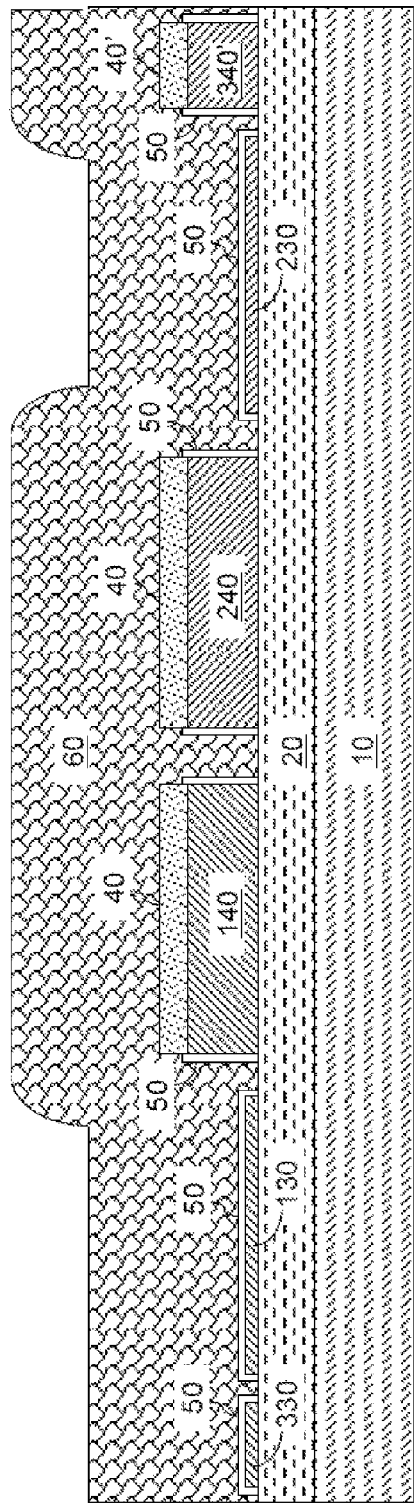

Referring to FIGS. 7A and 7B, a disposable gate material layer 60 is deposited. The disposable gate material layer 60 includes a material that can be removed selective to the semiconductor material of the semiconductor material portions (130, 230, 330, 140, 240, 340') and dielectric materials to be subsequently deposited as stress-generating dielectric material layers (such as tensile or compressive nitride layers) and a gate-level dielectric material layer 96 (See FIGS. 22A and 22B). For example, the disposable gate material layer 60 can be a metallic nitride layer or a metallic carbide layer. Non-limiting examples of materials that can be employed for the metallic nitride layer include TiN, TaN, and WN, and non-limiting examples of materials that can be employed for the metallic carbide layer include TiC, TaC, and WC. The disposable gate material layer 60 can be deposited, for example, by chemical vapor deposition (CVD) and/or physical vapor deposition (PVD). The thickness of the disposable gate material layer 60 is sufficient to completely fill volumes below the top surfaces of the dielectric fin caps 40 and the dielectric pad 40'.

Referring to FIGS. 8A and 8B, the disposable gate material layer 60 is planarized, for example, by chemical mechanical planarization, a recess etch, or a combination thereof. The top surfaces of the dielectric fin caps 40 and the dielectric pad 40' can be employed as the stopping layer for the planarization process. A dielectric cap layer 78L is deposited over the planarized surface of the disposable gate material layer 60. The dielectric cap layer 78L includes a dielectric material such as silicon nitride or silicon oxide. The dielectric cap layer 78L can be deposited, for example, by chemical vapor deposition. The thickness of the dielectric cap layer 78L can be from 10 nm to 100 nm, although lesser and greater thicknesses can also be employed.

Referring to FIGS. 9A and 9B, an etch mask layer 37 is formed and lithographically patterned over the planarized disposable gate material layer 60 to cover areas of channel regions and gate electrodes to be subsequently formed. Thus, the pattern in the etch mask layer 37 includes the pattern for gate lines in the first and second ETSOI device areas (101, 201) and includes the pattern integrally incorporating the areas of finFET channel regions and the neighboring gate electrodes in the first and second finFET areas (102, 202). The etch mask layer 37 is typically a photoresist layer, although a hardmask process in which a dielectric material layer functions as the etch mask layer 37 can also be employed instead in some embodiments.

The pattern in the etch mask layer 37 is transferred to the underlying layers, i.e., the unmasked portions of the dielectric cap layer 78L, the planarized disposable gate material layer 60, and the dielectric fin caps 40 and the dielectric pad 40' in a series of etches that employ the patterned etch mask layer 37 as the etch mask.

First, the exposed portions of the dielectric cap layer 78L are etched through. The remaining masked portions of the dielectric cap layer 78L are herein referred to as dielectric cap portions 78. Next, the exposed portions of the planarized disposable gate material layer 60 are etched anisotropically at a faster etch rate than exposed portions of the dielectric fin caps 40 and the dielectric pad 40'. This anisotropic etch process can be effected by selecting the etch chemistry to more effectively etch the material of the planarized disposable gate material layer 60 than the material of the dielectric fin caps 40 and the dielectric pad 40'. At the end of this anisotropic etch process, the etched surfaces of the disposable gate material layer 60 are recessed relative to the top surfaces of the dielectric fin caps 40 and the dielectric pad 40'.

Figure 10C:
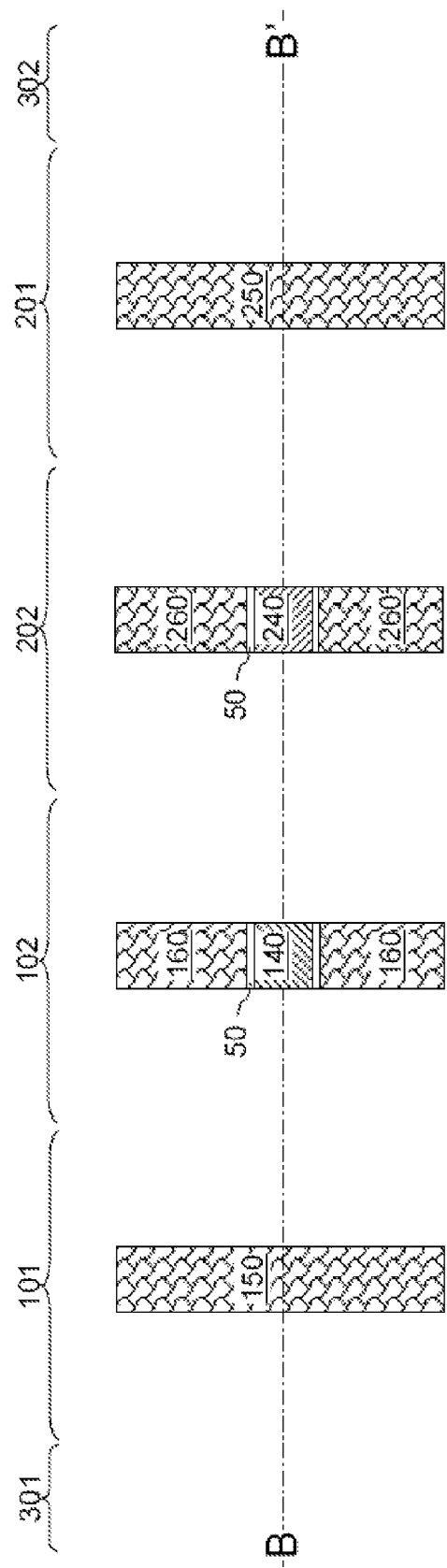

Referring to FIGS. 10A-10C, the disposable gate material layer 60 and the dielectric fin caps 40 and the dielectric pad 40' are non-selectively recessed, for example, employing another anisotropic etch process. The patterned etch mask layer 37 continues to be employed as the etch mask for this anisotropic etch. Exposed portions of the disposable gate material layer 60 and the dielectric fin caps 40 and the dielectric pad 40' are concurrently recessed. Once the exposed portions of the dielectric fin caps 40 and the dielectric pad 40' are etched through, the exposed portions of the disposable gate material layer 60 and the first and second semiconductor fins (140, 240) are concurrent etched. In one embodiment, the disposable gate material layer 60 and the first and second semiconductor fins (140, 240) and the various surface dielectric material layers 50 are non-selectively recessed.

In some instances, the recessed surfaces of the disposable gate material layer 60 are vertically offset, i.e., maintained at a lower level, relative to the recessed surfaces of the first and second semiconductor fins (140, 240).

Before the top surfaces of surface dielectric material layers 50 in the first and second ETSOI device areas (101, 201) and the thin semiconductor device area 301, a different etch process is employed. Specifically, another anisotropic etch that is selective to the material of the various surface dielectric material layers 50 is employed. Thus, material of the exposed portions of the disposable gate material layer 60 located outside the areas of the patterned etch mask layer 37 is completely removed above the buried insulator layer 20. This anisotropic etch may, or may not, be selective to the semiconductor material of the first and second semiconductor fins (140, 240) and the material of the second unthinned semiconductor region 340'. The material of the second unthinned semiconductor region 340' is thinned during the processing step of FIGS. 10A-10C to become a second thinned semiconductor region 340.

The thickness of the thinned portions of the first and second semiconductor fins (140, 240) and the second thinned semiconductor region 340 is herein referred to as a third thickness t3. The third thickness t3 is lesser than the second thickness t2, and can be greater than, the same as, or lesser than the first thickness t1. In general, the third thickness t3 is different from the first thickness t1. The third thickness t3 can be from 5 nm to 100 nm, and typically from 10 nm to 50 nm, although lesser and greater thicknesses can also be employed. The thickness of the first and second planar semiconductor regions (130, 230) is maintained at the first thickness t1 because the last step of the series of etches employed at the step of FIGS. 10A-10C is selective to the surface dielectric material layers 50. The portion of each semiconductor fin (140, 240) that has the second thickness t2 is herein referred to as a center fin portion. The portions of each semiconductor fin (140, 240) that have the third thickness t3 is herein referred to as end fin portions.

By the end of the processing step of FIGS. 10A-10C, end portions of the first and second semiconductor fins (140, 240) are recessed relative to the top surface of the corresponding semiconductor fin (140 or 240). In each of the first and second semiconductor fins (140, 240), two thinned fin portions having the third thickness t3 and laterally spaced by an unthinned fin portion of the semiconductor fin (140 or 240) having the second thickness t2.

The remaining portions of the disposable gate dielectric layer 60 form various disposable gate structures, which are eventually replaced with a metal gate structure in subsequent processing steps. The remaining portions of the disposable gate layers 60 include a first-ETSOI-area first disposable gate structure 150 which is the remaining portion of the disposable gate material layer 60 within the first ETSOI device area 101, a second-ETSOI-area first disposable gate structure 250 which is the remaining portion of the disposable gate material layer 60 within the second ETSOI device area 201, two first-finFET-area second disposable gate structures 160 which are the remaining portions of the disposable gate layer 60 within the first finFET area 102, and two second-finFET-area second disposable gate structures 260 which are the remaining portions of the disposable gate layer 60 within the second finFET area 202. The first-ETSOI-area first disposable gate structure 150 and the second-ETSOI-area first disposable gate structure 250 are herein referred to as first disposable gate structures (150, 250), and the two first-finFET-area second disposable gate structures 160 and the two second-finFET-area second disposable gate structures 260 are herein referred to as second disposable gate structures (160, 260).

Referring to FIGS. 11A-11C, the patterned etch mask layer 37 is removed, for example, by ashing. The exposed portions of the various surface dielectric material layers 50 are removed, for example, by an isotropic etch such as a wet etch.

After this etch, the remaining portions of the various surface dielectric material layers 50 include a surface dielectric material layer 50 present between the first planar semiconductor portion 130 and the first-ETSOI-area first disposable gate structure 150 within the first ETSOI device area 101, and a surface dielectric material layer 50 present between the second planar semiconductor portion 230 and the second-ETSOI-area first disposable gate structure 250 within the second ETSOI device area 201, two surface dielectric material layers 50 present between a center fin portion of the first semiconductor fin 140 and the two first-finFET-area second disposable gate structures 160 within the first finFET area 102, and two surface dielectric material layers 50 present between a center fin portion of the second semiconductor fin 240 and the two second-finFET-area second disposable gate structures 260 within the second finFET area 202. Thus, each of the first disposable gate structures (150, 250) vertically contacts a surface dielectric material layer 50 that contacts a planar semiconductor region (130 or 230), and each of the second disposable gate structures (160, 260) laterally contacts a surface dielectric material layer 50 that contacts a center fin portion of a semiconductor fin (140 or 240).

Referring to FIGS. 12A and 12B, first sidewall spacers 70 are formed by deposition of a conformal dielectric material layer and an anisotropic etch. The first sidewall spacers 70 cover all sidewalls of the first and second disposable gate structures (150, 250, 160, 260) and sidewalls of the center fin portions of the first and second semiconductor fins (140, 240). The thickness of the first sidewall spacers, as measured at the base, can be from 2 nm to 30 nm, although lesser and greater thicknesses can also be employed.

Referring to FIGS. 13A and 13B, a block level mask 57 is applied and patterned to form an opening in the first ETSOI device area 101. Dopants of the first conductivity type are implanted to form a first planar source extension region 134 and a first planar drain extension region 136. Halo implantation may also be performed as known in the art. The portion of the first planar semiconductor region 130 between the first planar source extension region 134 and the first planar drain extension region 136 has a doping of the second conductivity type, and is herein referred to as a first planar channel region 131 that functions as the channel of a planar transistor to be subsequently formed within the first ETSOI device area 101. The block level mask 57 is subsequently removed, for example, by etching.

Referring to FIGS. 14A and 14B, another block level mask 67 is applied and patterned to form an opening in the second ETSOI device area 101. Dopants of the second conductivity type are implanted to form a second planar source extension region 234 and a second planar drain extension region 236. Halo implantation may also be performed as known in the art. The portion of the second planar semiconductor region 230 between the second planar source extension region 234 and the second planar drain extension region 236 has a doping of the first conductivity type, and is herein referred to as a second planar channel region 231 that functions as the channel of a planar transistor to be subsequently formed within the second ETSOI device area 201. The block level mask 67 is subsequently removed, for example, by etching.

Referring to FIGS. 15A and 15B, a first dielectric masking layer 80L is deposited, for example, by a conformal deposition method. The first dielectric masking layer 80L includes a dielectric material such as silicon oxide and/or silicon nitride. A block level mask 59 is applied and lithographically patterned to form an opening in the first ETSOI device area 101 and the first finFET area 102. Exposed horizontal portion of the first dielectric masking layer 80L is etched and the remaining vertical portions of the first dielectric masking layer 80L form second sidewall spacers 80. The block level mask 59 is subsequently removed, for example, by ashing.

Referring to FIGS. 16A and 16B, another block level mask 69 is applied and lithographically patterned to form an opening in the first finFET area 102. The first and second sidewall spacers (70, 80) within the first finFET area 102 are removed, for example, by an isotropic etch such as a wet etch, so that sidewalls of the first semiconductor fin 140 underlying the periphery of the dielectric cap portion 78 and the dielectric fin cap 40 within the first finFET area 102 are exposed.

Dopants of the first conductivity type are implanted by angled ion implantation to form a first fin source extension region 144 and a first fin drain extension region 146. The region of the first semiconductor fin 140 located between the first fin source extension region 144 and the first fin drain extension region 146 has a doping of the second conductivity type, and is herein referred to as a first fin channel region 141, which functions as the channel of the finFET to be formed in the first finFET region 102. The first fin source extension region 144 extends through one of the two end fin portions and one end region of the center fin portion within the first semiconductor fin (141, 144, 146). The first fin drain extension region 146 extends through the other of the two end fin portions and the other end region of the center fin portion within the first semiconductor fin (141, 144, 146). The block level mask 69 is subsequently removed, for example, by ashing.

Referring to FIGS. 17A and 17B, selective epitaxy is performed on exposed semiconductor surfaces to form a first raised source region 132, a first raised drain region 138, a first fin source region 142, and a first fin drain region 148. Selective epitaxy deposits a semiconductor material on semiconductor surfaces, but does not deposit a semiconductor material on dielectric surfaces, metal nitride surfaces, or metal carbide surfaces. In other words, epitaxial growth proceeds only from exposed semiconductor surfaces. Thus, additional semiconductor material portions are deposited on exposed semiconductor surfaces of the planar semiconductor regions (131, 134, 136) having the first thickness t1, sidewalls of the unthinned fin portions (the center fin portions) having the second thickness t2, and the thinned fin portions having the third thickness t3. Specifically, the first raised source region 132 grows directly on the first planar source extension region 134, the first raised drain region 138 grows directly on the first planar drain extension region 136, the first fin source region 142 grows directly on the first fin source extension region 144, and the first fin drain region 148 grows directly on the first fin drain extension region 146. The first raised source region 132, the first raised drain region 138, the first fin source region 142, and the first fin drain region 148 are grown simultaneously.

The first raised source region 132 and the first raised drain region 138 are epitaxially aligned to end portions of the first planar semiconductor region (131, 134, 136), and the first fin source region 142 and the first fin drain region 148 are epitaxially aligned to the unthinned fin portion and the two thinned fin portions of the first semiconductor fin (141, 144, 146). The first fin source region 142 and the first fin drain region 148 have a second width w2 that is greater than the width of the unthinned fin portion, i.e., the first width w1 (See FIG. 2A). The first raised source region 132, the first raised drain region 138, the first fin source region 142, and the first fin drain region 148 can be in-situ doped with dopants of the first conductivity type, i.e., the same conductivity type as the doping of the first planar source extension region 134, the first planar drain extension region 136, the first fin source extension region 144, and the first fin drain extension region 146.

In one embodiment, the first raised source region 132, the first raised drain region 138, the first fin source region 142, and the first fin drain region 148 can include the same semiconductor material as the semiconductor material of the first planar semiconductor region (131, 134, 136) and the first semiconductor fin (141, 144, 146). For example, if the first planar semiconductor region (131, 134, 136) and the first semiconductor fin (141, 144, 146) include single crystalline silicon, the first raised source region 132, the first raised drain region 138, the first fin source region 142, and the first fin drain region 148 can include single crystalline silicon.

In another embodiment, the first raised source region 132, the first raised drain region 138, the first fin source region 142, and the first fin drain region 148 can include a different semiconductor material than the semiconductor material of the first planar semiconductor region (131, 134, 136) and the first semiconductor fin (141, 144, 146). For example, if the first planar semiconductor region (131, 134, 136) and the first semiconductor fin (141, 144, 146) include single crystalline silicon, the first raised source region 132, the first raised drain region 138, the first fin source region 142, and the first fin drain region 148 can include single crystalline silicon carbon alloy or a single crystalline silicon germanium alloy. In other words, an elemental semiconductor may be present in the epitaxially grown semiconductor material and is not present in the semiconductor material of the first planar semiconductor region (131, 134, 136) and the first semiconductor fin (141, 144, 146), or vice versa. In a non-limiting illustrative example, if the first conductivity type is n-type, each of the first planar semiconductor region (131, 134, 136) and the first semiconductor fin (141, 144, 146) include single crystalline silicon, the first raised source region 132, the first raised drain region 138, the first fin source region 142 and the first fin drain region 148 can include a single crystalline n-doped silicon carbon alloy.

The first raised source region 132, the first raised drain region 138, the first fin source region 142, and the first fin drain region 148 are grown to a height that is greater than the target height for these regions (132, 138, 142, 148) after planarization processes to be subsequently performed. Preferably, the first raised source region 132, the first raised drain region 138, the first fin source region 142, and the first fin drain region 148 are grown at least up to the height of the top surface of the center fin portion of the first planar semiconductor region (131, 134, 136), i.e., the height corresponding to the interface between the first planar semiconductor region (131, 134, 136) and the dielectric fin cap 40 in the first finFET region 102.

Referring to FIGS. 18A and 18B, a second dielectric masking layer 90L is deposited, for example, by a conformal deposition method. The second dielectric masking layer 90L includes a dielectric material such as silicon oxide and/or silicon nitride. A block level mask 77 is applied and lithographically patterned to form an opening in the second ETSOI device area 201 and the second finFET area 202. Horizontal portions of the second dielectric masking layer 90L and horizontal portions of the first dielectric masking layer 80L (See FIG. 17B) within the second ETSOI device area 201 and the second finFET area 202 are etched and the remaining vertical portions of the second dielectric masking layer 90L and the first dielectric masking layer 80L form third sidewall spacers 90 and second sidewall spacers 80, respectively. The block level mask 77 is subsequently removed, for example, by ashing.

Referring to FIGS. 19A and 19B, another block level mask 87 is applied and lithographically patterned to form an opening in the second finFET area 202. The first, second, and third sidewall spacers (70, 80, 90) within the second finFET area 202 are removed, for example, by an isotropic etch such as a wet etch, so that sidewalls of the second semiconductor fin 240 underlying the periphery of the dielectric cap portion 78 and the dielectric fin cap 40 within the second finFET area 202 are exposed.

Dopants of the second conductivity type are implanted by angled ion implantation to form a second fin source extension region 244 and a second fin drain extension region 246. The region of the second semiconductor fin 240 located between the second fin source extension region 244 and the second fin drain extension region 246 has a doping of the first conductivity type, and is herein referred to as a second fin channel region 241, which functions as the channel of the finFET to be formed in the second finFET region 202. The second fin source extension region 244 extends through one of the two end fin portions and one end region of the center fin portion within the second semiconductor fin (241, 244, 246). The second fin drain extension region 246 extends through the other of the two end fin portions and the other end region of the center fin portion within the second semiconductor fin (241, 244, 246). The block level mask 87 is subsequently removed, for example, by ashing.

Referring to FIGS. 20A and 20B, a second selective epitaxy is performed on exposed semiconductor surfaces to form a second raised source region 232, a second raised drain region 238, a first fin drain region 242, and a second fin drain region 248. Selective epitaxy deposits a semiconductor material on semiconductor surfaces, but does not deposit a semiconductor material on dielectric surfaces, metal nitride surfaces, or metal carbide surfaces. In other words, epitaxial growth proceeds only from exposed semiconductor surfaces. Thus, additional semiconductor material portions are deposited on exposed semiconductor surfaces of the planar semiconductor regions (231, 234, 236) having the first thickness t1, sidewalls of the unthinned fin portions (the center fin portions) having the second thickness t2, and the thinned fin portions having the third thickness t3. Specifically, the second raised source region 232 grows directly on the second planar source extension region 234, the second raised drain region 238 grows directly on the second planar drain extension region 236, the first fin drain region 242 grows directly on the second fin source extension region 244, and the second fin drain region 248 grows directly on the second fin drain extension region 246. The second raised source region 232, the second raised drain region 238, the first fin drain region 242, and the second fin drain region 248 are grown simultaneously.

The second raised source region 232 and the second raised drain region 238 are epitaxially aligned to end portions of the second planar semiconductor region (231, 234, 236), and the second fin source region 242 and the second fin drain region 248 are epitaxially aligned to the unthinned fin portion and the two thinned fin portions of the second semiconductor fin (241, 244, 246). The second fin source region 242 and the second fin drain region 248 have a second width w2 that is greater than the width of the unthinned fin portion, i.e., the first width w1 (See FIG. 2A). The second raised source region 232, the second raised drain region 238, the first fin drain region 242, and the second fin drain region 248 can be in-situ doped with dopants of the second conductivity type, i.e., the same conductivity type as the doping of the second planar source extension region 234, the second planar drain extension region 236, the second fin source extension region 244, and the second fin drain extension region 246.

In one embodiment, the second raised source region 232, the second raised drain region 238, the first fin drain region 242, and the second fin drain region 248 can include the same semiconductor material as the semiconductor material of the second planar semiconductor region (231, 234, 236) and the second semiconductor fin (241, 244, 246). For example, if the second planar semiconductor region (231, 234, 236) and the second semiconductor fin (241, 244, 246) include single crystalline silicon, the second raised source region 232, the second raised drain region 238, the first fin drain region 242, and the second fin drain region 248 can include single crystalline silicon.

In another embodiment, the second raised source region 232, the second raised drain region 238, the first fin drain region 242, and the second fin drain region 248 can include a different semiconductor material than the semiconductor material of the second planar semiconductor region (231, 234, 236) and the second semiconductor fin (241, 244, 246). For example, if the second planar semiconductor region (231, 234, 236) and the second semiconductor fin (241, 244, 246) include single crystalline silicon, the second raised source region 232, the second raised drain region 238, the first fin drain region 242, and the second fin drain region 248 can include single crystalline silicon carbon alloy or a single crystalline silicon germanium alloy. In other words, an elemental semiconductor may be present in the epitaxially grown semiconductor material and is not present in the semiconductor material of the second planar semiconductor region (231, 234, 236) and the second semiconductor fin (241, 244, 246), or vice versa. In a no-limiting illustrative example, if the second conductivity type is p-type, each of the second planar semiconductor region (231, 234, 236) and the second semiconductor fin (241, 244, 246) include single crystalline silicon, the second raised source region 232, the second raised drain region 238, the first fin drain region 242 can include a single crystalline p-doped silicon germanium alloy.

The second raised source region 232, the second raised drain region 238, the second fin drain region 242, and the second fin drain region 248 are grown to a height that is greater than the target height for these regions (232, 238, 242, 248) after planarization processes to be subsequently performed. Preferably, the second raised source region 232, the second raised drain region 238, the second fin drain region 242, and the second fin drain region 248 are grown at least up to the height of the top surface of the center fin portion of the second planar semiconductor region (231, 234, 236), i.e., the height corresponding to the interface between the second planar semiconductor region (231, 234, 236) and the dielectric fin cap 40 in the second finFET region 202.

In the thick semiconductor device area 302, epitaxial growth proceeds on the second thinned semiconductor region 340 to form an epitaxially grown semiconductor material region 342 directly on the second thinned semiconductor region 340.

Various devices can be formed in the thin semiconductor device area 301 and the thick semiconductor device area 302 as known in the art. The devices formed in the thin semiconductor device area 301 have a thickness that is the same as the thickness of the first thinned semiconductor region 330, and the devices formed in the thick semiconductor device area 302 have a thickness that is the same as the thickness of the stack of the second thinned semiconductor region 340 and the epitaxially grown semiconductor material region 342. Such devices include, but are not limited to, resistors, diodes, electrically programmable fuses, electrically programmable antifuses, capacitors, varactors, additional finFETs having different body thicknesses (to provide finFETs having different threshold voltages), and any other semiconductor device as known in the art.

Referring to FIGS. 21A and 21B, the second dielectric masking layer 90L is removed, for example, by an isotropic etch such as a wet etch. Optionally, stress-generating dielectric material layers such as compressive or tensile nitride layers can be formed to provide stress to underlying devices. For example, a first type stress-generating layer 188 can be formed in the first ETSOI device region 101 and the first finFET region 102, and a second type stress-generating layer 288 can be formed in the second ETSOI device region 201 and the second finFET region 202. In an illustrative example, if the first conductivity type is n-type and the second conductivity type is p-type, the first type stress-generating layer 188 can be a tensile-stress-generating nitride layer that applies a tensile stress to underlying n-type transistors, and the second type stress-generating layer 288 can be a compressive-stress-generating nitride layer that applies a compressive stress to underlying p-type transistors.

Referring to FIGS. 22A and 22B, a gate-level dielectric material layer 96 is deposited, for example, by employing deposition methods for dielectric materials known in the art. The gate-level dielectric material layer 96 can be a silicon oxide layer or an organosilicate glass (OSG) layer.

Referring to FIGS. 23A and 23B, the gate-level dielectric material layer 96, upper portions of the first and second semiconductor fins (131, 134, 136, 231, 234, 236), and the selectively grown semiconductor material portions (132, 138, 142, 148, 232, 238, 242, 248) are planarized, for example, by chemical mechanical planarization. After the planarization, the top surfaces of the fin source regions (142, 242), the fin drain regions (148, 248), the raised source regions (132, 232), and the raised drain regions (138, 238) become coplanar with one another and the top surface of the first and second disposable gate structures (150, 250, 160, 260).

Referring to FIGS. 24A and 24B, each disposable gate structure (150, 250, 160, 260) is replaced with a U-shaped gate dielectric and a gate electrode including a metallic material. Specifically, the disposable gate structures (150, 250, 160, 260) are removed selective to the first and second semiconductor fins (131, 134, 136, 231, 234, 236) and the selectively grown semiconductor material portions (132, 138, 142, 148, 232, 238, 242, 248). Removal of the disposable gate structures (150, 250, 160, 260) can also be selective to the various dielectric material layers and spacers (96, 70, 80, 90, 188, 288). Then the surface dielectric material layers 50 are removed.

A dielectric metal oxide layer having a dielectric constant greater than 8.0 is deposited followed by deposition of a metallic material to be used as gate electrode materials. The excess portions of the metallic material and the dielectric metal oxide layer above the top surfaces of the first and second semiconductor fins (131, 134, 136, 231, 234, 236) and the selectively grown semiconductor material portions (132, 138, 142, 148, 232, 238, 242, 248) are removed, for example, by chemical mechanical planarization.

The remaining portions of the dielectric metal oxide layer in the ETSOI device regions (101, 201) form first U-shaped gate dielectrics (152, 252), and the remaining portions of the dielectric metal oxide layer in the finFET areas (102, 202) form second U-shaped gate dielectrics (162, 262). The first U-shaped gate dielectrics (152, 252) vertically contact an upper surface of a planar channel region (131 or 231) in a planar semiconductor region. The second U-shaped gate dielectrics (162, 262) laterally contact a fin channel region (141, 241) and an edge portion of a fin source extension region (134, 234) and an edge portion of a fin drain extension region (136, 236).

The remaining portions of the metallic material in the ETSOI device regions (101, 201) form first gate electrodes (153, 253), and the remaining portions of the metallic material in the finFET areas (102, 202) form second gate electrodes (163, 263). The first gate electrodes (153, 253) are embedded in one of the first U-shaped gate dielectrics (152 or 252). The second gate electrodes (163, 263) are embedded in one of the second U-shaped gate dielectrics (162, 262).

Thus, a planar field effect transistor is formed in each of the first and second ETSOI device areas (101, 201), and a finFET is formed in each of the first and second finFET areas (102, 202). After the planarization, the thickness of the first and second semiconductor fins (131, 134, 136, 231, 234, 236) and the selectively grown semiconductor material portions (132, 138, 142, 148, 232, 238, 242, 248, 342) is decreased to a modified second thickness t2', which can be lesser than the second thickness t2. (See FIGS. 20A and 20B).

In the thick semiconductor device area 302, the total thickness of the stack of the second thinned semiconductor region 340 and the epitaxially grown semiconductor material region 342 is also equal to the modified second thickness t2'. Thus, the thickness of the stack of the second thinned semiconductor region 340 and the epitaxially grown semiconductor material region 342 is the same as the modified thickness of the fin center portions including the first fin channel region 141 and the second fin channel region 241, which is herein referred to as modified center portion thickness of the semiconductor fins.

Referring to FIGS. 25A and 25B, a metallization mask layer 410 is formed over the planarized surfaces of the various dielectric material layers (96, 188, 288), the first and second semiconductor fins (131, 134, 136, 231, 234, 236), and the selectively grown semiconductor material portions (132, 138, 142, 148, 232, 238, 242, 248, 342). The metallization mask layer 410 includes a dielectric material such as silicon oxide, silicon nitride, or a combination thereof, and can be deposited, for example, by chemical vapor deposition (CVD). The thickness of the metallization mask layer 410 can be from 10 nm to 100 nm, although lesser and greater thicknesses can also be employed. The metallization mask layer 410 is deposited as a blanket planar layer having the same thickness throughout, and is subsequently patterned, for example, by application of a photoresist (not shown), lithographic patterning of the photoresist, and the transfer of the pattern in the photoresist into the metallization mask layer 410 by an anisotropic etch. The photoresist is subsequently removed.

Figure 26A:
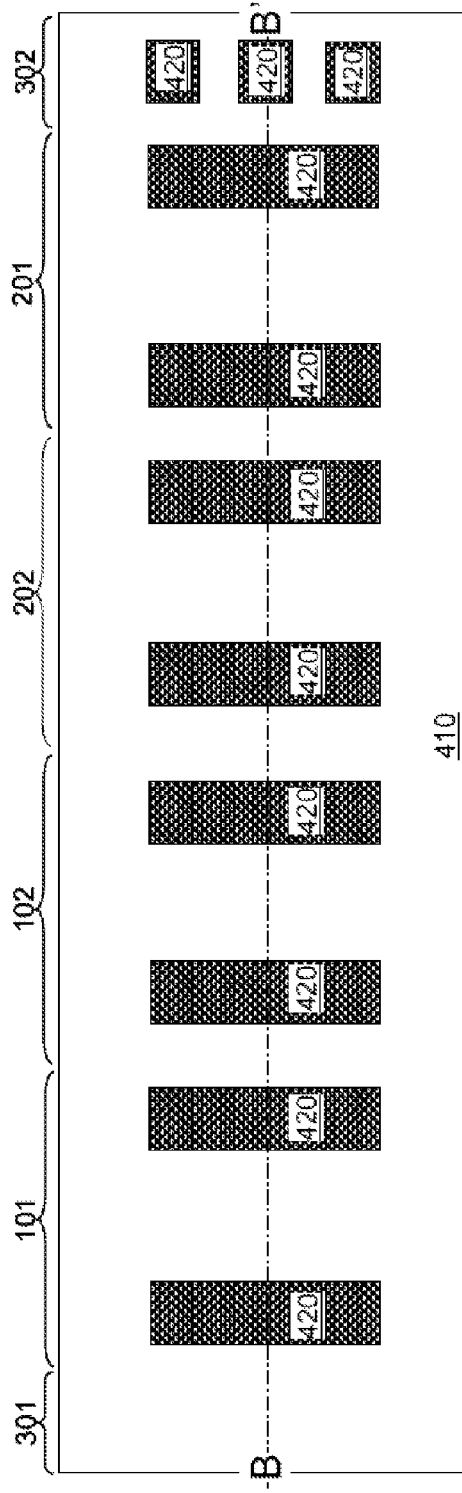
FIGS. 26A and 26B illustrate the first exemplary semiconductor structure after formation of various metal-semiconductor-alloy portions according to the first embodiment of the present disclosure.
Figure 26B:
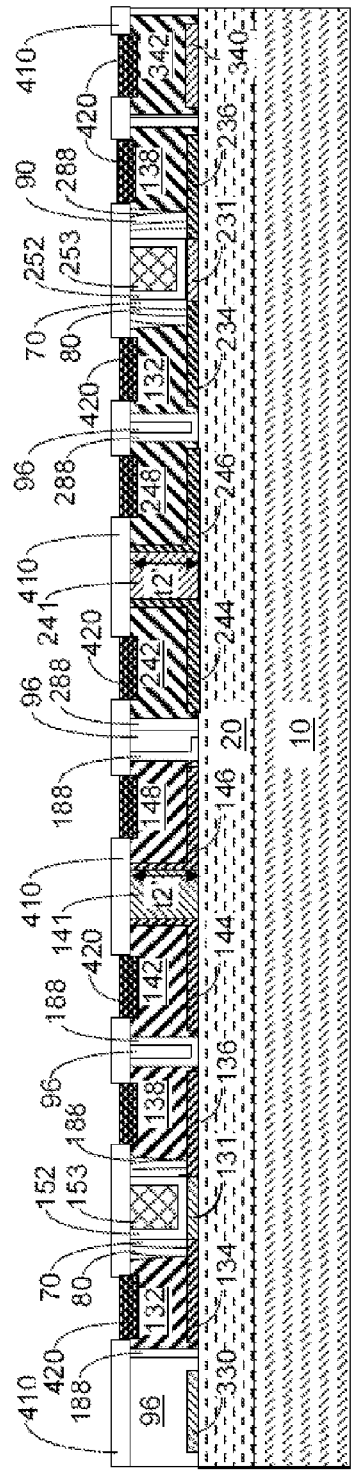

Referring to FIGS. 26A and 26B, various metal-semiconductor-alloy portions 420 are formed, for example, by deposition of a metal layer, an anneal at an elevated temperature at which the metal layer and exposed upper portions of the selectively grown semiconductor material portions (132, 138, 142, 148, 232, 238, 242, 248, 342) interact to form metal-semiconductor-alloys, and subsequent removal of unreacted portions of the metal layer. If the selectively grown semiconductor material portions (132, 138, 142, 148, 232, 238, 242, 248, 342) includes silicon and/or germanium, the various metal-semiconductor-alloy portions 420 can include a metal silicide and/or a metal germanide. Processes for interacting a metal with a semiconductor material to form a metal-semiconductor-alloy are known in the art.

Figure 27A:
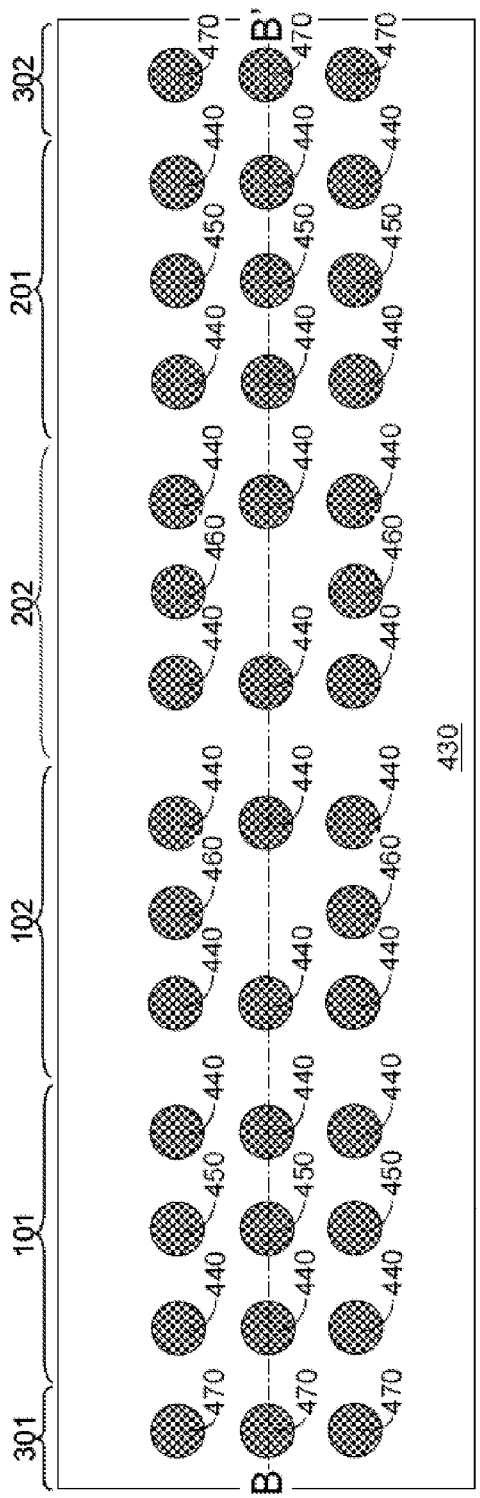
FIGS. 27A and 27B illustrate the first exemplary semiconductor structure after formation of various contact via structures according to the first embodiment of the present disclosure.
Figure 27B:
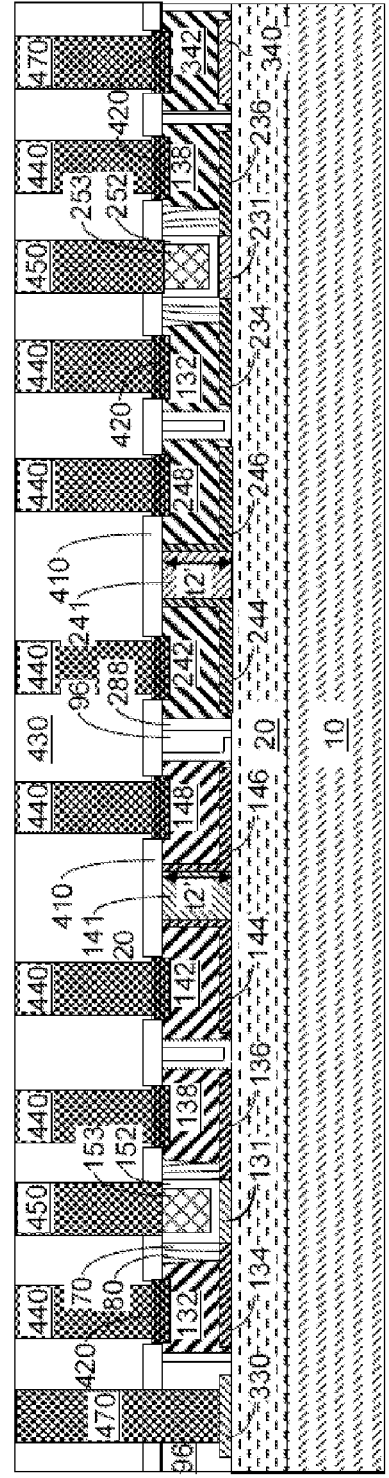

Referring to FIGS. 27A and 27B, a contact-level dielectric material layer 430 is deposited over the various metal-semiconductor-alloy portions 420. The contact-level dielectric material layer 430 can include silicon oxide, an organosilicate glass, silicon nitride, and/or any other dielectric material that can be employed for metal interconnect structures. The contact-level dielectric material layer 430 can be formed, for example, by chemical vapor deposition and/or spin coating. The thickness of the contract-level dielectric material layer 430 can be from 50 nm to 1,000 nm, although lesser and greater thicknesses can also be employed.

Contact via holes are formed, for example, by a combination of lithographic methods and an anisotropic etch to expose top surfaces of the metal-semiconductor-alloy portions 420, the second gate electrodes (163, 263), and other components of semiconductor devices in the thin semiconductor device area 301 and the thick semiconductor device area 302. Various contact via structures are formed by filling the via holes with a conductive material, such as a metallic material or a doped semiconductor material, and removing the excess conductive material above the top surface of the contract-level dielectric material layer 430, for example, by planarization. The various contact via structures can include, for example, various source or drain contact structures 440, planar FET gate contact structures 450, finFET gate contact structures 460, and other device contact structures 470.

Figure 28A:
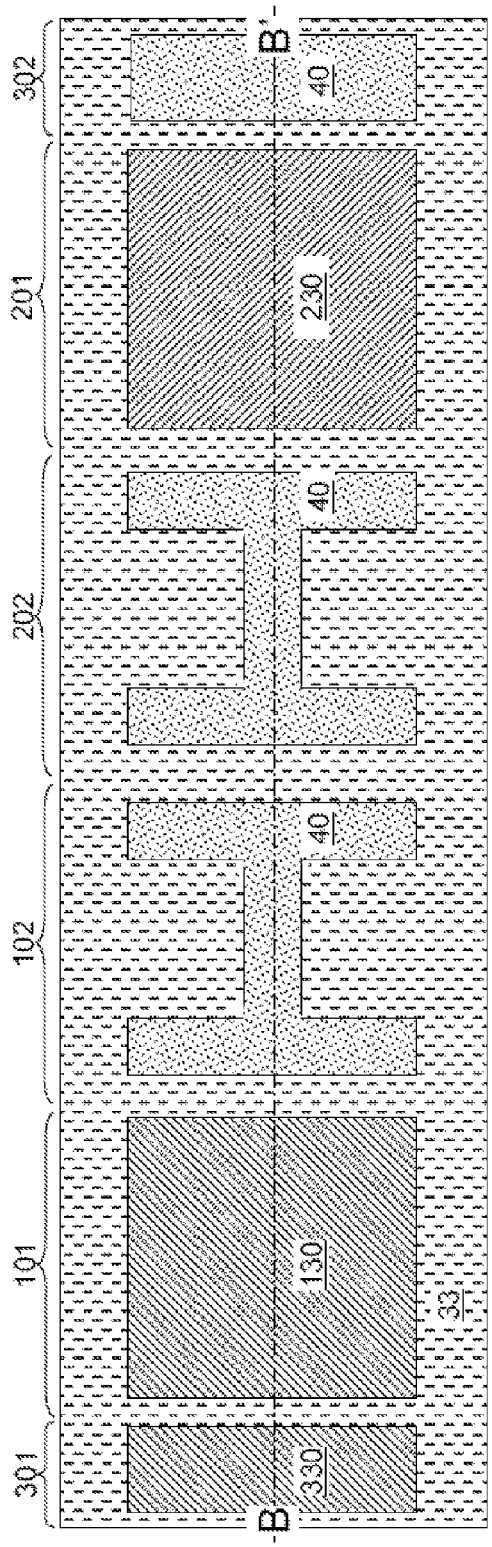
FIGS. 28A and 28B illustrate a second exemplary semiconductor structure that is derived from the structure of FIGS. 3A and 3B by removing exposed semiconductor material portions by an etch according to a second embodiment of the present disclosure.
Figure 28B:
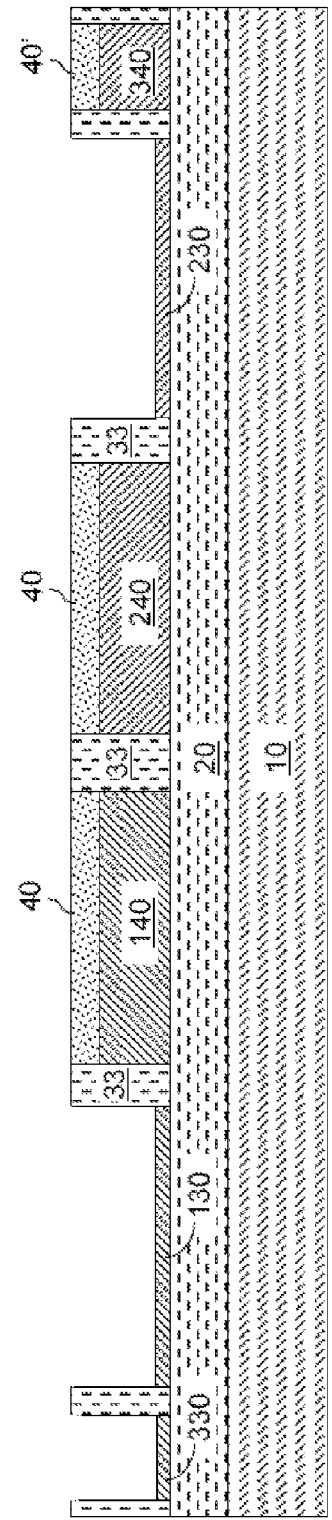

Referring to FIGS. 28A and 28B, a second exemplary semiconductor structure according to a second embodiment of the present disclosure can be derived from the structure of FIGS. 3A and 3B. Specifically, the second exemplary semiconductor structure is derived from the structure of FIGS. 3A and 3B by removing exposed semiconductor material portions by an etch instead of conversion of the semiconductor material in thin device areas (101, 201, 301) into dielectric material portions. The etch can be an isotropic etch or an anisotropic etch, and is selective to the dielectric fin caps 40 and the dielectric pad 40'. A first planar semiconductor region 130, a second planar semiconductor region 230, and a first thinned semiconductor region 330 have a first thickness t1 that is less than the second thickness t2, which is the thickness of the semiconductor material in the thick device areas (102, 202, 302).

Figure 29A:
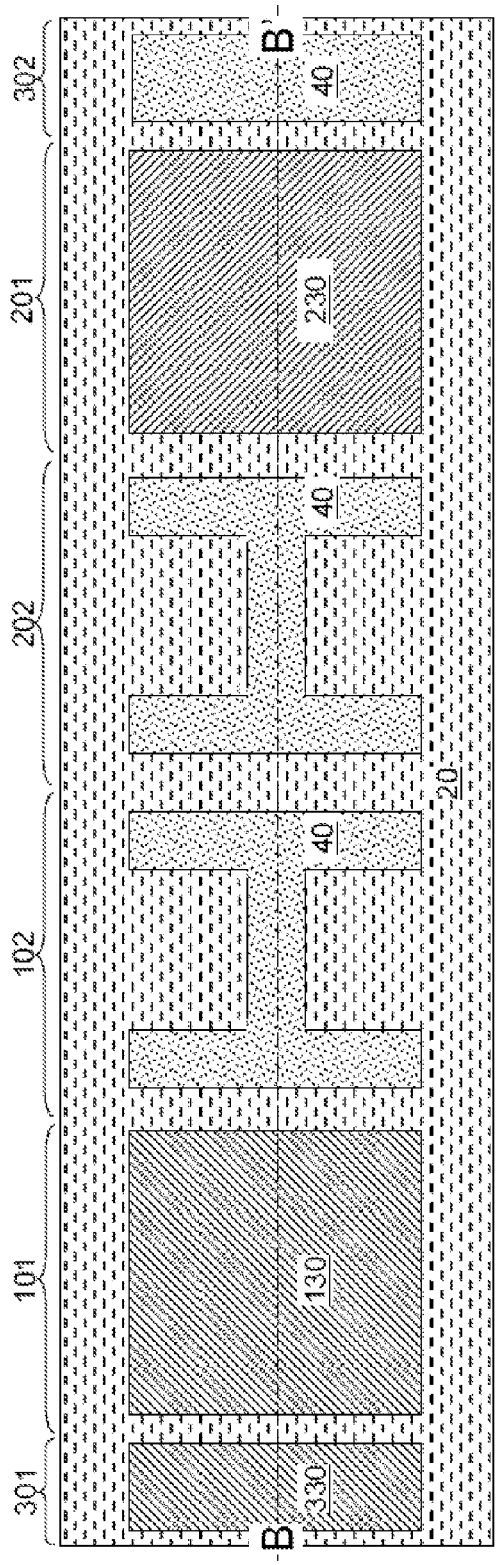
FIGS. 29A and 29B illustrate the second exemplary semiconductor structure after removal of the disposable filler material layer according to the second embodiment of the present disclosure.
Figure 29B:
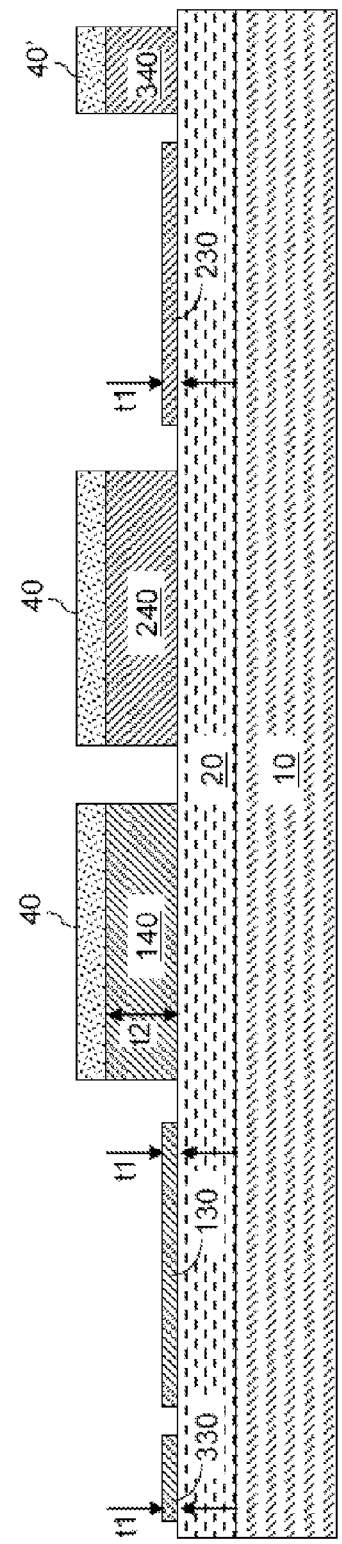

Referring to FIGS. 29A and 29B, the disposable filler material layer 33 is removed selective to the dielectric fin caps 40 and the dielectric pad 40' to provide the same structure as the first exemplary semiconductor structure of FIGS. 5A and 5B.

Referring to FIGS. 30A and 30B, a third exemplary semiconductor structure according to a third embodiment of the present disclosure is derived from the structure of FIGS. 3A and 3B by structurally damaging exposed portions of the semiconductor material in thin device areas (101, 201, 301) by ion implantation, for example, of germanium. Various damaged semiconductor material portions (129, 229, 329) having structural damages are formed in the upper regions of the semiconductor material in the thin device areas (101, 201, 301). A first planar semiconductor region 130, a second planar semiconductor region 230, and a first thinned semiconductor region 330 are undamaged remaining portions of the semiconductor material in the thin device areas (101, 201, 301).

Referring to FIGS. 31A and 31B, the damaged semiconductor material portions (129, 29, 329) are removed selective to the undamaged remaining portions (130, 230, 330) of the semiconductor material in the thin device areas (101, 201, 301). The first planar semiconductor region 130, the second planar semiconductor region 230, and the first thinned semiconductor region 330 have a first thickness t1 that is less than the second thickness t2, which is the thickness of the semiconductor material in the thick device areas (102, 202, 302).

Figure 32A:
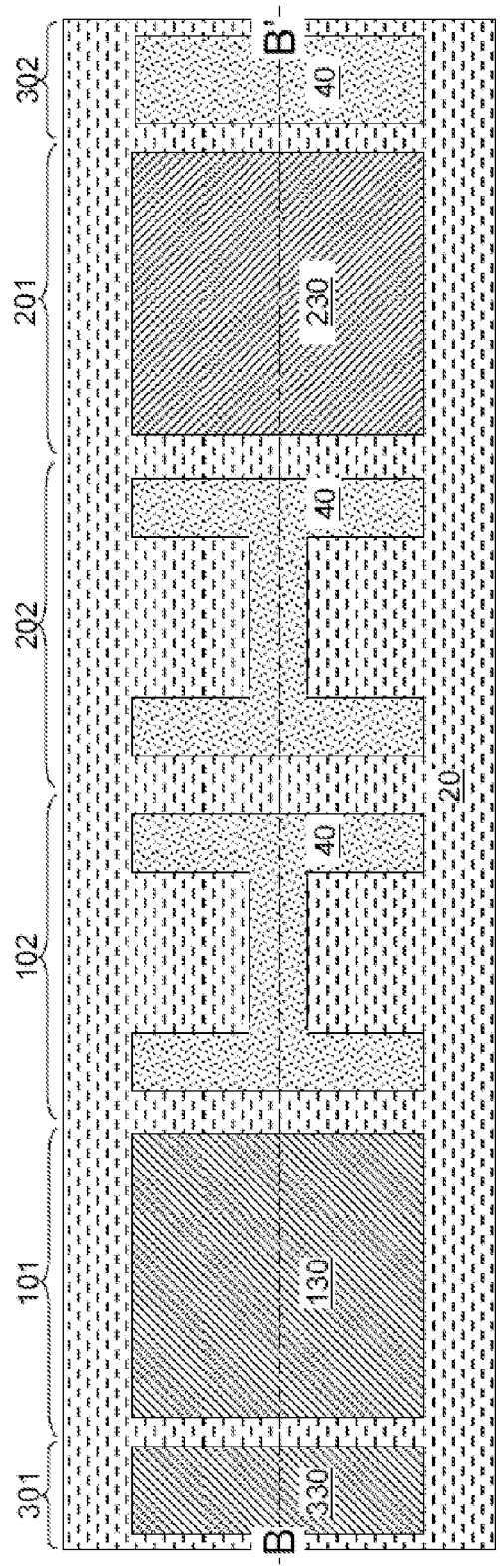
FIGS. 32A and 32B illustrate the third exemplary semiconductor structure after removal of the disposable filler material layer according to the third embodiment of the present disclosure.
Figure 32B:
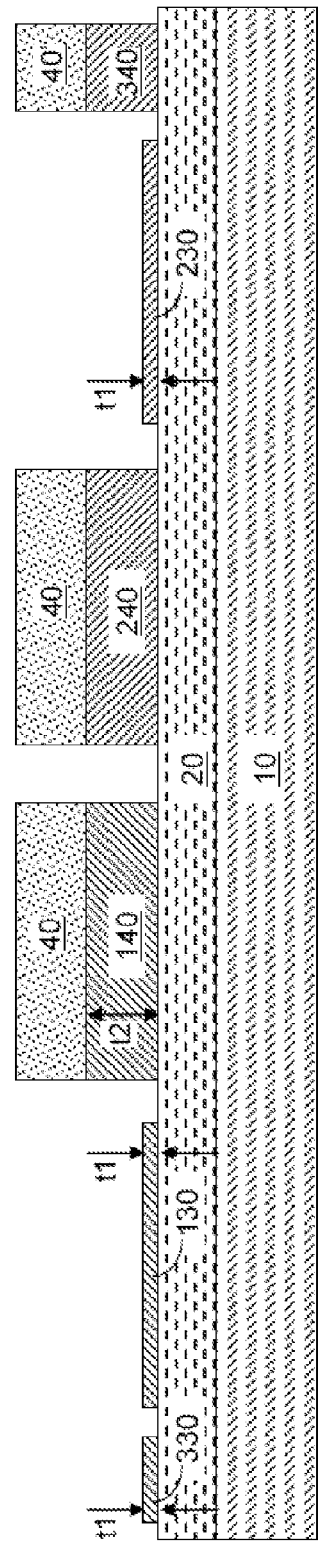

Referring to FIGS. 32A and 32B, the disposable filler material layer 33 is removed selective to the dielectric fin caps 40 and the dielectric pad 40' to provide the same structure as the first exemplary semiconductor structure of FIGS. 5A and 5B.

Figure 33A:
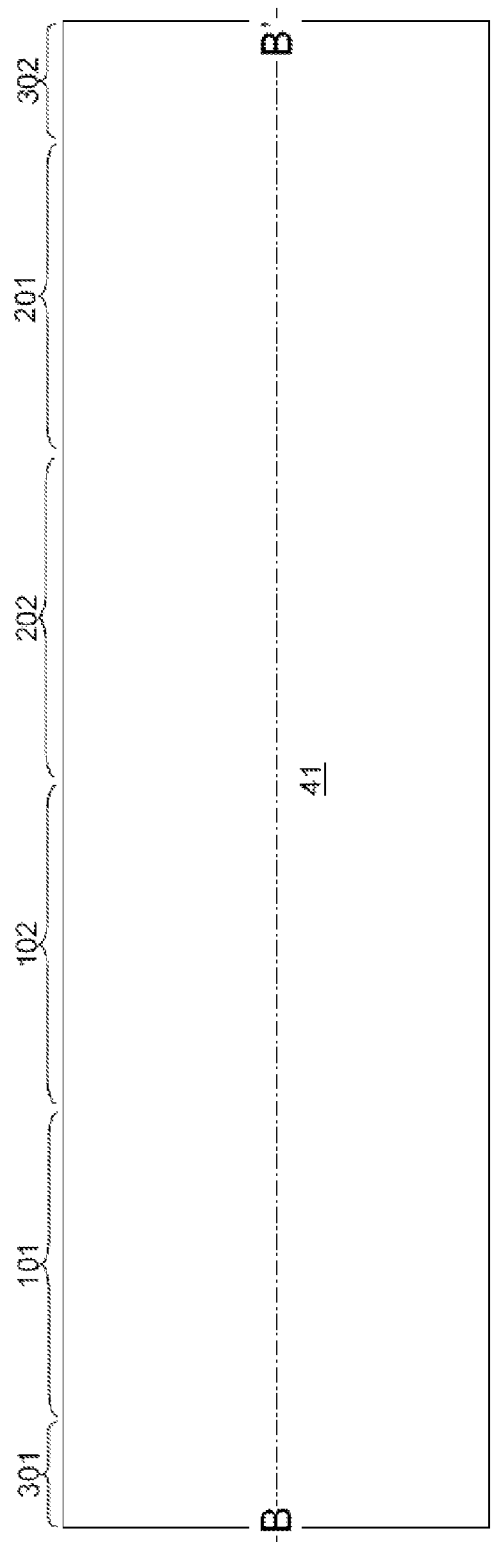
FIGS. 33A and 33B illustrate a fourth exemplary semiconductor structure after formation of a pad dielectric material layer on a semiconductor-on-insulator substrate according to the fourth embodiment of the present disclosure.
Figure 33B:
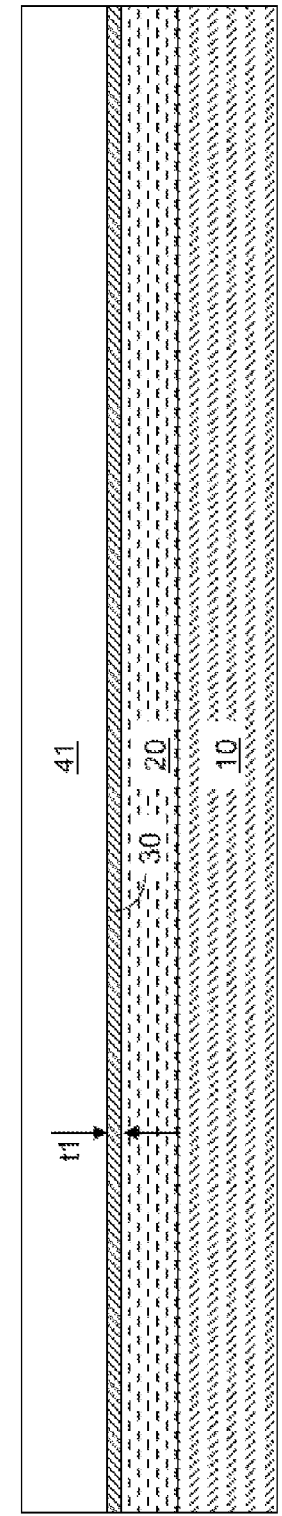

Referring to FIGS. 33A and 33B, a fourth exemplary semiconductor according to a fourth embodiment of the present disclosure is shown. A pad dielectric material layer 41 is formed on a semiconductor-on-insulator substrate in which the top semiconductor layer 30 has a thickness that is the same as a first thickness t1. The pad dielectric material layer 41 includes a material that is different in composition than the pad layer 40 in the first embodiment. For example, the pad dielectric material layer 30 can be a silicon oxide layer.

Referring to FIGS. 34A and 34B, the pad dielectric material layer 40 and the top semiconductor layer 30 are lithographically patterned to form trenches therein, and a disposable filler material layer 33 is deposited and planarized to fill the trenches. The top semiconductor layer 30 is divided into various semiconductor material portions including a first planar semiconductor region 130 in the first ETSOI device area 101, a second planar semiconductor region 230 in the second ETSOI device area, and a first thin semiconductor region 330 in the thin semiconductor device area 301, a first fin seed layer 139 in the first finFET area 102, a second fin seed layer 239 in the second finFET area 202, and a thin semiconductor seed layer 339 in the thick semiconductor device area 302.

Figure 35A:
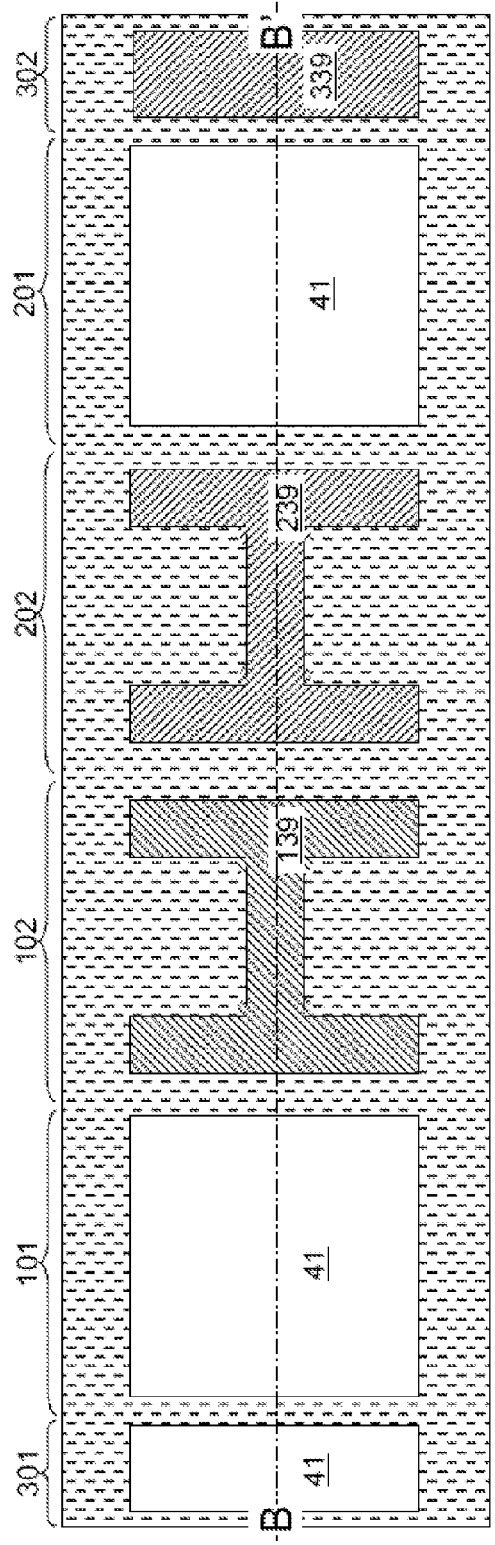
FIGS. 35A and 35B illustrate the fourth exemplary semiconductor structure after removal of pad dielectric material portions from thick device regions according to the fourth embodiment of the present disclosure.
Figure 35B:
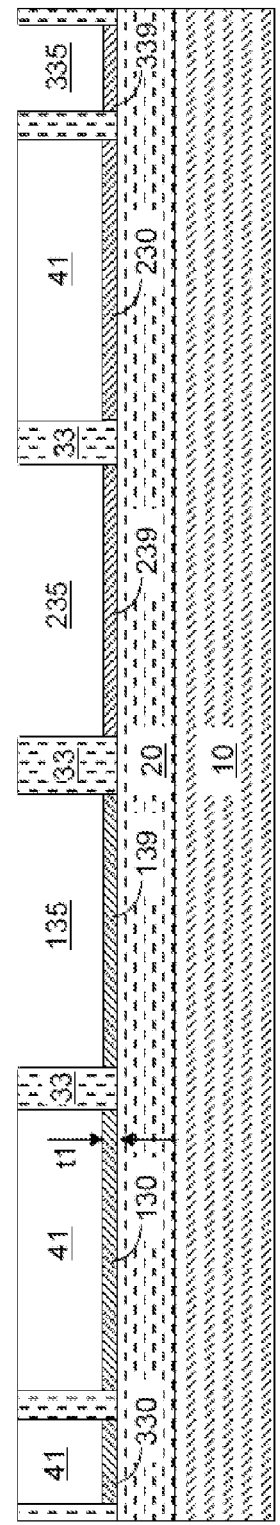

Referring to FIGS. 35A and 35B, the pad dielectric material layer 41 is removed in the thick device areas (102, 202, 302) selective to the semiconductor material portions underneath (139, 239, 339), for example, by employing a patterned photoresist (not shown) as an etch mask. Trenches 135 are formed in the thick device areas (102, 202, 302).

Figure 36A:
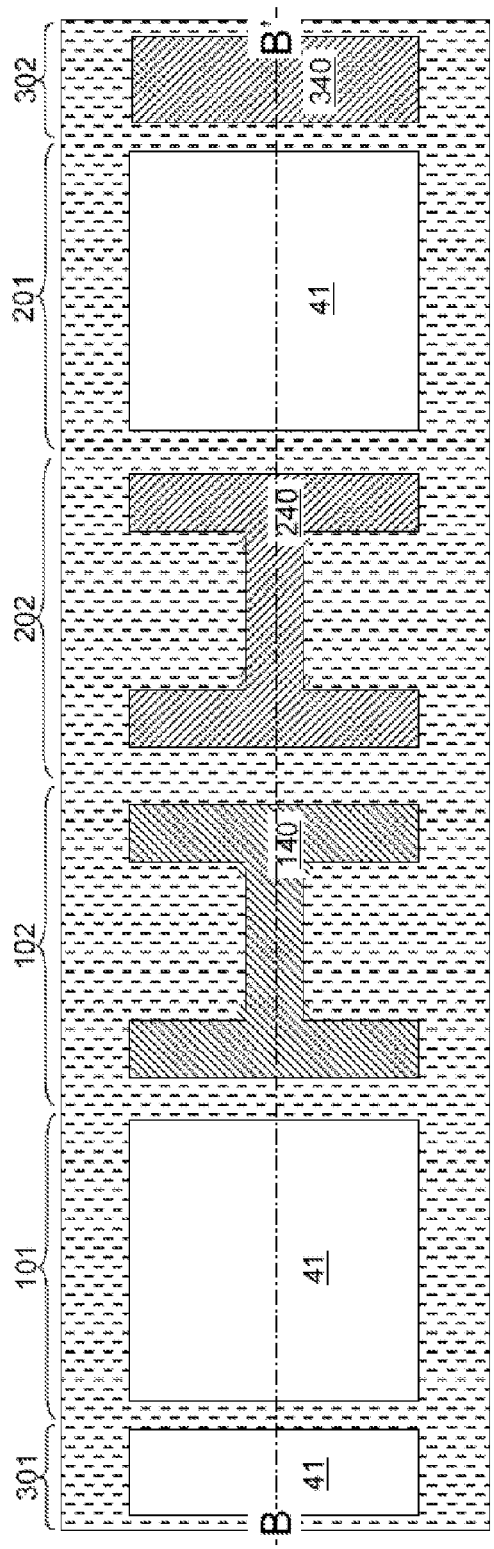
FIGS. 36A and 36B illustrate the fourth exemplary semiconductor structure after selective epitaxy in thick device regions according to the fourth embodiment of the present disclosure.
Figure 36B:
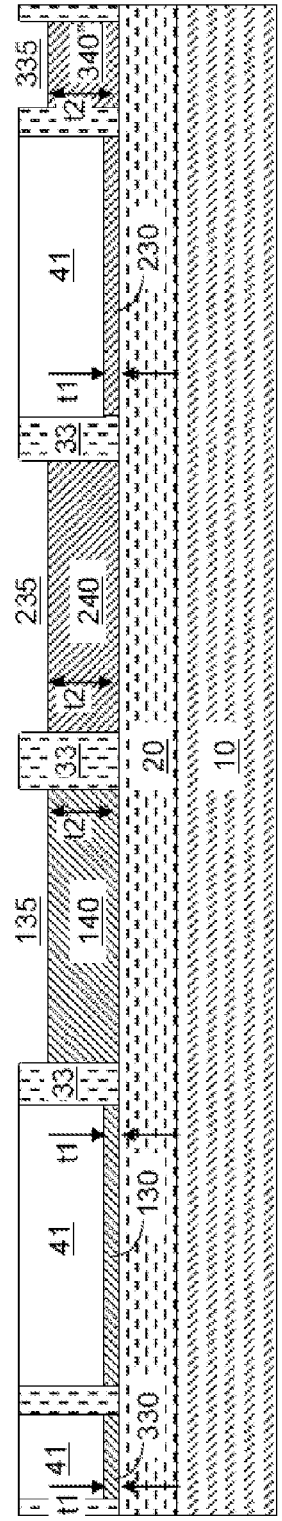

Referring to FIGS. 36A and 36B, selective epitaxy is performed to deposit the same semiconductor material as the semiconductor material of the top semiconductor layer 30 (See FIG. 30B) on the exposed surfaces of the first fin seed layer 139 in the first finFET area 102, the second fin seed layer 239 in the second finFET area 202, and the thin semiconductor seed layer 339 in the thick semiconductor device area 302. The selective epitaxy proceeds until the total thickness of the epitaxial semiconductor material becomes the second thickness t2. Thus, each of the first fin seed layer 139, the second fin seed layer 239, and the thin semiconductor seed layer 339 is converted into a first semiconductor fin 140, a second semiconductor fin 240, and a thick semiconductor region 340", which is equivalent to the second unthinned semiconductor region 340 in the first embodiment.

Figure 1B:
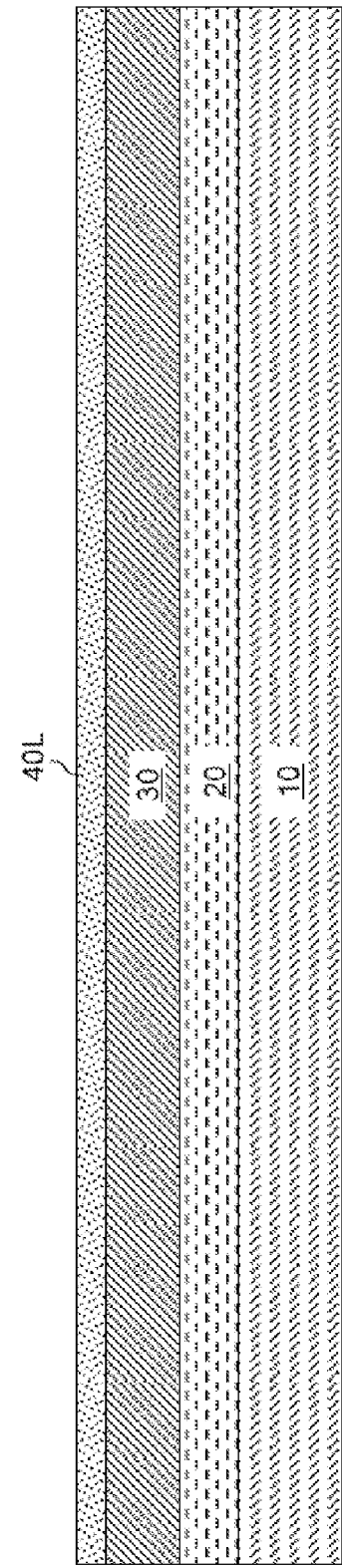

Referring to FIGS. 37A and 37B, a pad layer having the same composition as the pad layer 40L in FIGS. 1A and 1B of the first embodiment is deposited in the trenches 135 and planarized to form dielectric fin caps 40 in the first and second finFET areas (102, 203) and the dielectric pad 40' in the thick semiconductor device area 302.

Referring to FIGS. 38A and 38B, the pad dielectric material layer 41 and the disposable filler material layer 33 are removed selective to the dielectric fin caps 40 and the dielectric pad 40' to provide the same structure as the first exemplary semiconductor structure of FIGS. 5A and 5B.

Referring to FIGS. 39A and 39B, a fifth exemplary semiconductor structure according to a fifth embodiment of the present disclosure can be formed by depositing a first pad layer 140L on a semiconductor-on-insulator (SOI) substrate that can be the same as the SOI substrate of the first embodiment. The first pad layer 140L can have the same composition as the pad layer 40L of the first embodiment and can have a lesser thickness than the pad layer 40L of the first embodiment. For example, the pad layer 40L can be a vertical stack, from bottom to top, of a thin silicon oxide layer having a thickness from 1 nm to 20 nm and a silicon nitride layer having a thickness from 10 nm to 50 nm, although lesser and greater thicknesses can also be employed.

Referring to FIGS. 40A and 40B, a photoresist 17 is applied over the first pad layer 40L and lithographically patterned to form openings in the first ETSOI device area 101, the second ETSOI device area 201, and the thin semiconductor device area 301, i.e., in the thin device areas (101, 201, 301). The pattern in the photoresist 17 is transferred through the first pad layer 140L and into upper portions of the top semiconductor layer 30 by an etch, which can be an anisotropic etch or an isotropic etch. The photoresist 17 is subsequently removed. Optionally, thermal oxidation and removal of a thermal oxide layer may be performed to adjust the thickness of remaining semiconductor materials in the thin device areas (101, 201, 301). The etched semiconductor regions have a first thickness t1 and the unetched semiconductor regions have a second thickness t2.

Figure 41A:
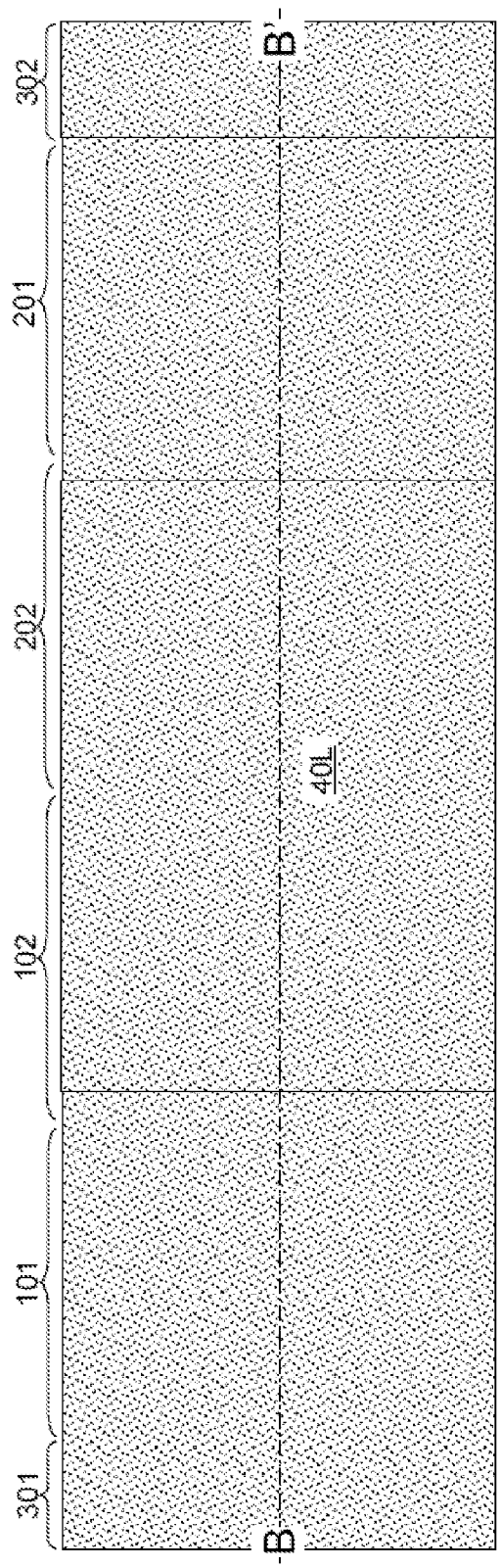
FIGS. 41A and 41B illustrate the fifth exemplary semiconductor structure after depositing an additional pad dielectric material to form a pad layer according to the fifth embodiment of the present disclosure.
Figure 41B:
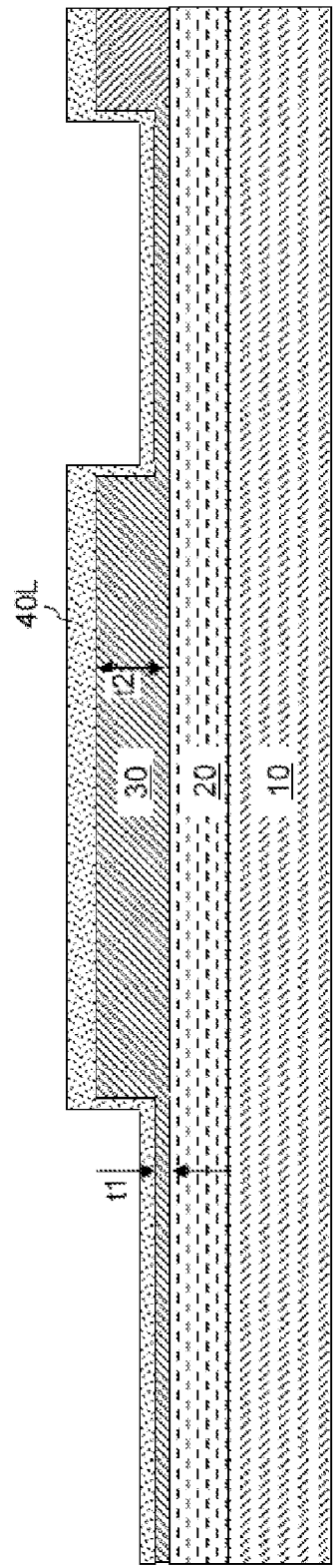

Referring to FIGS. 41A and 41B, an additional pad dielectric material is deposited by a conformal deposition to form a pad layer 40L, which incorporates remaining portions of the first pad layer 140L. The additional pad dielectric material can be, for example, silicon nitride. Due to the incorporation of the first pad layer 140L, the thickness of the pad layer 40L can be greater in the thick device areas (102, 202, 302) than in the thin device areas (101, 201, 301).

Figure 42A:
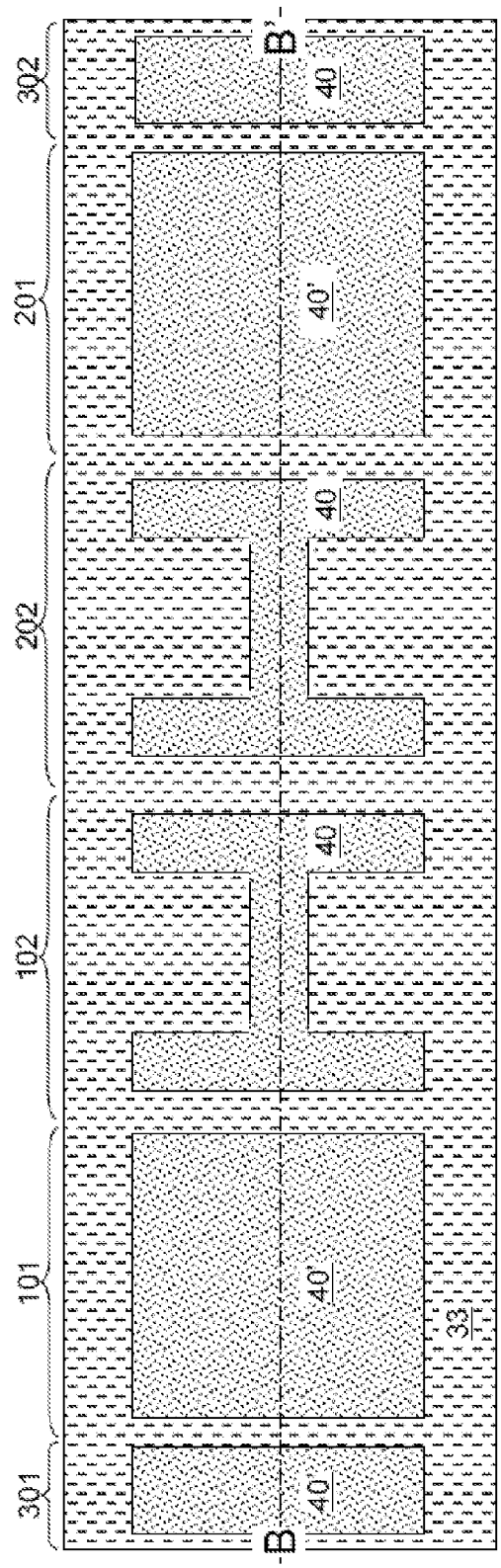
Figure 42B:
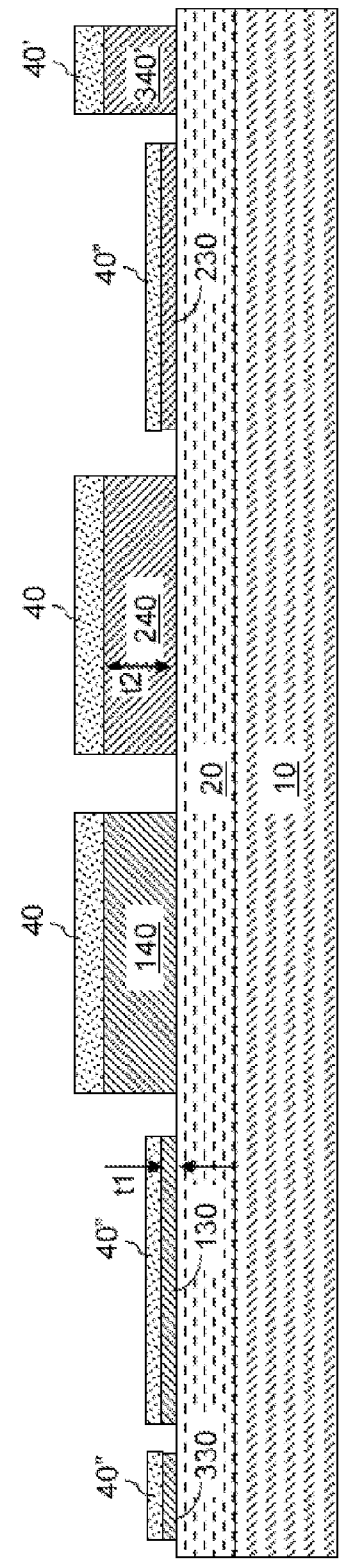

Referring to FIGS. 42A and 42B, a photoresist (not shown) is applied and lithographically patterned, and the pattern in the photoresist is transferred into the stack of the pad layer 40L and the top semiconductor layer 30 by an anisotropic etch to pattern various semiconductor regions. For example, the first ETSOI area 101 includes a stack of a first planar semiconductor region 130 and a dielectric pad 40". The second ETSOI area 201 includes a stack of a second planar semiconductor region 230 and another dielectric pad 40". The first finFET area 102 includes a stack of a first semiconductor fin 140 and a dielectric fin cap 40. The second finFET area 202 includes a stack of a second semiconductor fin 240 and another dielectric fin cap 40. The thin semiconductor device area 301 includes a first thinned semiconductor region 330 and yet another dielectric pad 40". The thick semiconductor device area 302 includes a second unthinned semiconductor region 340' and still another dielectric pad 40'.

Figure 43A:
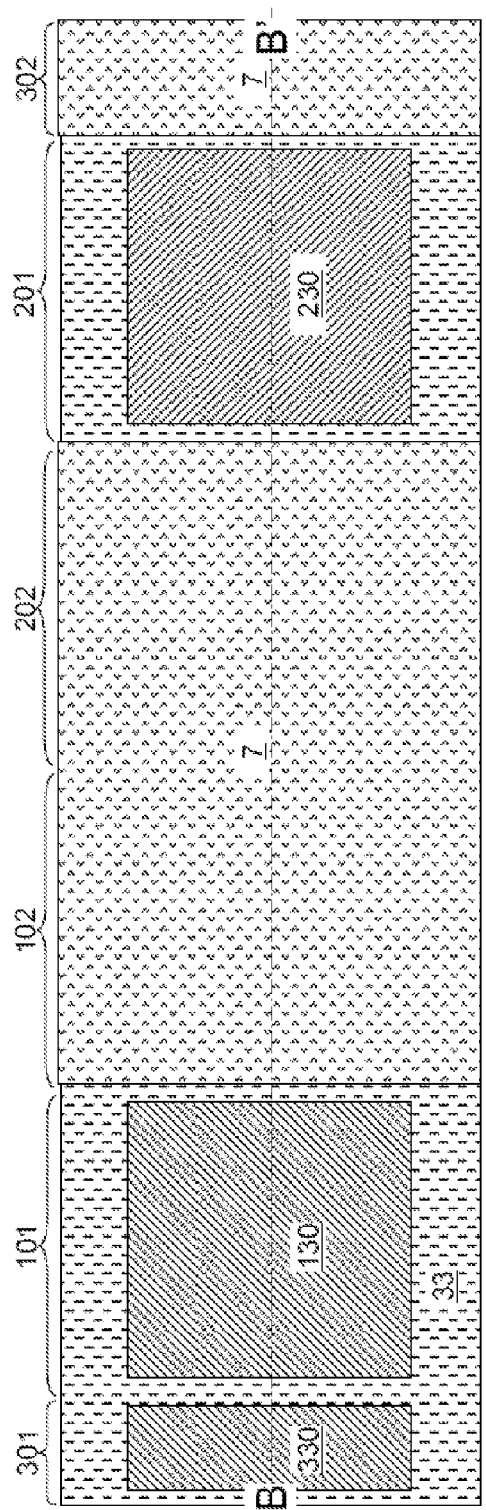
FIGS. 43A and 43B illustrate the fifth exemplary semiconductor structure after removal of dielectric pads from the thin device areas according to the fifth embodiment of the present disclosure.
Figure 43B:
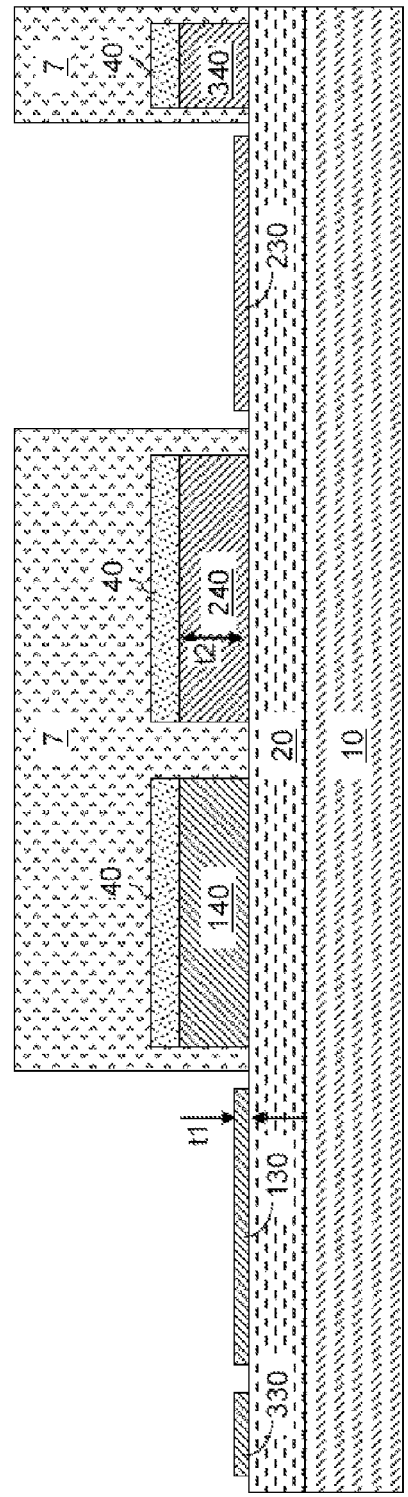

Referring to FIGS. 43A and 43B, dielectric pads 40" are removed from the thin device areas (101, 201, 301) by applying a photoresist 7, lithographically patterning the photoresist 7 to form openings in the thin device areas (101, 201, 301), and etching the exposed dielectric pads 40", for example, by a wet etch. The photoresist 7 is subsequently removed, for example, by etching, to provide the same structure as the first exemplary structure of FIGS. 5A and 5B.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A method of forming a semiconductor structure comprising:
 forming a planar semiconductor region having a first thickness and a semiconductor fin having a second thickness greater than said first thickness on an insulator layer of a substrate;
 recessing end portions of said semiconductor fin relative to a top surface of said semiconductor fin to form two thinned fin portions having a third thickness and laterally spaced by an unthinned fin portion of said semiconductor fin having said second thickness; and
 selectively growing semiconductor material portions on exposed semiconductor surfaces of said planar semiconductor region, sidewalls of said unthinned fin portion, and said two thinned fin portions.

2. The method of claim 1, wherein a first disposable gate structure is formed over a portion of said planar semiconductor region and second disposable gate structures is formed on sidewalls of said semiconductor fin during said recessing of said end portions.

3. The method of claim 2, further comprising replacing each of said first and second gate structures with a gate dielectric and a metallic gate electrode.

4. The method of claim 3, wherein each of said gate dielectrics is a U-shaped gate dielectric comprising a dielectric metal oxide and having a dielectric constant greater than 8.0.

5. The method of claim 1, wherein said planar semiconductor region maintains said first thickness during said recessing of said end portions of said semiconductor fin.

6. The method of claim 1, wherein an entirety of said planar semiconductor region has said first thickness and an entirety of said semiconductor fin has said second thickness prior to said recessing of said end portions of said semiconductor fin.

7. The method of claim 1, wherein said selectively grown semiconductor material portions are epitaxially grown on said exposed semiconductor surfaces of said planar semiconductor region, said sidewalls of said unthinned fin portion, and said two thinned fin portions.

8. The method of claim 7, further comprising:
forming a gate-level dielectric material layer over said selectively grown semiconductor material portions; and
planarizing said gate-level dielectric material layer, said semiconductor fin, and said selectively grown semiconductor material portions.

9. The method of claim 1, further comprising:
forming a dielectric fin cap having a same horizontal cross-sectional area as said semiconductor fin over said semiconductor fin;
forming a disposable gate material layer over said planar semiconductor region and said dielectric fin cap; and
planarizing said disposable gate material layer employing said dielectric fin cap as a stopping layer prior to said recessing of said end portions.

10. The method of claim 9, further comprising:
forming and patterning an etch mask layer over said planarized disposable gate material layer; and
transferring a pattern in said etch mask layer into said planarized disposable gate material layer and said dielectric fin cap.

11. The method of claim 10, wherein a first disposable gate structure is formed by a remaining portion of said planarized disposable gate material layer located over said planar semiconductor region and second disposable gate structures are formed by remaining portions of said planarized disposable gate material layer located on sidewalls of said semiconductor fin.

12. The method of claim 11, further comprising forming surface dielectric material layers by conversion of exposed semiconductor surfaces into a dielectric material by thermal conversion or by plasma conversion prior to formation of said disposable gate material layer.

13. The method of claim 12, wherein each of said second disposable gate structures laterally contact one of said surface dielectric material layers that contact said semiconductor fin.

14. The method of claim 12, further comprising:
anisotropically etching said planarized disposable gate material layer at a faster etch rate than exposed portions of said dielectric fin cap before exposed portions of said dielectric fin cap are etched through;
recessing said planarized disposable gate material layer and exposed portions of said semiconductor fin and said surface dielectric material layers after exposed portions of said dielectric fin cap are etched through; and
etching said planarized disposable gate material layer and exposed portions of said semiconductor fin selective to said surface dielectric material layers after said recessing until a top surface of said insulator layer is exposed, wherein remaining portions of said semiconductor fin include said two thinned fin portions.

15. The method of claim 14, wherein said selectively grown semiconductor material portions include:
a raised source region and a raised drain region that are epitaxially aligned to end portions of said planar semiconductor region; and
a fin source region and a fin drain region that are epitaxially aligned to said unthinned fin portion and said two thinned fin portions and having a width that is greater than a width of said unthinned fin portion.

16. The method of claim 1, further comprising:
forming a semiconductor material region comprising a same material as said planar semiconductor region and having said first thickness; and
forming another semiconductor material region including a stack of a first semiconductor material portion comprising a same material as said planar semiconductor region and a second semiconductor material portion comprising a same material as said selectively grown semiconductor material portions.

* * * * *